US012069846B2

(12) United States Patent
Nagatsuka et al.

(10) Patent No.: US 12,069,846 B2
(45) Date of Patent: Aug. 20, 2024

(54) MEMORY DEVICE

(71) Applicant: Semiconductor Energy Laboratory Co., Ltd., Atsugi (JP)

(72) Inventors: Shuhei Nagatsuka, Atsugi (JP); Tatsuya Onuki, Atsugi (JP); Kiyoshi Kato, Atsugi (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 427 days.

(21) Appl. No.: 17/424,621

(22) PCT Filed: Nov. 18, 2019

(86) PCT No.: PCT/IB2019/059859
§ 371 (c)(1),
(2) Date: Jul. 21, 2021

(87) PCT Pub. No.: WO2020/157553
PCT Pub. Date: Aug. 6, 2020

(65) Prior Publication Data
US 2022/0085020 A1    Mar. 17, 2022

(30) Foreign Application Priority Data

Jan. 29, 2019  (JP) ................................ 2019-012887
Jan. 29, 2019  (JP) ................................ 2019-013607
(Continued)

(51) Int. Cl.
*H10B 12/00*    (2023.01)
*H01L 27/12*    (2006.01)
(Continued)

(52) U.S. Cl.
CPC ......... *H10B 12/00* (2023.02); *H01L 27/1225* (2013.01); *H01L 27/124* (2013.01);
(Continued)

(58) Field of Classification Search
CPC ... H10B 12/00; H01L 27/1225; H01L 27/124; H01L 27/1255; H01L 29/24;
(Continued)

(56) References Cited

U.S. PATENT DOCUMENTS

| 7,898,893 | B2 | 3/2011 | Park et al. |
| 8,514,653 | B2 | 8/2013 | Park et al. |

(Continued)

FOREIGN PATENT DOCUMENTS

| EP | 2037461 A | 3/2009 |
| JP | 2009-071313 A | 4/2009 |

(Continued)

OTHER PUBLICATIONS

International Search Report (Application No. PCT/IB2019/059859) Dated Mar. 3, 2020.

(Continued)

*Primary Examiner* — Michael T Tran
(74) *Attorney, Agent, or Firm* — Eric J. Robinson; Robinson Intellectual Property Law Office, P.C.

(57) ABSTRACT

A novel memory device is provided. Over a driver circuit layer, N memory layers (N is a natural number greater than or equal to 2) including a plurality of memory cells provided in a matrix are stacked. The memory cell includes two transistors and one capacitor. An oxide semiconductor is used as a semiconductor included in the transistor. The memory cell is electrically connected to a write word line, a selection line, a capacitor line, a write bit line, and a read bit line. The write bit line and the read bit line extend in the (Continued)

stacking direction, whereby the signal propagation distance from the memory cell to the driver circuit layer is shortened.

12 Claims, 34 Drawing Sheets

(30) Foreign Application Priority Data

Feb. 8, 2019 (JP) .................................. 2019-021404
May 15, 2019 (JP) .................................. 2019-091842

(51) Int. Cl.
*H01L 29/24* (2006.01)
*H01L 29/786* (2006.01)

(52) U.S. Cl.
CPC .......... *H01L 27/1255* (2013.01); *H01L 29/24* (2013.01); *H01L 29/78648* (2013.01); *H01L 29/78651* (2013.01); *H01L 29/7869* (2013.01)

(58) Field of Classification Search
CPC ......... H01L 29/78648; H01L 29/78651; H01L 29/7869; G11C 11/405; G11C 5/06; G11C 5/025
USPC ............................................. 365/63, 230.06
See application file for complete search history.

(56) References Cited

U.S. PATENT DOCUMENTS

| | | | |
|---|---|---|---|
| 8,526,263 B2 | 9/2013 | Park et al. | |
| 9,276,121 B2 | 3/2016 | Yamazaki | |
| 9,634,097 B2 | 4/2017 | Rabkin et al. | |
| 9,640,639 B2 | 5/2017 | Yamazaki | |
| 9,653,611 B2 | 5/2017 | Atsumi et al. | |
| 9,691,490 B2 | 6/2017 | Choi et al. | |
| 10,217,752 B2 | 2/2019 | Atsumi et al. | |
| 10,593,683 B2 | 3/2020 | Atsumi et al. | |
| 10,860,080 B2 | 12/2020 | Maeda et al. | |
| 11,366,507 B2 | 6/2022 | Maeda et al. | |
| 2007/0241405 A1* | 10/2007 | Popoff | H01L 29/7841 257/E27.084 |
| 2009/0086525 A1* | 4/2009 | Park | G11C 5/02 365/94 |
| 2009/0219750 A1* | 9/2009 | Tokiwa | G11C 13/0023 365/230.01 |
| 2010/0039138 A1* | 2/2010 | Bertin | G11C 29/02 326/38 |
| 2010/0195362 A1* | 8/2010 | Norman | G11C 7/1075 365/189.16 |
| 2010/0232240 A1* | 9/2010 | Norman | G11C 5/02 365/63 |
| 2010/0246234 A1* | 9/2010 | Ahn | G11C 13/0023 365/51 |
| 2011/0065270 A1 | 3/2011 | Shim et al. | |
| 2011/0116297 A1* | 5/2011 | Park | G11C 11/1653 365/51 |
| 2011/0116336 A1* | 5/2011 | Park | G11C 5/04 365/230.06 |
| 2012/0314477 A1* | 12/2012 | Siau | G11C 13/0097 365/148 |
| 2013/0270563 A1 | 10/2013 | Yamazaki | |
| 2013/0294136 A1* | 11/2013 | Siau | G11C 5/06 365/66 |
| 2015/0121052 A1* | 4/2015 | Emma | G06F 9/44 713/1 |
| 2015/0255139 A1 | 9/2015 | Atsumi et al. | |
| 2016/0094236 A1* | 3/2016 | Shionoiri | H03M 1/002 341/122 |
| 2016/0155823 A1 | 6/2016 | Yamazaki | |
| 2016/0267045 A1* | 9/2016 | Kaga | G11C 7/227 |
| 2016/0332493 A1* | 11/2016 | Atsumi | B60C 23/0428 |
| 2017/0092371 A1 | 3/2017 | Harari | |
| 2017/0104406 A1* | 4/2017 | Kim | G11C 5/148 |
| 2017/0133095 A1* | 5/2017 | Park | G11C 16/3459 |
| 2017/0140829 A1* | 5/2017 | Park | G11C 16/20 |
| 2017/0243650 A1 | 8/2017 | Ogawa et al. | |
| 2017/0243874 A1 | 8/2017 | Atsumi et al. | |
| 2017/0302271 A1 | 10/2017 | Kato et al. | |
| 2017/0330876 A1* | 11/2017 | Leedy | G02B 6/12002 |
| 2018/0122825 A1* | 5/2018 | Lupino | H01L 27/11898 |
| 2018/0130519 A1* | 5/2018 | Chen | G11C 11/418 |
| 2018/0375023 A1* | 12/2018 | Song | H10B 63/84 |
| 2019/0006222 A1* | 1/2019 | Or-Bach | H01L 29/792 |
| 2020/0168619 A1* | 5/2020 | Zhou | H10B 41/35 |
| 2020/0194450 A1* | 6/2020 | Pachamuthu | H01L 21/76877 |
| 2020/0302973 A1* | 9/2020 | Siau | G11C 5/025 |
| 2020/0342928 A1 | 10/2020 | Yamazaki et al. | |
| 2020/0343251 A1 | 10/2020 | Atsumi et al. | |
| 2021/0183860 A1* | 6/2021 | Yamazaki | H01L 29/78648 |
| 2022/0172766 A1* | 6/2022 | Matsuzaki | G11C 11/4091 |
| 2022/0208247 A1* | 6/2022 | Inuzuka | G11C 16/10 |
| 2022/0254402 A1* | 8/2022 | Yakubo | G11C 11/4091 |
| 2022/0343954 A1* | 10/2022 | Aoki | G11C 7/08 |

FOREIGN PATENT DOCUMENTS

| | | | | |
|---|---|---|---|---|
| JP | 2012-256820 A | 12/2012 | | |
| JP | 2012-256837 A | 12/2012 | | |
| JP | 2013-236068 A | 11/2013 | | |
| JP | 2014-082357 A | 5/2014 | | |
| JP | 2015-181159 A | 10/2015 | | |
| JP | 2017-017354 A | 1/2017 | | |
| JP | 2018-006766 A | 1/2018 | | |
| JP | 2018-097907 A | 6/2018 | | |
| JP | 2018-195794 A | 12/2018 | | |
| TW | 201532072 | 8/2015 | | |
| TW | 201841160 | 11/2018 | | |
| WO | WO-2007028583 A1 * | 3/2007 | | G11C 11/40 |
| WO | WO-2008008329 A2 * | 1/2008 | | G11C 11/4097 |
| WO | WO-2018/130931 | 7/2018 | | |

OTHER PUBLICATIONS

Written Opinion (Application No. PCT/IB2019/059859) Dated Mar. 3, 2020.
Kunitake. H et al., "High thermal tolerance of 25-nm c-axis aligned crystalline In—Ga—Zn oxide FET", IEDM 18: Technical Digest of International Electron Devices Meeting, Dec. 1, 2018, pp. 312-315.
Taiwanese Office Action (Application No. 108142818) Dated Aug. 11, 2023.

* cited by examiner

FIG. 28A
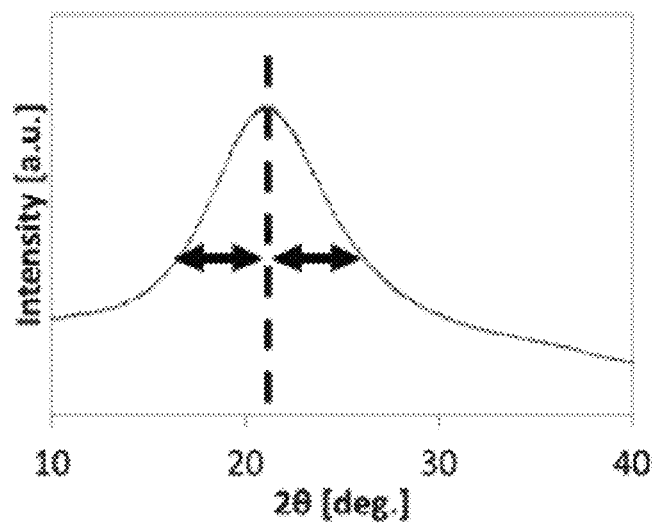
FIG. 28B
FIG. 28C
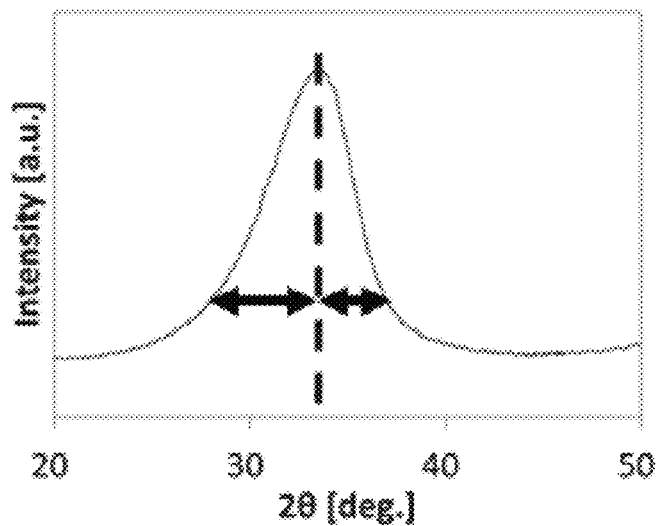

FIG. 32A
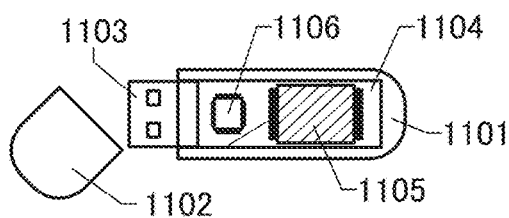
FIG. 32B  FIG. 32C
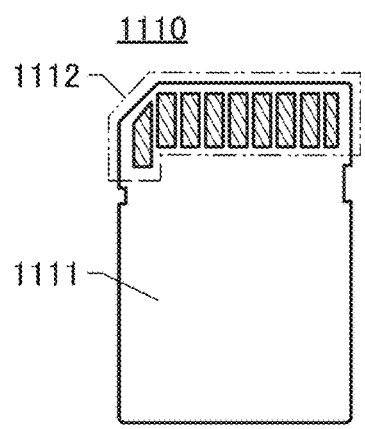 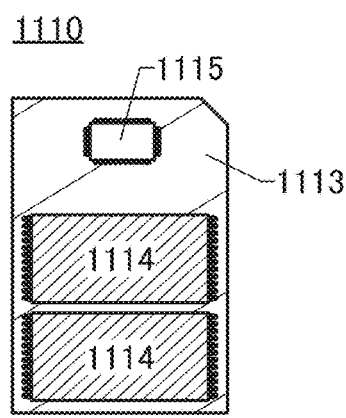
FIG. 32D  FIG. 32E
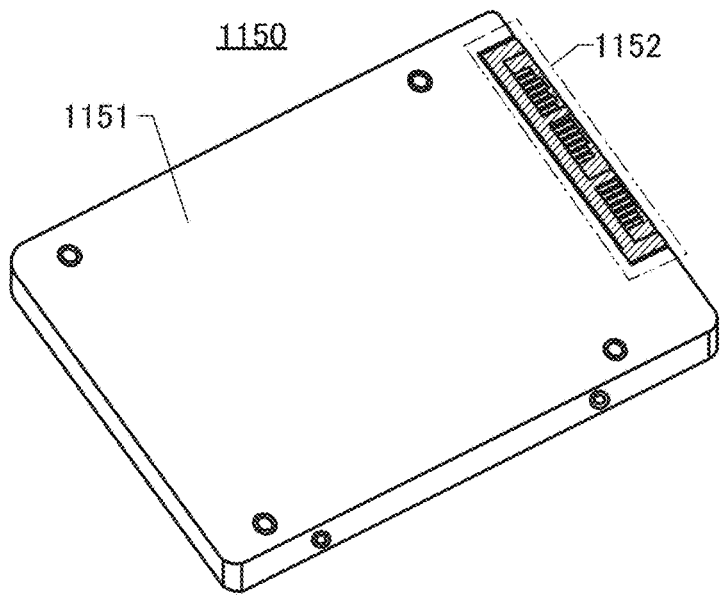 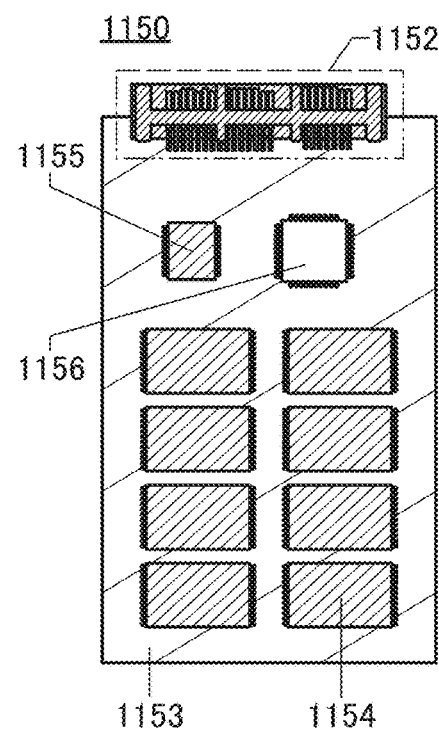

MEMORY DEVICE

TECHNICAL FIELD

One embodiment of the present invention relates to a memory device, a semiconductor device, or electronic devices using these devices.

Note that one embodiment of the present invention is not limited to the above technical field. One embodiment of the invention disclosed in this specification and the like relates to an object, a method, or a manufacturing method. Alternatively, one embodiment of the invention disclosed in this specification and the like relates to a process, a machine, manufacture, or a composition of matter.

In this specification and the like, a semiconductor device generally means a device that can function by utilizing semiconductor characteristics. A transistor and a semiconductor circuit are embodiments of semiconductor devices. In some cases, it can be said that a display device (a liquid crystal display device, a light-emitting display device, and the like), a projection device, a lighting device, an electro-optical device, a power storage device, a memory device, a semiconductor circuit, an imaging device, an electronic device, and the like are semiconductor devices. Alternatively, it can be said that they include a semiconductor device in some cases.

BACKGROUND ART

In recent years, with the increase in the amount of data manipulated, a semiconductor device having a larger storage capacity has been required. To increase storage capacity per unit area, stacking memory cells is effective (see Patent Document 1 and Patent Document 2). Stacking memory cells can increase storage capacity per unit area in accordance with the number of stacked memory cells.

REFERENCE

Patent Document

[Patent Document 1] United States Patent Application Publication No. 2011/0065270A1
[Patent Document 2] U.S. Pat. No. 9,634,097B2

SUMMARY OF THE INVENTION

Problems to be Solved by the Invention

In Patent Document 1 and Patent Document 2, a plurality of memory elements (also referred to as memory cells) are stacked and connected in series, so that a three-dimensional memory cell array (also referred to as a memory string) is formed. In such a three-dimensional memory cell array, as the number of stacked memory elements increases, the series resistance between the memory cells is increased, and the resistance of the memory cell array is increased. There has been a problem in that the high resistance of the memory cell array causes loss of current flowing through the memory cell array and heat generation in the memory cell array.

In Patent Document 1, a semiconductor pattern provided in a columnar form is in contact with an insulator including a charge accumulation layer. In Patent Document 2, a semiconductor pattern provided in a columnar form is in contact with an insulator functioning as a tunnel dielectric. When the semiconductor is in contact with the insulator, trap centers might be formed at the interface between them. The trap centers formed at the interface between the semiconductor and the insulator trap electrons and change the threshold voltage of the transistor in the positive direction and thus might adversely affect the current driving power in the on state of the transistor, that is, the on-state current, the field-effect mobility, and the reliability.

An object of one embodiment of the present invention is to provide a memory device having a high degree of integration. Another object is to provide a memory device with high reliability. Another object is to provide a memory device with low power consumption. Another object is to provide a novel memory device. Another object is to provide a novel semiconductor device.

Note that the description of these objects does not preclude the existence of other objects. One embodiment of the present invention does not have to achieve all these objects. Other objects are apparent from the description of the specification, the drawings, the claims, and the like and other objects can be derived from the description of the specification, the drawings, the claims, and the like.

Means for Solving the Problems

Over a driver circuit layer, N memory layers (N is a natural number greater than or equal to 2) including a plurality of memory cells provided in a matrix are stacked. The memory cell includes two transistors and one capacitor. An oxide semiconductor is used as a semiconductor included in the transistor. The memory cell is electrically connected to a write word line, a selection line, a capacitor line, a write bit line, and a read bit line. The write bit line and the read bit line extend in the stacking direction, whereby the signal propagation distance from the memory cell to the driver circuit layer is shortened.

One embodiment of the present invention is a memory device including N memory layers (N is a natural number greater than or equal to 2), a driver circuit layer, a plurality of first wirings, and a plurality of second wirings. The N memory layers are stacked over the driver circuit layer. The driver circuit layer includes a plurality of first circuits. The plurality of first wirings extend in a stacking direction of the N memory layers and are arranged in a matrix of P rows and R columns (P and R are each a natural number greater than or equal to 1). The plurality of second wirings extend in the stacking direction and are arranged in a matrix of P rows and Q columns (P and Q are each a natural number greater than or equal to 2). The N memory layers each include a plurality of memory cells arranged in a matrix of P rows and Q columns, third wirings in Q columns, fourth wirings in Q columns, and fifth wirings in Q columns. In the memory layer in a k-th layer, a memory cell in an i-th row and a $2 \times s-1$-th column and a memory cell in the i-th row and a $2 \times s$-th column are electrically connected to a first wiring in the i-th row and an s-th column, and the memory cell in the i-th row and the $2 \times s-1$-th column is electrically connected to a second wiring in the i-th row and the $2 \times s-1$-th column, a third wiring in the $2 \times s-1$-th column, a fourth wiring in the $2 \times s-1$-th column, and a fifth wiring in the $2 \times s-1$-th column. The first wiring and the second wiring are electrically connected to any one of the plurality of first circuits.

Another embodiment of the present invention is the above-described memory device in which the memory cell in the i-th row and the $2 \times s-1$-th column includes a first transistor, a second transistor, and a capacitor; one of a source and a drain of the first transistor is electrically connected to a gate of the second transistor and one electrode of the capacitor; the other of the source and the drain of the first transistor is electrically connected to the first wiring; a gate of the first transistor is electrically connected to the third wiring; the one of the source and the drain of the first transistor is electrically connected to the fourth wiring; the other of the source and the drain of the first transistor is electrically connected to the second wiring; and the other electrode of the capacitor is electrically connected to the fifth wiring.

In the above-described structure, a functional layer is preferably included between the driver circuit layer and the plurality of memory cells. The functional layer may include a plurality of second circuits, ands the first wiring and the second wiring may be electrically connected to the first circuit through any one of the plurality of second circuits.

At least one of the first transistor and the second transistor preferably includes an oxide as a semiconductor. The oxide preferably contains one or both of In and Zn. The oxide preferably contains In, Ga, and Zn.

The circuit preferably includes a plurality of transistors, and the plurality of transistors each preferably contain silicon as a semiconductor.

Effect of the Invention

According to one embodiment of the present invention, a memory device having a high degree of integration can be provided. Alternatively, a memory device with high reliability can be provided. Alternatively, a memory device with low power consumption can be provided. Alternatively, a novel memory device can be provided. Alternatively, a novel semiconductor device can be provided.

Note that the description of these effects does not preclude the existence of other effects. One embodiment of the present invention does not have to have all these effects. Other effects are apparent from the description of the specification, the drawings, the claims, and the like and other effects can be derived from the description of the specification, the drawings, the claims, and the like.

BRIEF DESCRIPTION OF THE DRAWINGS

FIG. 28(A) is a diagram showing crystal structures of IGZO. FIG. 28(B) is a diagram showing an XRD spectrum of quartz glass. FIG. 28(C) is a diagram showing an XRD spectrum of crystalline IGZO.

FIG. 32(A) to FIG. 32(E) are diagrams showing application examples of a memory device.

MODE FOR CARRYING OUT THE INVENTION

Figure 1A:
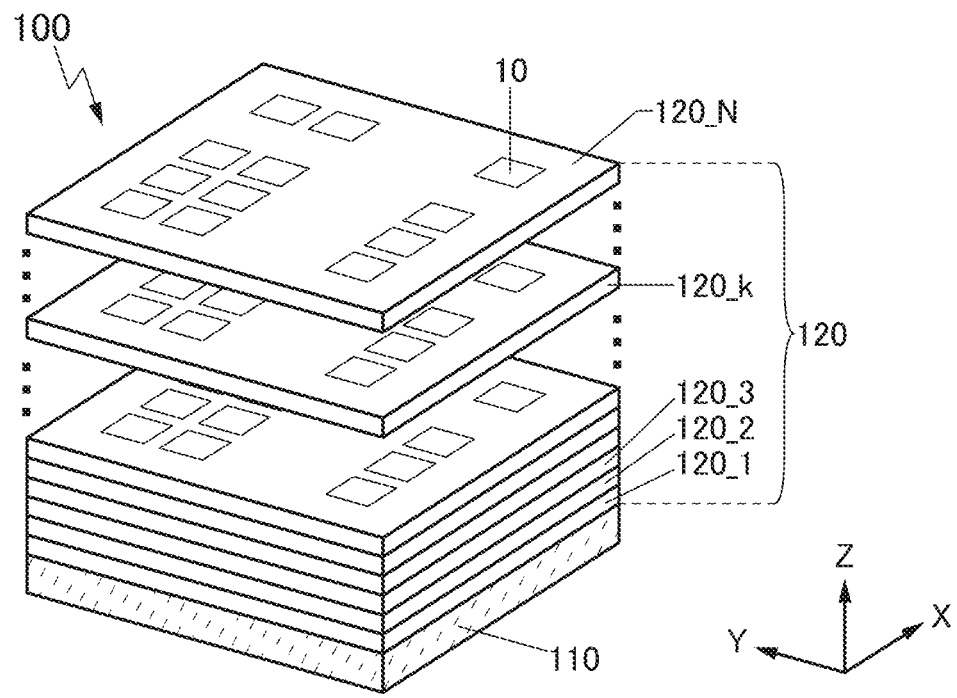
FIG. 1(A) and FIG. 1(B) are diagrams showing a structure example of a memory device.

Embodiments are described in detail with reference to the drawings. However, the present invention is not limited to the following description, and it is readily appreciated by those skilled in the art that modes and details can be modified in various ways without departing from the spirit and the scope of the present invention. Thus, the present invention should not be construed as being limited to the description in the following embodiments. Note that in the structures of the invention described below, the same portions or portions having similar functions are denoted by the same reference numerals in different drawings, and description thereof is not repeated.

The position, size, range, and the like of each component illustrated in the drawings and the like do not represent the actual position, size, range, and the like in some cases to facilitate understanding of the invention. Therefore, the disclosed invention is not necessarily limited to the position, size, range, or the like disclosed in the drawings and the like. For example, in the actual manufacturing process, a resist mask or the like might be unintentionally reduced in size by treatment such as etching, which is not illustrated in some cases for easy understanding.

In a top view (also referred to as a "plan view"), a perspective view, or the like, some components might be omitted for easy understanding of the drawings.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, a "terminal" in an electric circuit refers to a portion that inputs or outputs current, inputs or outputs voltage, and/or receives or transmits a signal. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

Furthermore, functions of a source and a drain are interchanged with each other depending on operation conditions, for example, when a transistor of different polarity is employed or when the direction of current flow is changed in circuit operation; therefore, it is difficult to define which is the source or the drain. Thus, the terms "source" and "drain" can be interchanged with each other in this specification.

In this specification and the like, when there is a description which explicitly states that X and Y are connected, the case where X and Y are electrically connected and the case where X and Y are directly connected are regarded as being disclosed in this specification and the like.

Here, X and Y each denote an object (e.g., a device, an element, a circuit, a wiring, an electrode, a terminal, a conductive film, or a layer).

An example of the case where X and Y are directly connected is the case where X and Y are connected without an element that enables electrical connection between X and Y (e.g., a switch, a transistor, a capacitor, an inductor, a resistor, a diode, a display element, a light-emitting element, or a load).

For example, in the case where X and Y are electrically connected, one or more elements that enables electrical connection between X and Y (e.g., a switch, a transistor, a capacitor, an inductor, a resistor, a diode, a display element, a light-emitting element, or a load) can be connected between X and Y. Note that a switch has a function of controlling whether current flows or not by being in a conduction state (an on state) or a non-conduction state (an off state). Alternatively, a switch has a function of selecting and changing a current path. Note that the case where X and Y are electrically connected includes the case where X and Y are directly connected.

In this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Furthermore, the terms "perpendicular" and "orthogonal" indicate a state where two straight lines are placed at an angle of greater than or equal to 80° and less than or equal to 100°, for example. Accordingly, the case where the angle is greater than or equal to 85° and less than or equal to 95° is also included.

In this specification and the like, the terms "identical", "same", "equal", "uniform", and the like used in describing calculation values and measurement values allow for a margin of error of ±20% unless otherwise specified.

A voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, the "on state" (sometimes abbreviated as "on") of a transistor refers to a state where a source and a drain of the transistor are electrically short-circuited (also referred to as a "conduction state"). Unless otherwise specified, an "on state" refers to a state where the voltage between a gate and a source (also referred to as "gate voltage" or "Vg") is higher than or equal to threshold voltage (also referred to as "Vth") in an n-channel transistor, and refers to a state where Vg is lower than or equal to Vth in a p-channel transistor.

Furthermore, the "off state" (sometimes abbreviated as "off") of a transistor refers to a state where a source and a drain of the transistor are electrically disconnected (also referred to as a "non-conduction state"). Unless otherwise specified, an "off state" refers to a state where the Vg is lower than Vth in an n-channel transistor, and refers to a state where Vg is higher than Vth in a p-channel transistor.

In this specification and the like, in some cases, "on-state current" means a current that flows between a source and a drain when a transistor is in an on state. Furthermore, in some cases, "off-state current" means a current that flows between a source and a drain when a transistor is in an off state.

In this specification and the like, a high power supply potential VDD (hereinafter also simply referred to as "VDD" or an "H potential") is a power supply potential higher than a low power supply potential VSS. The low power supply potential VSS (hereinafter also simply referred to as "VSS" or an "L potential") is a power supply potential lower than the high power supply potential VDD. In addition, a ground potential can be used as VDD or VSS. For example, in the case where VDD is a ground potential, VSS is a potential lower than the ground potential, and in the case where VSS is a ground potential, VDD is a potential higher than the ground potential.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

Embodiment 1

A memory device of one embodiment of the present invention will be described with reference to drawings. Note that arrows indicating the X direction, the Y direction, and the Z direction are sometimes illustrated in the drawings. The X direction, the Y direction, and the Z direction are directions orthogonal to or intersecting with each other.

Figure 1B:
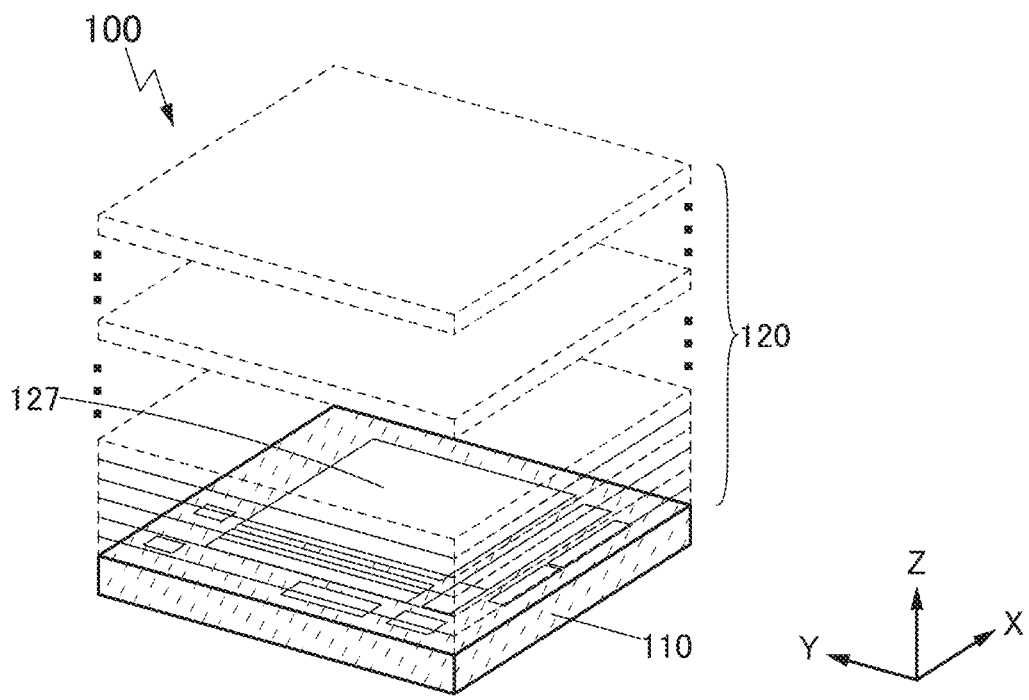

FIGS. 1(A) and 1(B) show perspective views of a memory device 100 of one embodiment of the present invention. The memory device 100 includes a driver circuit layer 110 and N memory layers 120 (N is a natural number greater than or equal to 2). The driver circuit layer 110 includes a plurality of circuits such as an RW array 127. In addition, the memory layers 120 each include a plurality of memory cells 10. In FIG. 1(B), the memory layer 120 is denoted by a dashed line.

The N memory layers 120 are provided over the driver circuit layer 110. Provision of the N memory layers 120 over the driver circuit layer 110 can reduce the area occupied by the memory device 100. Furthermore, storage capacity per unit area can be increased.

In FIG. 1(A), the first memory layer 120 is denoted by a memory layer 120_1, the second memory layer 120 is denoted by a memory layer 120_2, and the third memory layer 120 is denoted by a memory layer 120_3. Similarly, the k-th memory layer 120 (k is a natural number greater than or equal to 1) is denoted by a memory layer 120_k and the N-th memory layer 120 is denoted by a memory layer 120_N. Note that in this specification and the like, the "memory layer 120" is merely stated in some cases when describing a matter related to all the N memory layers 120 or showing a matter common to the N memory layers 120.

<Structure Example of Driver Circuit Layer 110>

Figure 2:
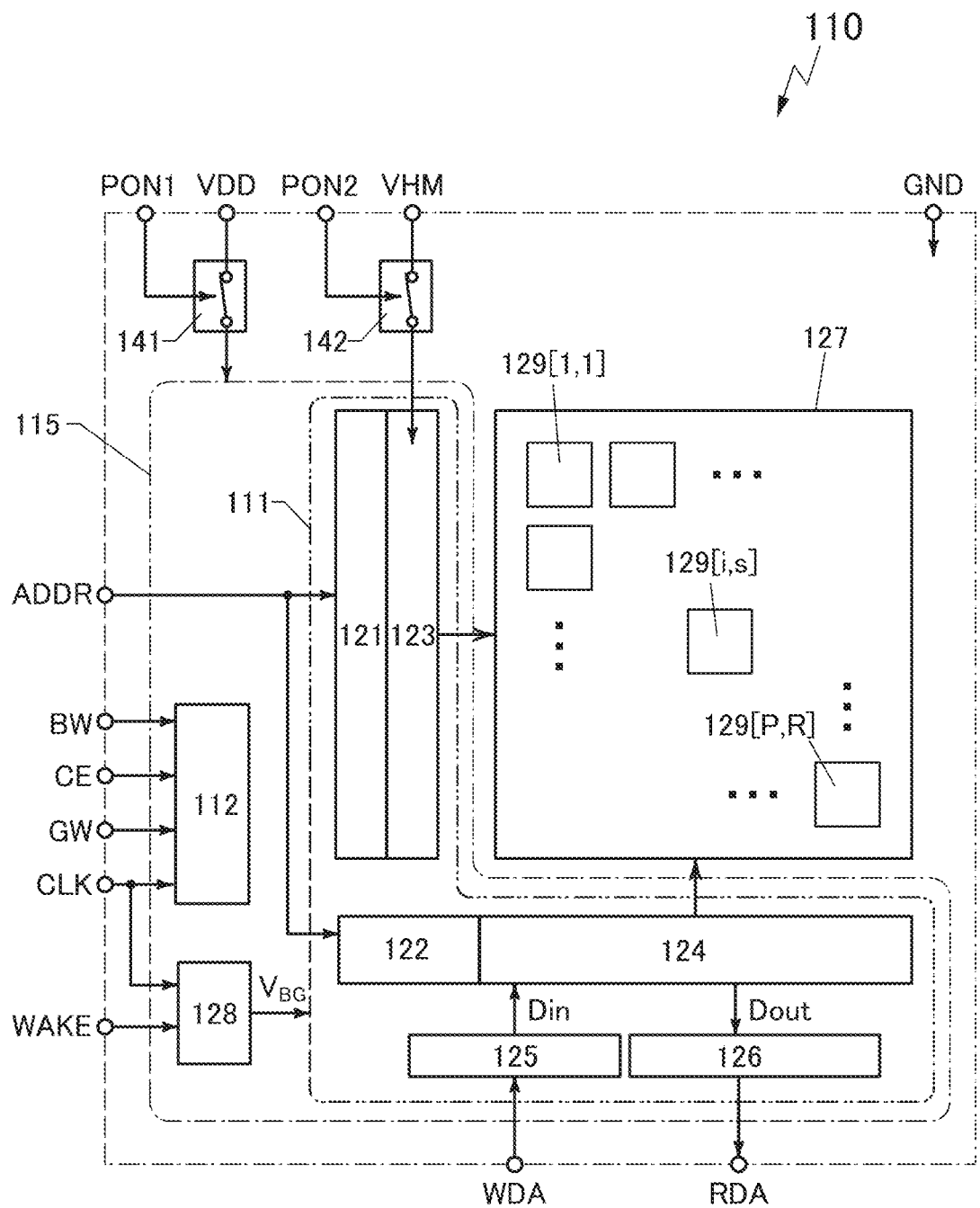
FIG. 2 is a diagram showing a structure example of a driver circuit layer.

A structure example of the driver circuit layer 110 is described. FIG. 2 is a block diagram showing a structure example of the driver circuit layer 110. The driver circuit layer 110 includes a PSW 141 (power switch), a PSW 142, a peripheral circuit 115, and the RW array 127. The peripheral circuit 115 includes a peripheral circuit 111, a control circuit 112, and a voltage generation circuit 128.

In the driver circuit layer 110, each circuit, each signal, and each voltage can be appropriately selected as needed. Alternatively, another circuit or another signal may be added. Signals BW, CE, GW, CLK, WAKE, ADDR, WDA, PON1, and PON2 are signals input from the outside, and a signal RDA is a signal output to the outside. The signal CLK is a clock signal.

The signals BW and CE and the signal GW are control signals. The signal CE is a chip enable signal, the signal GW is a global write enable signal, and the signal BW is a byte write enable signal. The signal ADDR is an address signal. The signal WDA is a write data signal, and the signal RDA is a read data signal. The signals PON1 and PON2 are power gating control signals. Note that the signals PON1 and PON2 may be generated in the control circuit 112.

The control circuit 112 is a logic circuit having a function of controlling the overall operation of the driver circuit layer 110. For example, the control circuit performs a logical operation on the signal CE, the signal GW, and the signal BW to determine an operation mode of the memory device 100 (e.g., a writing operation or a reading operation). Alternatively, the control circuit 112 generates a control signal for the peripheral circuit 111 so that the operation mode is executed.

The voltage generation circuit 128 has a function of generating a negative voltage ($V_{BG}$). WAKE has a function of controlling the input of CLK to the voltage generation circuit 128. For example, when an H-level signal is applied as WAKE, the signal CLK is input to the voltage generation circuit 128, and the voltage generation circuit 128 generates $V_{BG}$.

The peripheral circuit 111 is a circuit for writing and reading data to/from the memory cell 10. The peripheral circuit 111 includes a row decoder 121, a column decoder 122, a row driver 123, a column driver 124, an input circuit 125, an output circuit 126, and the RW array 127.

The row decoder 121 and the column decoder 122 have a function of decoding the signal ADDR. The row decoder 121 is a circuit for specifying a row to be accessed in each memory layer 120, and the column decoder 122 is a circuit for specifying a column to be accessed in each memory layer 120. The row driver 123 has a function of selecting a word line connected to the memory cells 10 in the row specified by the row decoder 121 in each memory layer 120. The column driver 124 has a function of writing data to the memory cell 10 of the memory layer 120 through an RW circuit 129 described later, a function of reading data from the memory cell 10 of the memory layer 120 through the RW circuit 129, a function of retaining data that is read, and the like.

The input circuit 125 has a function of retaining the signal WDA. Data retained by the input circuit 125 is output to the column driver 124. Data output from the input circuit 125 is data (Din) to be written to the memory layer 120. Data (Dout) read from the memory layer 120 by the column driver 124 is output to the output circuit 126. The output circuit 126 has a function of retaining Dout. In addition, the output circuit 126 has a function of outputting Dout to the outside of the memory device 100. A data signal output from the output circuit 126 is the signal RDA.

The PSW 141 has a function of controlling the supply of VDD to the peripheral circuit 115. The PSW 142 has a function of controlling the supply of VHM to the row driver 123. Here, in the memory device 100, a high power supply voltage is VDD and a low power supply voltage is GND (a ground potential). In addition, VHM is a high power supply voltage used in the memory layer 120 and is sometimes higher than VDD. The on/off of the PSW 141 is controlled by the signal PON1, and the on/off of the PSW 142 is controlled by the signal PON2. The number of power domains to which VDD is supplied is one in the peripheral circuit 115 in FIG. 2 but can be plural. In that case, a power switch is provided for each power domain.

The RW array 127 includes a plurality of reading and writing circuits (the RW circuits 129) arranged in a matrix of P rows and R columns (P and R are each a natural number greater than or equal to 2). In FIG. 2 and the like, the RW circuit 129 provided in the first row and the first column is denoted by an RW circuit 129[1,1]. Moreover, the RW circuit 129 provided in the i-th row and the s-th column (i is a natural number greater than or equal to 1 and less than or equal to P, and s is a natural number greater than or equal to 1 and less than or equal to R) is denoted by an RW circuit 129[$i,s$]. Furthermore, the RW circuit 129 provided in the P-th row and the R-th column is denoted by an RW circuit 129[P,R].

Note that in this specification and the like, the "RW circuit 129" is merely stated in some cases when describing a matter related to all the RW circuits 129 or showing a matter common to the RW circuits 129.

The RW circuit 129 is electrically connected to a bit line described later, and has a function of writing data to the memory cell 10 of the memory layer 120 and a function of reading data retained by the memory cell 10.

<Structure Example of Memory Layer 120>

Figure 3:
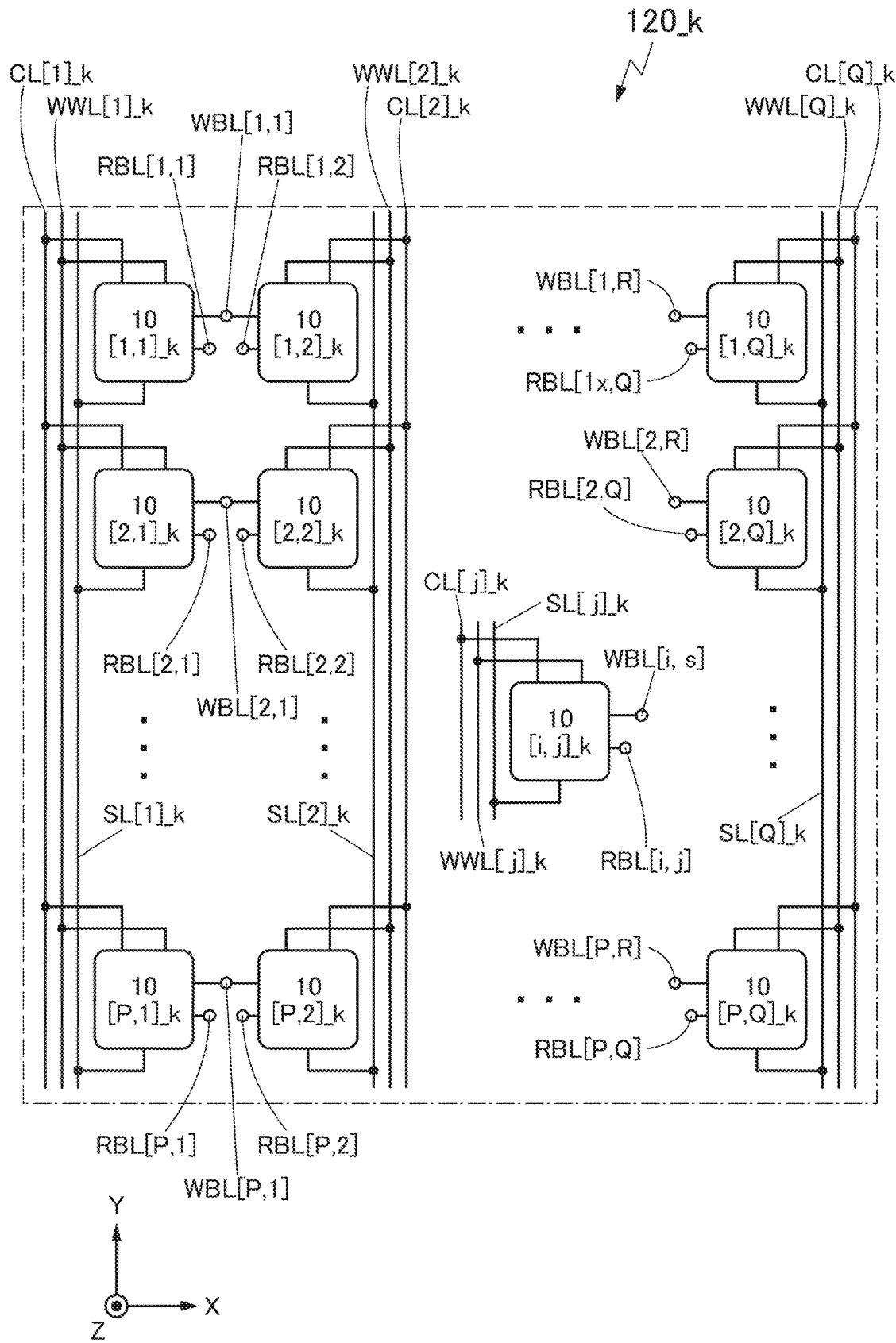
FIG. 3 is a diagram showing a structure example of a memory layer.

A structure example of each of the N memory layers 120 is described. The memory layers 120 each include a plurality of memory cells 10 arranged in a matrix of P rows and Q columns (Q is a natural number greater than or equal to 2). FIG. 3 is a block diagram of the k-th memory layer 120 (the memory layer 120_$k$) seen from the Z direction. In this specification and the like, the X direction corresponds to the row direction, the Y direction corresponds to the column direction, and the Z direction corresponds to the stacking direction of the memory layers 120.

In FIG. 3 and the like, the memory cell 10 provided in the first row and the first column of the k-th memory layer 120 is denoted by a memory cell 10[1,1]_$k$. Moreover, the memory cell 10 provided in the i-th row and the j-th column (j is a natural number greater than or equal to 1 and less than or equal to Q) of the k-th memory layer 120 is denoted by a memory cell 10[$i,j$]_$k$. Furthermore, the memory cell 10 provided in the P-th row and the Q-th column of the k-th memory layer 120 is denoted by a memory cell 10[P,Q]_$k$.

Note that in this specification and the like, the "memory cell 10" is merely stated in some cases when describing a matter related to all the memory cells 10 or showing a matter common to the memory cells 10.

The memory layers 120 each include Q word lines WWL, Q capacitor lines CL, and Q selection lines SL. The Q word lines WWL, the Q capacitor lines CL, and the Q selection lines SL have regions extending in the column direction (Y direction).

In FIG. 3 and the like, the word line WWL in the first column provided in the k-th memory layer 120 is denoted by a word line WWL[1]_$k$. Moreover, the word line WWL in the j-th column provided in the k-th memory layer 120 is denoted by a word line WWL[j]_$k$. Furthermore, the word line WWL in the Q-th column provided in the k-th memory layer 120 is denoted by a word line WWL[Q]_$k$. The capacitor line CL and the selection line SL are also denoted in a manner similar to that of the word line WWL.

Note that in this specification and the like, the "word line WWL" is merely stated in some cases when describing a matter related to all the word lines WWL or showing a matter common to the word lines WWL. Not only the word line WWL but also other wirings and electrodes may be similarly denoted.

In the memory layer 120_$k$, the word line WWL provided in the j-th column, the capacitor line CL provided in the j-th column, and the selection line SL provided in the j-th column are electrically connected to the memory cells 10 provided in the j-th column.

Note that a fixed potential is generally supplied to the capacitor line CL. In the case where a fixed potential is supplied to the capacitor line CL, the capacitor line CL does not necessarily extend in the column direction. For example, the capacitor line CL may extend in the row direction. Alternatively, a given plural number of capacitor lines CL may be electrically connected to each other.

Figure 4:
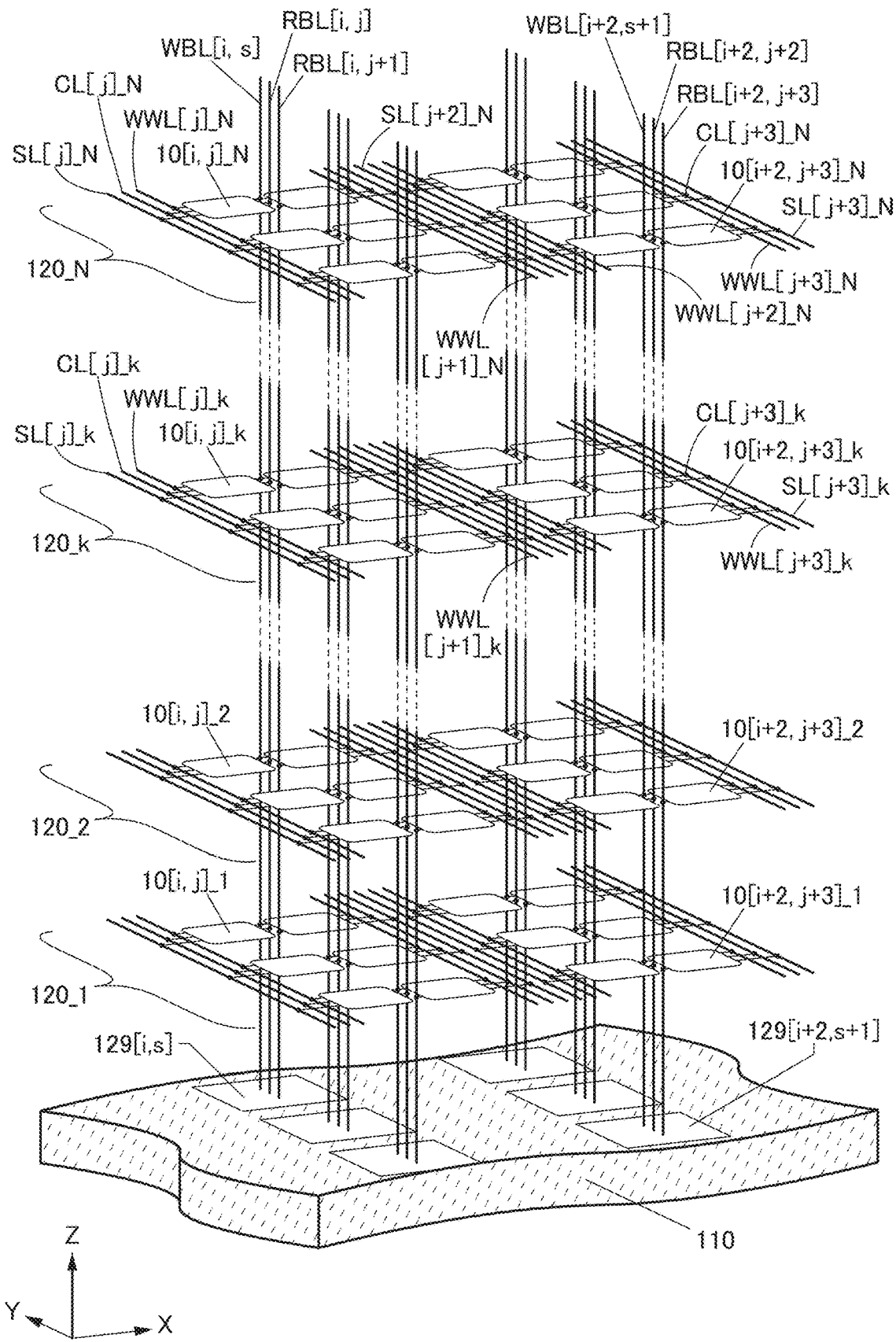
FIG. 4 is a diagram illustrating part of memory layers and part of a driver circuit layer.

The memory device 100 includes bit lines WBL that extend in the Z direction and are arranged in a matrix of P rows and R columns and bit lines RBL that extend in the Z direction and are arranged in a matrix of P rows and Q columns (see FIG. 3 and FIG. 4).

The relation between R and Q indicating positions of columns can be expressed by Formula 1 or Formula 2 in the case where Q is an odd number.

$$R=(Q+1)/2 \quad \text{(Formula 1)}$$

$$Q=2\times R-1 \quad \text{(Formula 2)}$$

The relation between R and Q indicating positions of columns can be expressed by Formula 3 or Formula 4 in the case where Q is an even number.

$$R=Q/2 \quad \text{(Formula 3)}$$

$$Q=2\times R \quad \text{(Formula 4)}$$

The bit line WBL includes a region overlapping with the memory layer 120_$k$. The bit line RBL includes a region overlapping with the memory layer 120_$k$.

In FIG. 3 and the like, the bit line WBL provided in the i-th row and the s-th column is denoted by a bit line WBL[i,s]. Moreover, in FIG. 3 and the like, a bit line WRBL provided in the i-th row and the j-th column is denoted by a bit line RBL[i,j].

In the memory layer 120_$k$, one bit line WBL is electrically connected to two memory cells 10. Specifically, the bit line WBL[i,s] is electrically connected to a memory cell 10[$i,2\times s-1$]_$k$ and a memory cell 10[$i,2\times s$]_$k$. In FIG. 3 and the like, the case where j represents 2×s−1 is illustrated.

In addition, in the memory layer 120_$k$, the bit line RBL[i,j] is electrically connected to the memory cell 10[$i,j$]_$k$.

Figure 5:
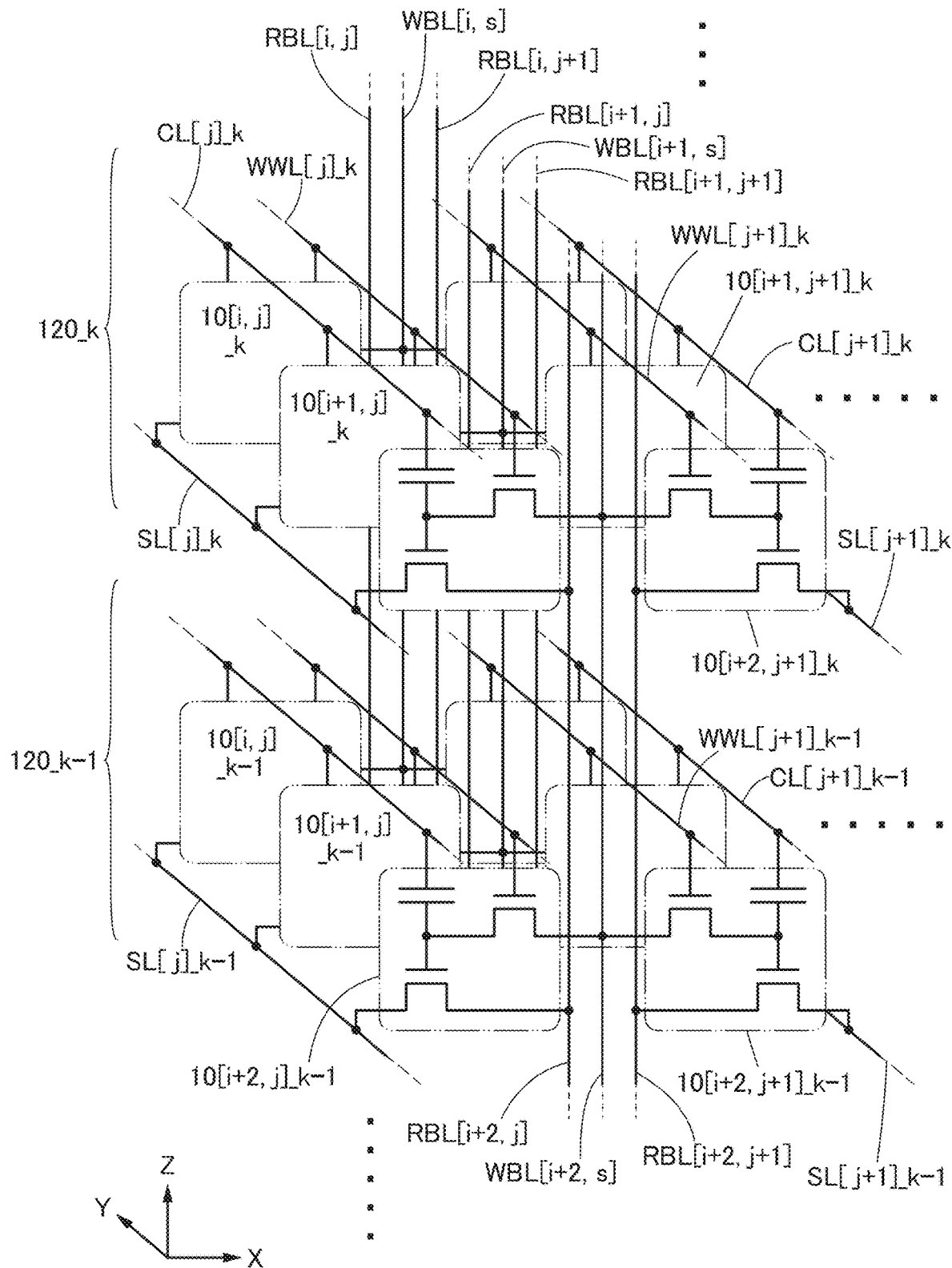
FIG. 5 is a diagram illustrating part of memory layers.
Figure 6:
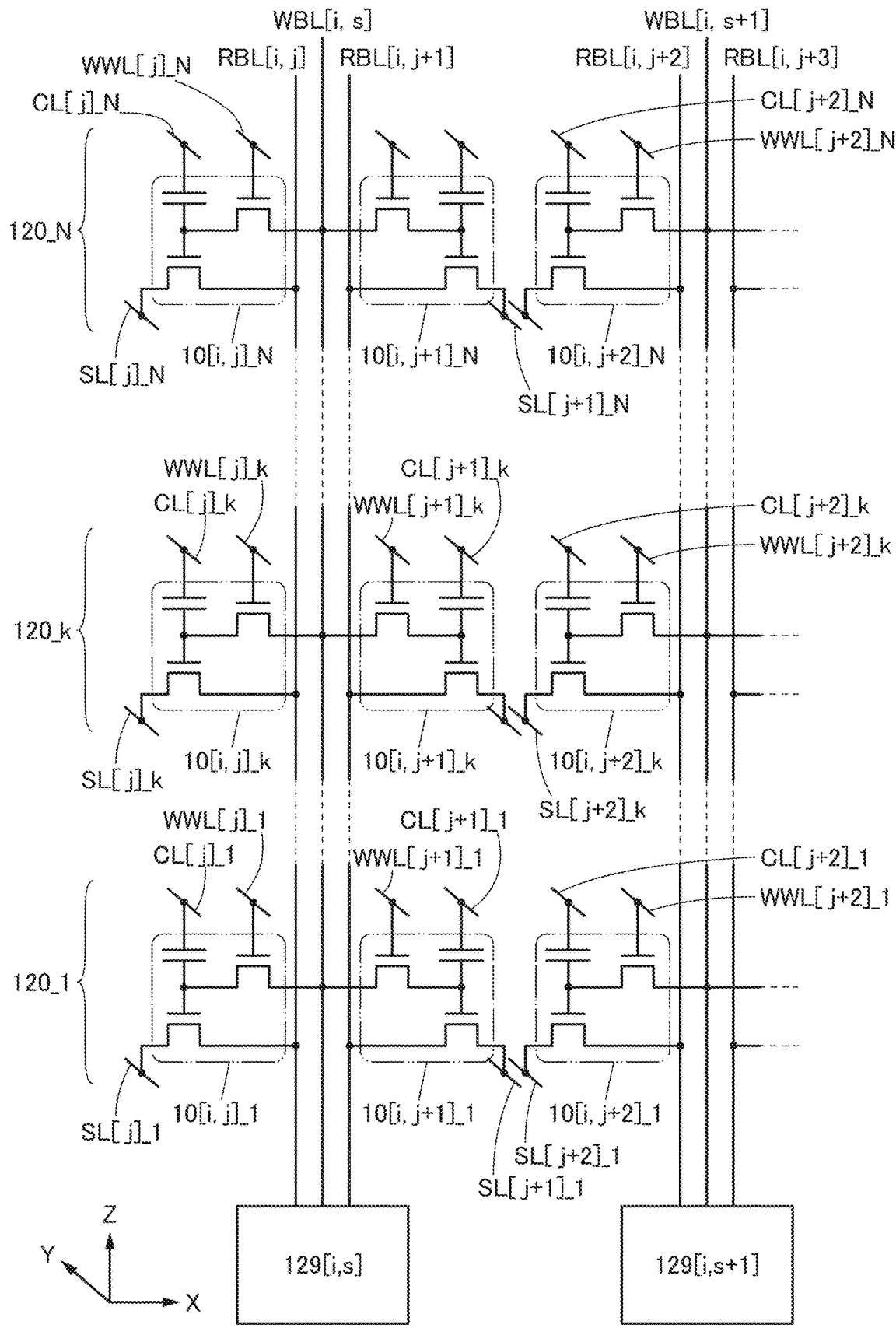
FIG. 6 is a diagram showing a connection example of bit lines, memory cells, and RW circuits.

FIG. 4 is a perspective view illustrating part of some of the N memory layers 120 and part of the driver circuit layer 110. FIG. 5 is a perspective view illustrating part of some of the N memory layers 120. FIG. 5 shows a structure example of part of the memory layer 120_$k$ and part of a memory layer 120_*k*–1. FIG. 6 is a diagram showing a connection example of the bit lines WBL, the bit lines RBL, the memory cells 10, and the RW circuits 129.

The bit line WBL[i,s], the bit line RBL[i,j], and a bit line RBL[i,j+1] are electrically connected to the RW circuit 129[*i,s*] (see FIG. 4 and FIG. 6). In FIG. 4, FIG. 6, and the like, the case where j represents 2×s−1 and j+1 represents 2×s is illustrated.

The relation between s and j indicating positions of columns can be expressed by Formula 5 or Formula 6 in the case where j is an odd number.

$$s=(j+1)/2 \quad \text{(Formula 5)}$$

$$j=2\times s-1 \quad \text{(Formula 6)}$$

The relation between s and j indicating positions of columns can be expressed by Formula 7 or Formula 8 in the case where j is an even number.

$$s=j/2 \quad \text{(Formula 7)}$$

$$j=2\times s \quad \text{(Formula 8)}$$

<Structure Example of Memory Cell 10>

Figure 7A:
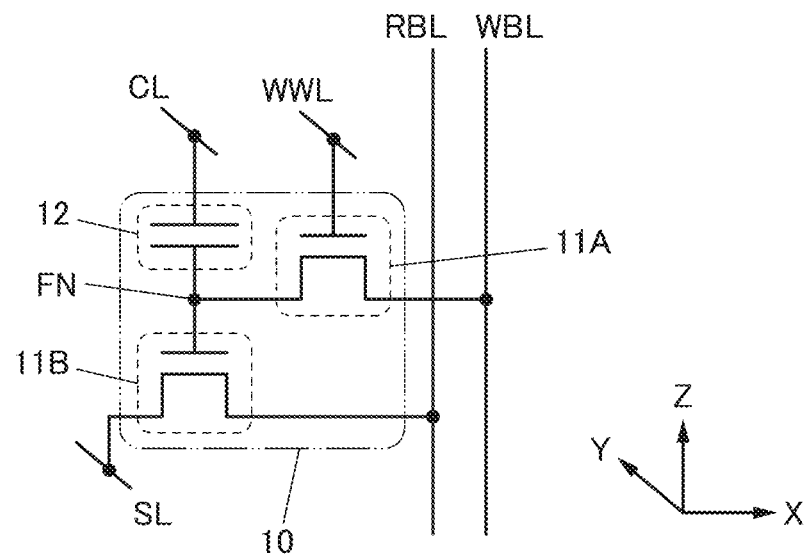
FIG. 7(A) and FIG. 7(B) are each a diagram showing a structure example of a memory cell.

Next, a structure example of the memory cell 10 is described. The memory cell 10 includes a transistor 11A, a transistor 11B, and a capacitor 12 (see FIG. 7(A)). One of a source and a drain of the transistor 11A is electrically connected to a node FN, the other is electrically connected to the bit line WBL, and a gate is electrically connected to the word line WWL. One of a source and a drain of the transistor 11B is electrically connected to the selection line SL, the other is electrically connected to the bit line RBL, and a gate is electrically connected to the node FN.

The capacitor 12 is provided between the node FN and the capacitor line CL. Specifically, one electrode of the capacitor 12 is electrically connected to the node FN, and the other electrode is electrically connected to the capacitor line CL.

As each of the transistor 11A and the transistor 11B, a transistor including an oxide semiconductor, which is a kind of a metal oxide, in a semiconductor layer where a channel is formed (also referred to as an "OS transistor") is preferably used.

The OS transistor can have an extremely low off-state current. Specifically, the off-state current per micrometer of channel width at room temperature can be lower than $1\times10^{-20}$ A, preferably lower than $1\times10^{-22}$ A, further preferably lower than $1\times10^{-24}$ A.

The off-state current of the OS transistor hardly increases even in a high temperature environment. Specifically, the off-state current hardly increases even at an environment temperature higher than or equal to room temperature and lower than or equal to 200° C. When OS transistors are used as transistors included in a semiconductor device, a memory device achieves stable operation and high reliability even in a high temperature environment.

The use of an OS transistor as the transistor 11A can make the capacitor 12 small. Alternatively, parasitic capacitance of the transistor or the like can be used instead of the capacitor 12 without providing the capacitor 12. As a result, the area occupied by the memory device can be reduced. Note that a memory element using an OS transistor as a transistor forming the memory cell may be referred to as an "OS memory".

An oxide semiconductor can be formed by a sputtering method or the like, and thus an OS transistor can be manufactured with existing production equipment that is partly retrofitted. Accordingly, capital investment can be reduced. Moreover, in the manufacturing process of an OS transistor, an impurity introduction step or the like performed for a transistor using silicon in a semiconductor layer where a channel is formed (also referred to as a Si transistor) is unnecessary. When an OS transistor is used as a transistor included in the memory layer 120, the number of memory layers 120 can be easily increased.

Figure 7B:
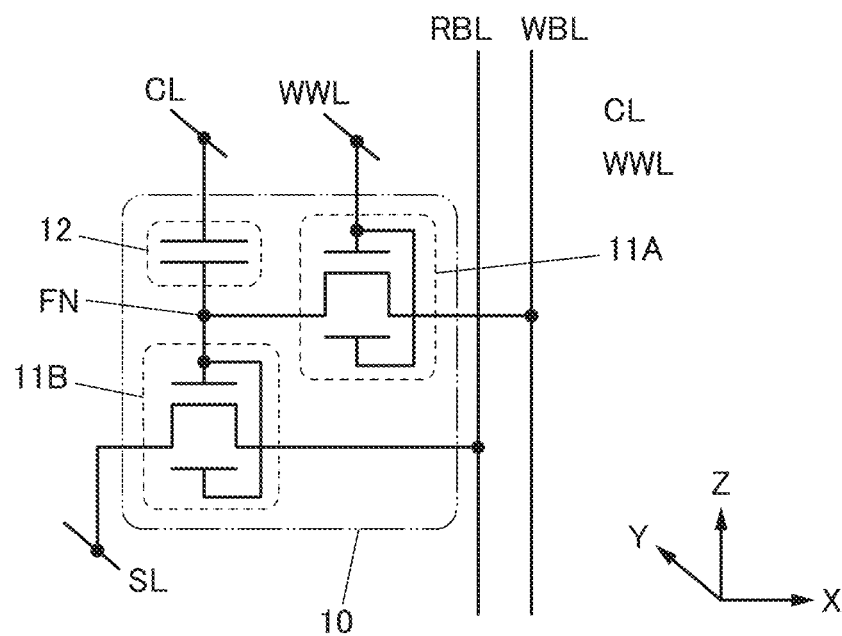

Alternatively, a transistor with a back gate may be used as at least one of the transistor 11A and the transistor 11B. FIG. 7(B) shows an example in which a transistor with a back gate is used as both the transistor 11A and the transistor 11B. Moreover, FIG. 7(B) shows an example in which a gate and the back gate of each of the transistor 11A and the transistor 11B are electrically connected to each other.

The back gate is placed so that a channel formation region of a semiconductor layer is sandwiched between the gate and the back gate. The back gate can function in a manner similar to that of the gate. By changing the potential of the back gate, the threshold voltage of the transistor can be changed.

The gate and the back gate are formed using conductive layers, semiconductor layers with low resistivity, or the like and thus each have a function of preventing an electric field generated outside the transistor from influencing the semiconductor layer where a channel is formed (particularly, a function of preventing static electricity). That is, the variation in the electrical characteristics of the transistor due to the influence of an external electric field such as static electricity can be prevented. Moreover, the provision of the back gate enables reduction in the amount of change of the threshold voltage of the transistor before and after a BT test.

Figure 8A:
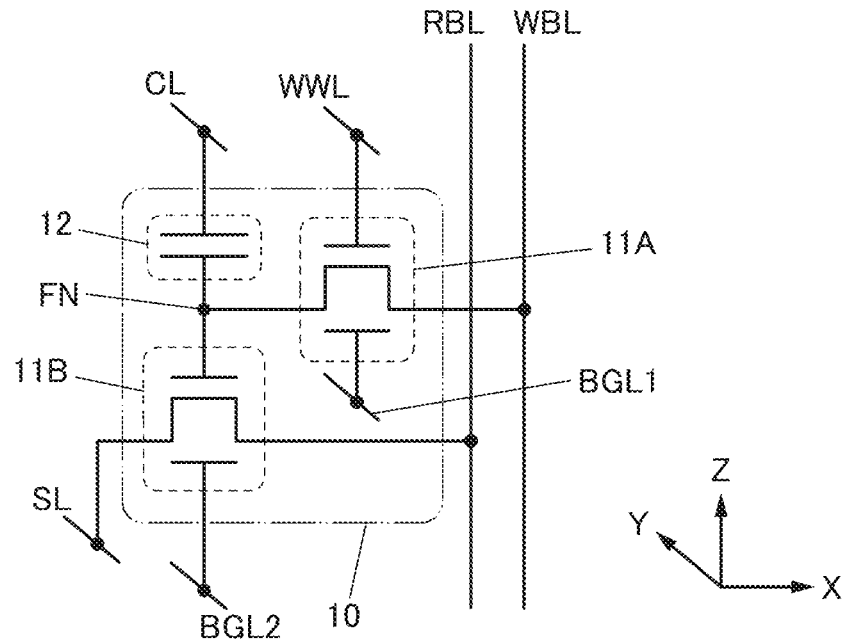
FIG. 8(A) and FIG. 8(B) are each a diagram showing a structure example of a memory cell.

Alternatively, as illustrated in FIG. 8(A), the back gate of the transistor 11A may be electrically connected to a wiring BGL1 and the back gate of the transistor 11B may be electrically connected to a wiring BGL2. The potential of the back gate may be the same as the potential of the gate or may be a ground potential (GND potential) or a given potential.

Figure 8B:
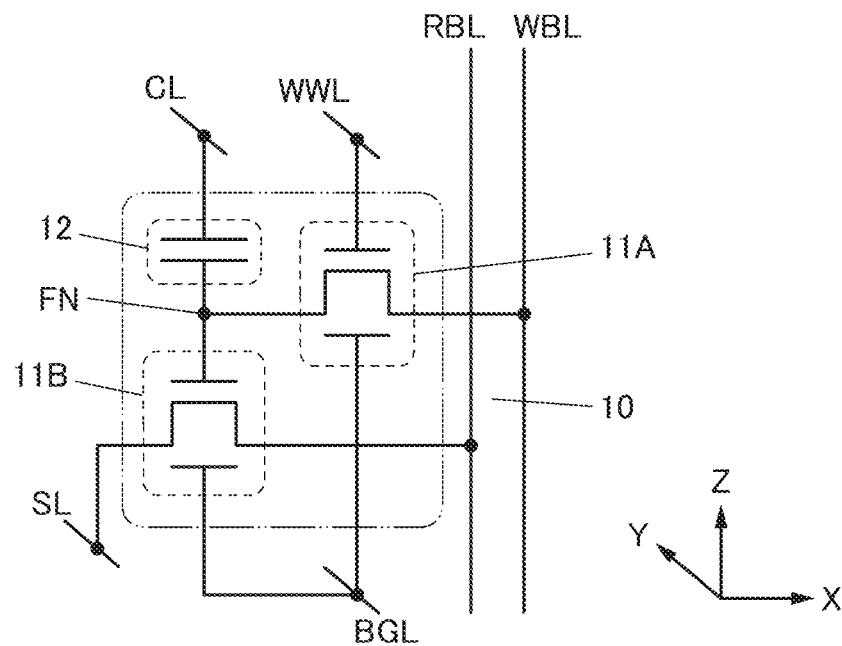

Alternatively, as illustrated in FIG. 8(B), the back gate of the transistor 11A and the back gate of the transistor 11B may be electrically connected to the wiring BGL.

Figure 9A:
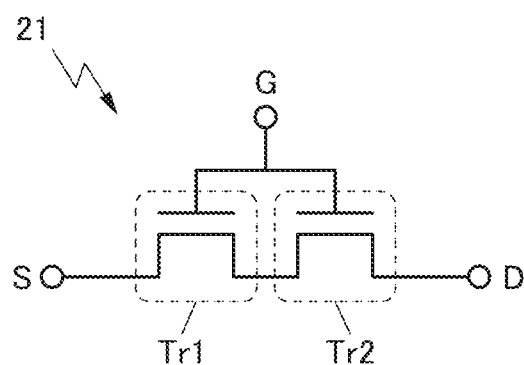
FIG. 9(A) and FIG. 9(B) are each a diagram illustrating a multi-gate transistor.

Alternatively, each of the transistor 11A and the transistor 11B may be a double-gate transistor. FIG. 9(A) illustrates a circuit symbol example of a double-gate transistor 21.

The transistor 21 has a structure in which a transistor Tr1 and a transistor Tr2 are connected in series. FIG. 9(A) illustrates a state where one of a source and a drain of the transistor Tr1 is electrically connected to a terminal S, the other of the source and the drain of the transistor Tr1 is electrically connected to one of a source and a drain of the transistor Tr2, and the other of the source and the drain of the transistor Tr2 is electrically connected to a terminal D. FIG. 9(A) illustrates a state where gates of the transistor Tr1 and the transistor Tr2 are electrically connected to each other and electrically connected to a terminal G.

The transistor 21 illustrated in FIG. 9(A) has a function of switching a conduction state and a non-conduction state between the terminal S and the terminal D by changing the potential of the terminal G. Thus, the transistor 21, which is a double-gate transistor, includes the transistor Tr1 and the transistor Tr2, but the transistor 21 substantially functions as one transistor. In other words, it can be said that in FIG. 9(A), one of a source and a drain of the transistor 21 is electrically connected to the terminal S, the other of the source and the drain is electrically connected to the terminal D, and a gate is electrically connected to the terminal G.

Figure 9B:
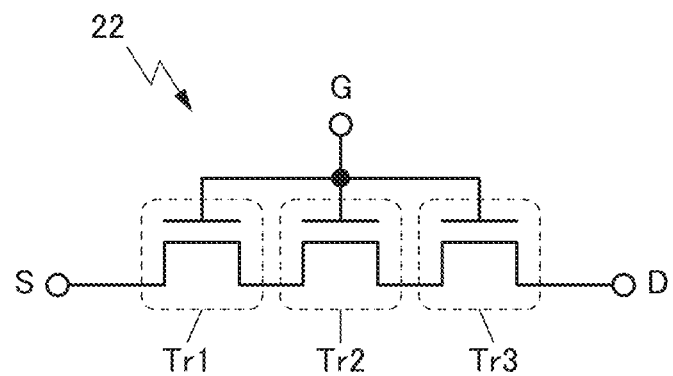

Alternatively, each of the transistor 11A and the transistor 11B may be a triple-gate transistor. FIG. 9(B) illustrates a circuit symbol example of a triple-gate transistor 22.

The transistor 22 has a structure in which the transistor Tr1, the transistor Tr2, and a transistor Tr3 are connected in series. FIG. 9(B) illustrates a state where the one of the source and the drain of the transistor Tr1 is electrically connected to the terminal S, the other of the source and the drain of the transistor Tr1 is electrically connected to the one of the source and the drain of the transistor Tr2, the other of the source and the drain of the transistor Tr2 is electrically connected to one of a source and a drain of the transistor Tr3, and the other of the source and the drain of the transistor Tr3 is electrically connected to the terminal D. FIG. 9(B) illustrates a state where the gates of the transistor Tr1 and the transistor Tr2 and a gate of the transistor Tr3 are electrically connected to each other and electrically connected to the terminal G.

The transistor 22 illustrated in FIG. 9(B) has a function of switching a conduction state and a non-conduction state between the terminal S and the terminal D by changing the potential of the terminal G. Thus, the transistor 22, which is a triple-gate transistor, includes the transistor Tr1, the transistor Tr2, and the transistor Tr3, but the transistor 22 substantially functions as one transistor. In other words, it can be said that in FIG. 9(B), one of a source and a drain of the transistor 22 is electrically connected to the terminal S, the other of the source and the drain is electrically connected to the terminal D, and a gate is electrically connected to the terminal G.

Like the transistor 21 and the transistor 22, a transistor including a plurality of gates electrically connected to each other is referred to as a "multi-gate type transistor" or a "multi-gate transistor" in some cases.

<Operation Example of Memory Cell 10>

Figure 10:
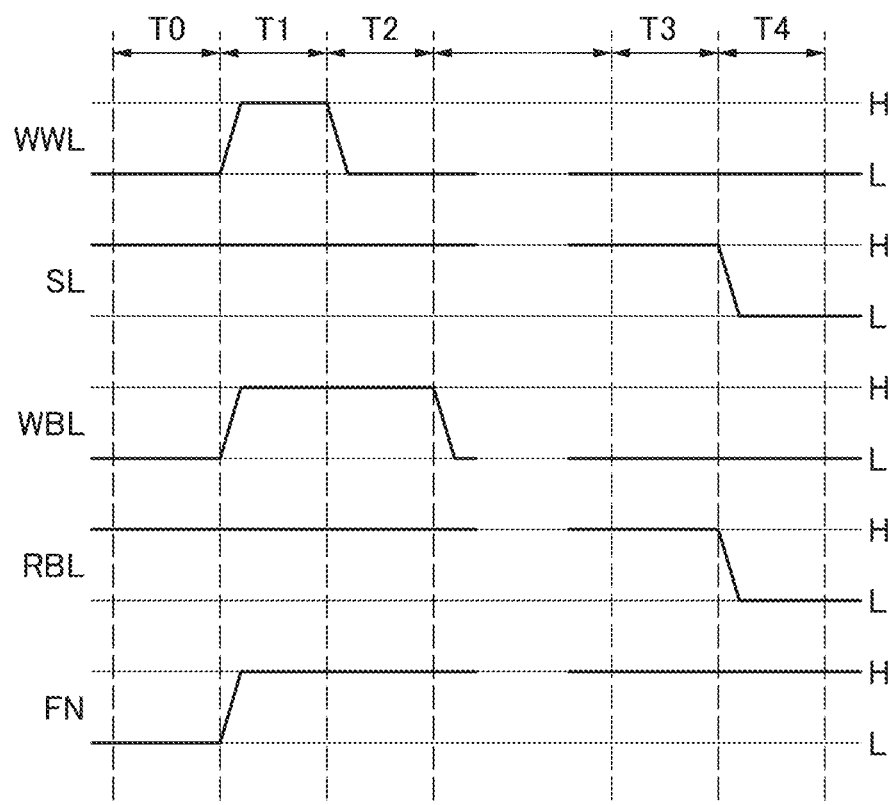
FIG. 10 is a timing chart for describing an operation of a memory cell.

Next, examples of a data writing operation and a data reading operation on the memory cell 10 will be described. In this embodiment, n-channel transistors are used as the transistor 11A and the transistor 11B. FIG. 10 is a timing chart for describing an operation example of the memory cell 10. FIG. 11(A), FIG. 11(B), FIG. 12(A), and FIG. 12(B) are circuit diagrams for describing operation examples of the memory cell 10.

In the drawings and the like, for showing the potentials of a wiring and an electrode, "H" representing an H potential or "L" representing an L potential is sometimes written near the wiring and the electrode. In addition, enclosed "H" or "L" is sometimes written near a wiring and an electrode whose potential changes. Moreover, a symbol "×" is sometimes written on a transistor in an off state.

First, in Period T0, the word line WWL, the bit line WBL, and the node FN each have an L potential, and the bit line RBL and the selection line SL each have an H potential (see FIG. 10).

[Data Writing Operation]

Figure 11A:
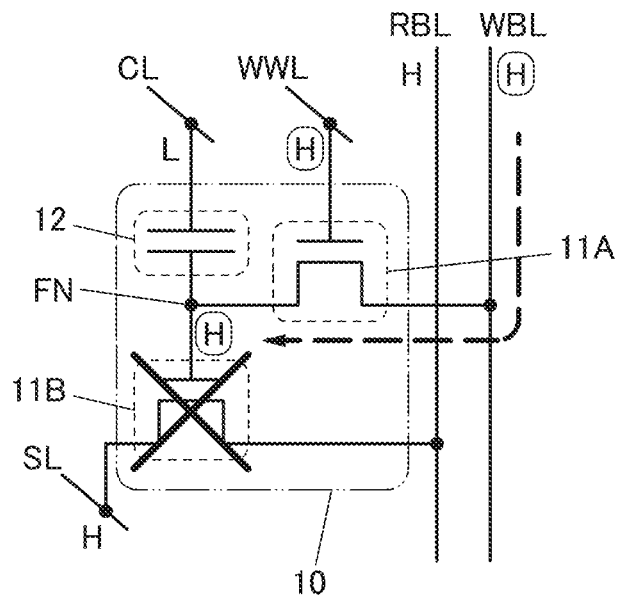
FIG. 11(A) and FIG. 11(B) are diagrams for describing the operations of a memory cell.
Figure 11B:
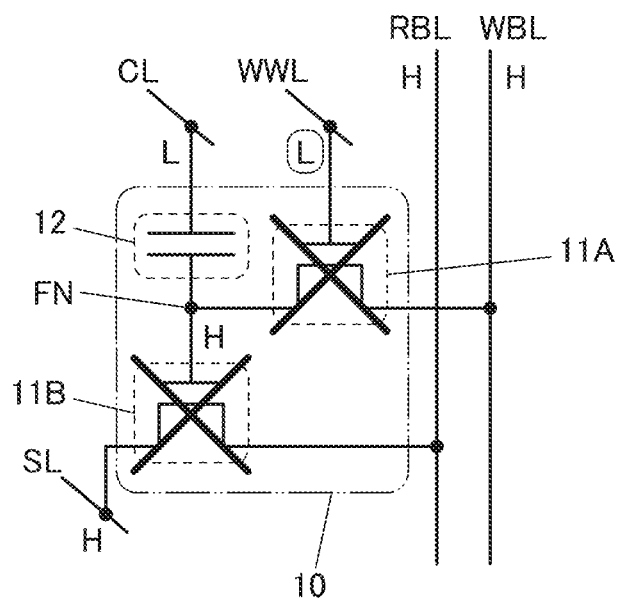

In Period T1, an H potential is supplied to each of the word line WWL and the bit line WBL (see FIG. 10 and FIG. 11(A)). Accordingly, the transistor 11A is brought into an on state and the H potential is written to the node FN as data indicating "1". More accurately, the amount of charge that makes the potential of the node FN be the H potential is supplied to the node FN.

Since all of the gate, source, and drain of the transistor 11B have the H potential, the transistor 11B is in an off state.

[Retention Operation]

In Period T2, an L potential is supplied to the word line WWL. Accordingly, the transistor 11A is brought into an off state and the data written to the node FN is retained (see FIG. 10 and FIG. 11(B)).

As described above, the OS transistor is a transistor having an extremely low off-state current. The use of the OS transistor as the transistor 11A enables data written to the node FN to be retained for a long period. Therefore, it becomes unnecessary to refresh the potential of the node FN and the power consumption of the memory cell 10 can be reduced. Thus, the power consumption of the memory device 100 can be reduced.

In addition, the OS transistor has a higher withstand voltage than a Si transistor. Therefore, when the transistor 11A is an OS transistor, the range of potentials retained at the node FN can be widened. Thus, the amount of data retained at the node FN can be increased.

[Reading Operation]

In Period T3, an H potential is precharged to the bit line RBL. That is, the bit line RBL is brought into a floating state while having the H potential (see FIG. 10 and FIG. 12(A)).

Figure 12A:
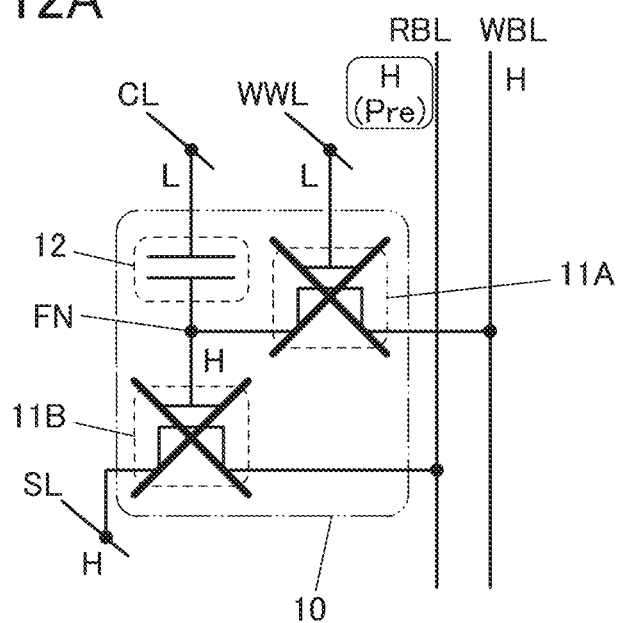
FIG. 12(A) and FIG. 12(B) are diagrams for describing the operations of a memory cell.
Figure 12B:
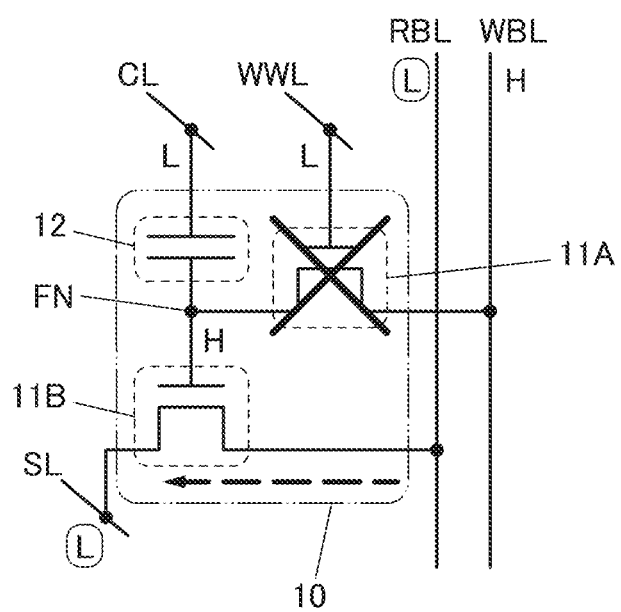

Next, in Period T4, an L potential is supplied to the selection line SL (see FIG. 10 and FIG. 12(B)). Here, when the node FN retains an H potential, the transistor 11B is brought into an on state and electrical continuity is established between the bit line RBL and the selection line SL. Thus, the potential of the bit line RBL changes from an H potential to an L potential.

In contrast, in the case where an L potential is written to the node FN as data indicating "0", the transistor 11B is not brought into an on state even when an L potential is supplied to the selection line SL. Thus, by detecting a change in the potential of the bit line RBL when an L potential is supplied to the selection line SL, data written to the memory cell 10 can be read.

The memory cell 10 using an OS transistor employs a method in which charge is written to the node FN through the OS transistor; hence, high voltage, which a conventional flash memory requires, is unnecessary and a high-speed writing operation is possible. Furthermore, the number of data writing and reading in the memory cell 10 using an OS transistor is substantially unlimited because charge injection and extraction into/from a floating gate or a charge trap layer are not performed. Furthermore, unlike a flash memory, the memory cell 10 using an OS transistor does not show instability due to an increase of electron trap centers even when a rewriting operation is repeated. The memory cell 10 using an OS transistor is less likely to degrade than a conventional flash memory and can have high reliability.

Unlike a magnetic memory, a resistive random access memory, or the like, the memory cell 10 using an OS transistor has no change in the structure at the atomic level. Thus, the memory cell 10 using an OS transistor has higher rewrite endurance than a magnetic memory and a resistive random access memory.

In the memory device 100 of one embodiment of the present invention, the memory cell 10 and the RW circuit 129 are electrically connected to each other through the bit line WBL and the bit line RBL having regions extending in the Z direction. Thus, the lengths of the bit line WBL and the bit line RBL which are led are short, and the wiring resistance and parasitic capacitance thereof are small.

<Structure Example of RW Circuit 129>

Figure 13:
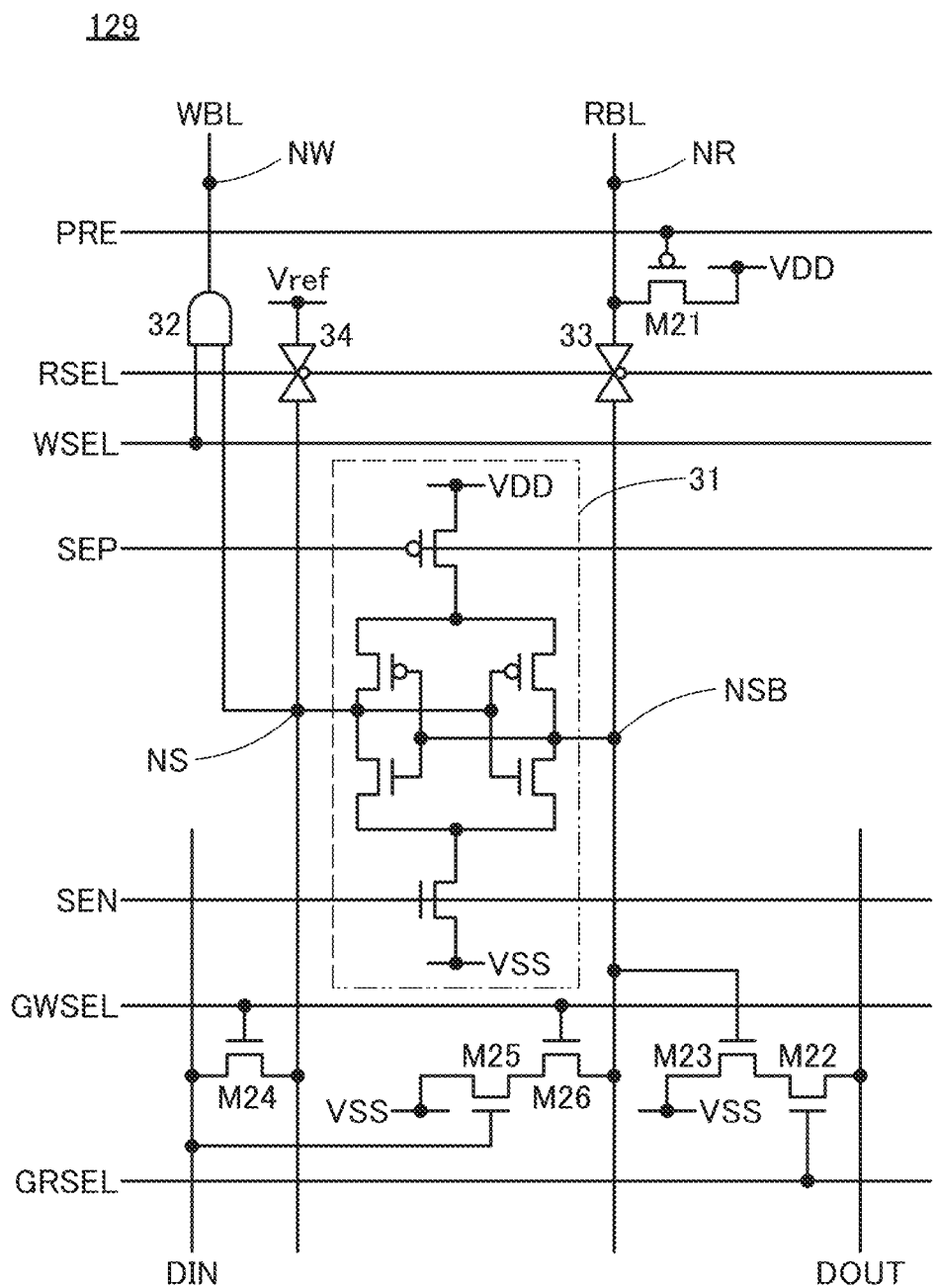
FIG. 13 is a diagram showing a structure example of a reading and writing circuit.

In the column driver 124, the RW circuit 129 illustrated in FIG. 13 is provided for each column. FIG. 13 is a circuit diagram showing a structure example of the RW circuit 129.

The RW circuit 129 includes a transistor M21 to a transistor M26, a sense amplifier circuit 31, an AND circuit 32, an analog switch 33, and an analog switch 34. The RW circuit 129 operates in accordance with a signal SEN, a signal SEP, a signal PRE, a signal RSEL, a signal WSEL, a signal GRSEL, and a signal GWSEL.

Data DIN supplied from the column driver 124 to the RW circuit 129 is written to the memory cell 10 through the bit line WBL electrically connected to a node NW. Data read from the memory cell 10 through the bit line RBL electrically connected to a node NR is output as data DOUT from the RW circuit 129 to the column driver 124.

Note that the data DIN and the data DOUT are internal signals and correspond to the data signal WDA and the data signal RDA, respectively.

[Precharge Circuit]

The transistor M21 functions as a precharge circuit. The bit line RBL is precharged to the potential VDD by the transistor M21. The signal PRE is a precharge signal, and the conduction state of the transistor M21 is controlled by the signal PRE.

[Sense Amplifier Circuit]

In a reading operation, the sense amplifier circuit 31 determines whether data input to the bit line RBL is at a high level or a low level. In addition, the sense amplifier circuit 31 functions as a latch circuit that temporarily retains the input data DIN in a writing operation.

The sense amplifier circuit 31 illustrated in FIG. 13 is a latch sense amplifier. The sense amplifier circuit 31 includes two inverter circuits, and an input node of one of the inverter circuits is connected to an output node of the other of the inverter circuits. When the input node of the one of the inverter circuits is a node NS and the output node is a node NSB, complementary data is retained at the node NS and the node NSB.

The signal SEN and the signal SEP are each a sense amplifier enable signal for activating the sense amplifier circuit 31, and a reference potential Vref is a read judge potential. The sense amplifier circuit 31 determines whether the potential of the node NSB at the time of the activation is at a high level or a low level on the basis of the reference potential Vref.

The AND circuit 32 controls electrical continuity between the node NS and the bit line WBL. The analog switch 33 controls electrical continuity between the node NSB and the bit line RBL, and the analog switch 34 controls electrical continuity between the node NS and a wiring for supplying the reference potential Vref.

The signal WSEL is a write selection signal, which controls the AND circuit 32. The signal RSEL is a read selection signal, which controls the analog switch 33 and the analog switch 34.

[Output MUX Circuit]

The transistor M22 and the transistor M23 form an output MUX (multiplexer) circuit. The signal GRSEL is a global read selection signal and controls the output MUX circuit.

The output MUX circuit has a function of outputting the data DOUT read from the sense amplifier circuit 31.

[Write Driver Circuit]

The transistor M24 to the transistor M26 form a write driver circuit. The signal GWSEL is a global write selection signal and controls the write driver circuit. The write driver circuit has a function of writing the input data DIN to the sense amplifier circuit 31.

The write driver circuit has a function of selecting a column to which the data DIN is to be written. The write driver circuit writes data in byte units, half-word units, or word units in response to the signal GWSEL.

This embodiment can be implemented in combination with any of the structures described in the other embodiments and the like, as appropriate.

Embodiment 2

Figure 14A:
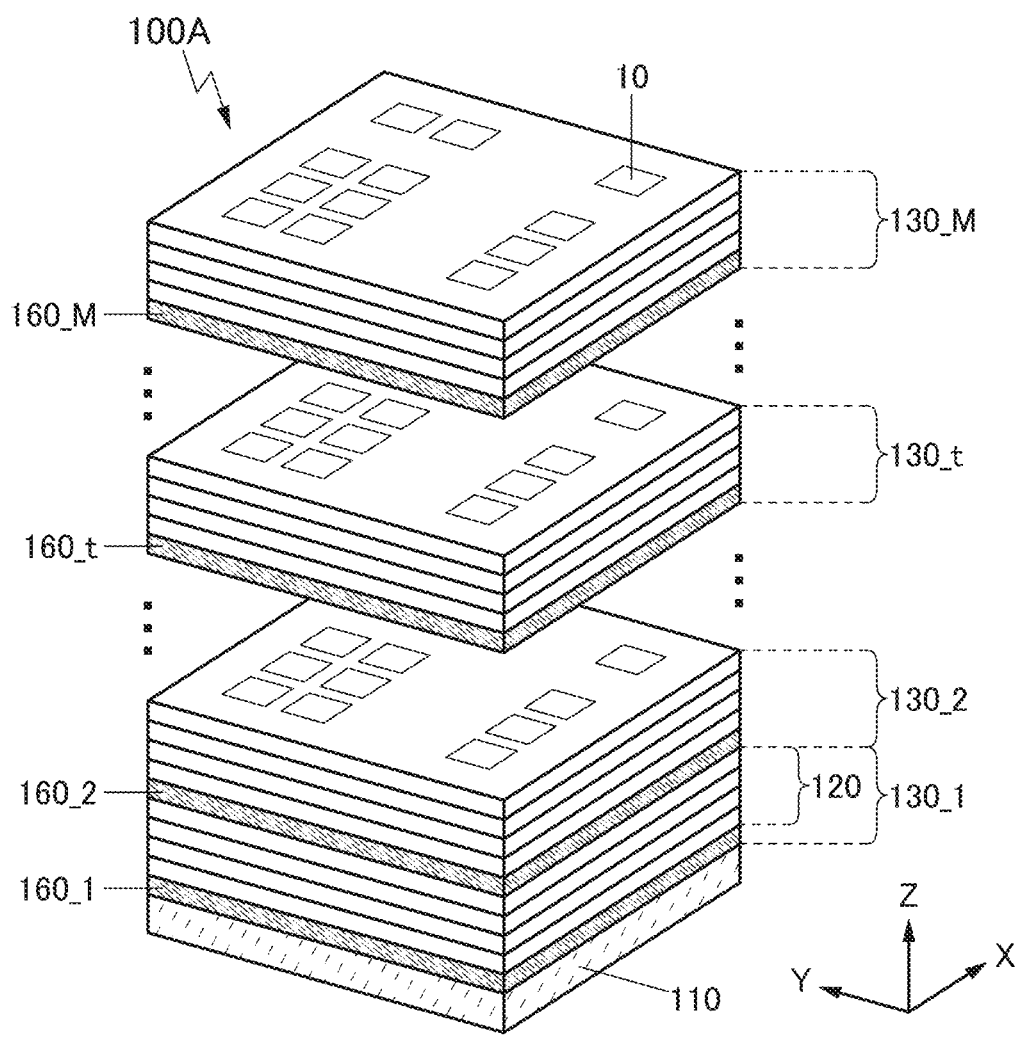
FIG. 14(A) to FIG. 14(C) are diagrams showing a structure example of a memory device.

In this embodiment, a modification example of the memory device 100 will be described. FIG. 14(A) illustrates a memory device 100A as a modification example of the memory device 100. In this embodiment, points of the memory device 100A that are different from those of the memory device 100 will be described. Other embodiments and the like are referred to for the matters that are not described in this embodiment.

<Memory Device 100A>

The memory device 100A has a structure in which M memory blocks 130 are stacked over the driver circuit layer 110. In FIG. 14(A) and the like, the first memory block 130 is denoted by a memory block 130_1 and the M-th memory block 130 (M is a natural number greater than or equal to 2) is denoted by a memory block 130_M. In addition, the t-th memory block 130 (t is a natural number greater than or equal to 1 and less than or equal to M) is denoted by a memory block 130_t.

One memory block 130 (e.g., the memory block 130_t) includes a functional layer 160 including the RW array 127, and R memory layers 120 (R is a natural number greater than or equal to 1). The functional layer 160 can be formed using an OS transistor, for example. In FIG. 14(A) and the like, the functional layer 160 included in the memory block 130_1 is denoted by a functional layer 160_1 and the functional layer 160 included in the M-th memory block 130 is denoted by a functional layer 160_M. The functional layer 160 included in the t-th memory block 130 is denoted by a functional layer 160_t.

Figure 14B:
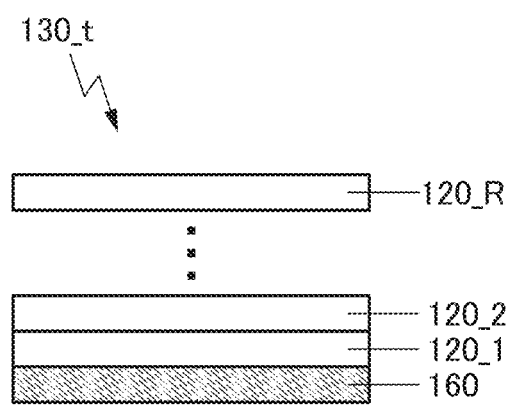

FIG. 14(B) shows a structure example of the memory block 130_t. In the memory block 130_t illustrated in FIG. 14(B), the R memory layers 120 are stacked over the functional layer 160. The memory cells 10 included in the R memory layers 120 are electrically connected to the RW array 127 included in the functional layer 160_t through the bit lines WBL and the bit lines RBL included in the R memory layers 120.

By dividing the N memory layers 120 into a plurality of blocks and providing the RW array 127 for each block, the bit line WBL and the bit line RBL can be shortened. When the bit line WBL and the bit line RBL are shortened, the signal propagation distance from the memory cell 10 to the RW array 127 is shortened; thus, the operation speed of the memory device can be increased. Moreover, parasitic capacitance due to the bit line WBL and the bit line RBL is reduced, whereby power consumption can be reduced. In addition, a multilevel memory in which a plurality of bits are stored in one memory cell can be easily achieved. Note that the RW array 127 has a function of reading data retained in the memory cell 10 or writing data to the memory cell 10. The circuit included in the functional layer 160 is not limited to the RW array 127, and circuits having a variety of functions or the like may be provided. Thus, the RW array 127 is referred to as a functional circuit in some cases.

Note that R representing the number of memory layers 120 included in the memory block 130_t is preferably the divisor of M representing the total number of memory blocks 130.

Figure 14C:
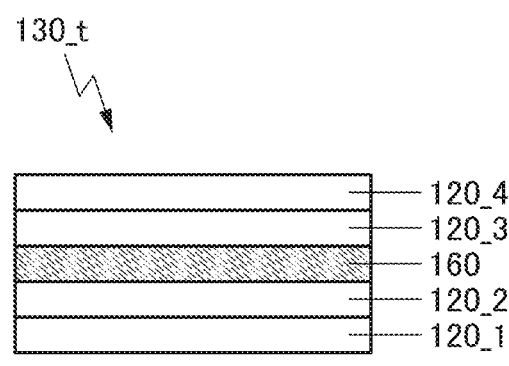

As illustrated in FIG. 14(C), the memory layers 120 may be provided over and under the functional layer 160. FIG. 14(C) shows an example in which two memory layers 120 are provided over and under the functional layer 160. Providing a plurality of memory layers 120 so that the functional layer 160 is sandwiched therebetween can further shorten the signal propagation distance. Note that one or more memory layers 120 are stacked over the functional layer 160 and one or more memory layers 120 are stacked under the functional layer 160. Thus, the number of memory layers 120 is not limited to two as in FIG. 14(C).

The number of memory layers 120 stacked over the functional layer 160 and the number of memory layers 120 stacked under the functional layer 160 are preferably equal to each other. Therefore, R representing the total number of memory layers 120 in the memory block 130_t illustrated in FIG. 14(C) is preferably an even number.

This embodiment can be implemented in combination with any of the structures described in the other embodiments and the like, as appropriate.

Embodiment 3

Figure 15A:
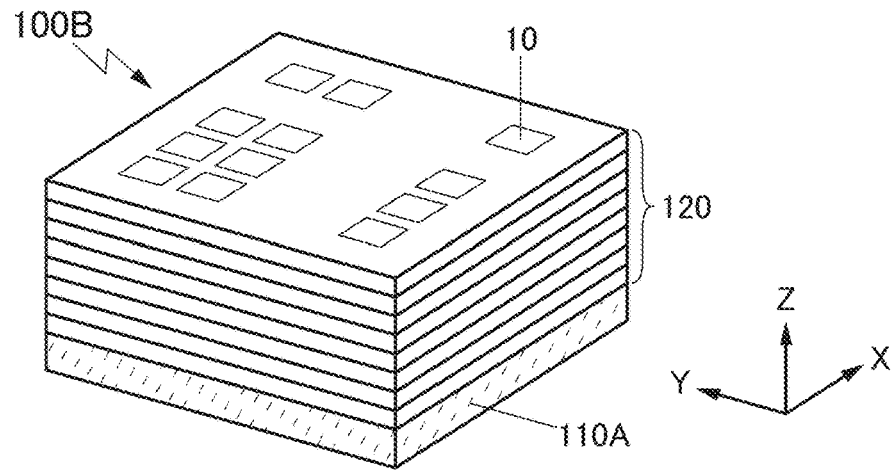
FIG. 15(A) and FIG. 15(B) are diagrams showing a structure example of a memory device.

In this embodiment, a modification example of the memory device 100 will be described. FIG. 15(A) illustrates a memory device 100B as a modification example of the memory device 100. In this embodiment, points of the memory device 100B that are different from those of the memory device 100 will be described. Other embodiments and the like are referred to for the matters that are not described in this embodiment.

<Memory Device 100B>

Figure 15B:
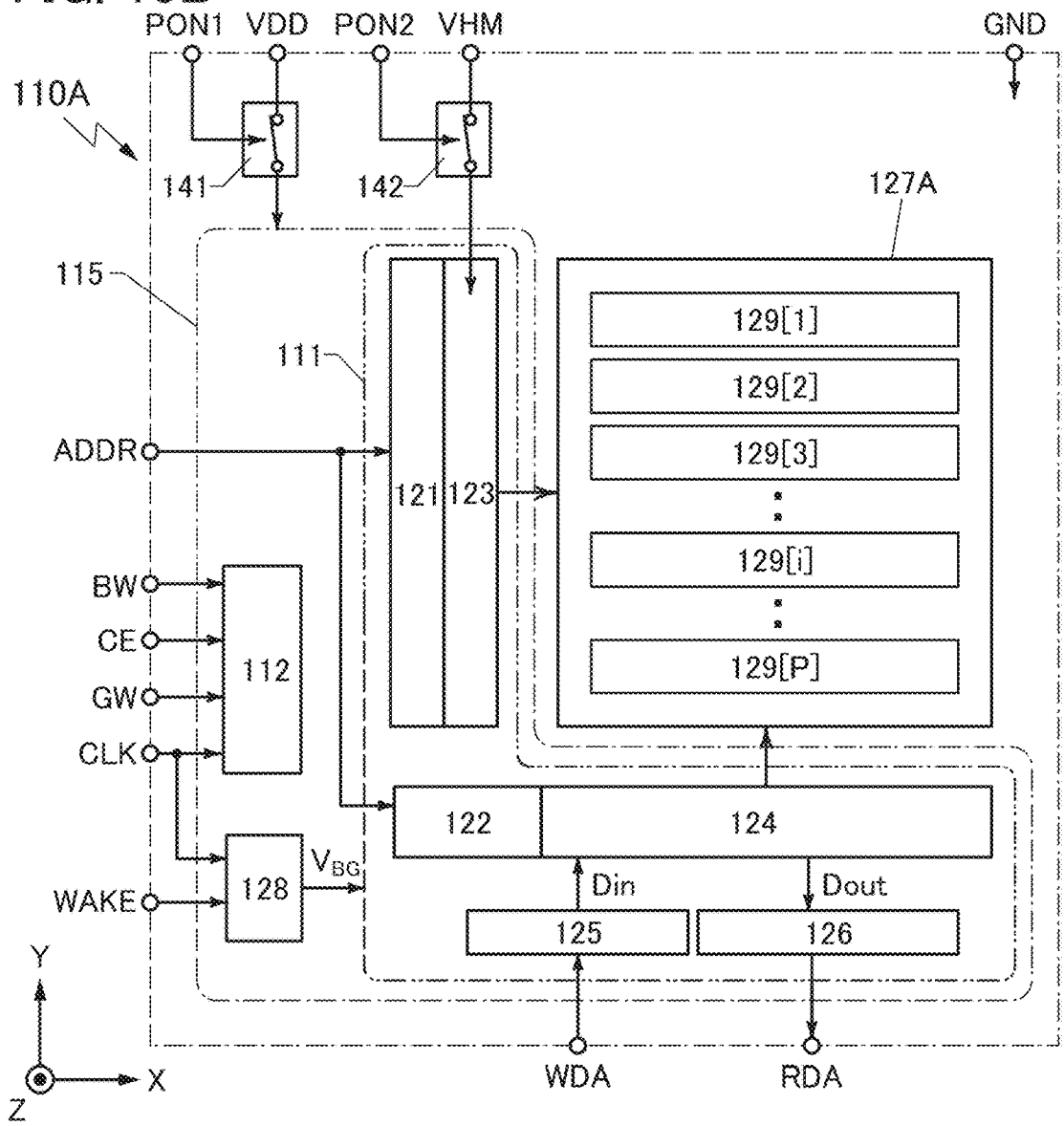

The memory device 100B includes a driver circuit layer 110A instead of the driver circuit layer 110 of the memory device 100. FIG. 15(B) is a block diagram showing a structure example of the driver circuit layer 110A. The driver circuit layer 110A includes an RW array 127A instead of the RW array 127 of the driver circuit layer 110. The components other than the RW array 127A of the driver circuit layer 110A are similar to those of the driver circuit layer 110; thus, detailed description thereof is omitted in this embodiment.

The RW array 127A includes one RW circuit 129 for the memory cells 10 in one row. In FIG. 15(B) and the like, the RW circuit 129 in the first row is denoted by an RW circuit 129[1] and the RW circuit 129 in the i-th row is denoted by an RW circuit 129[i]. Furthermore, the RW circuit 129 in the P-th row is denoted by an RW circuit 129[P].

Figure 16:
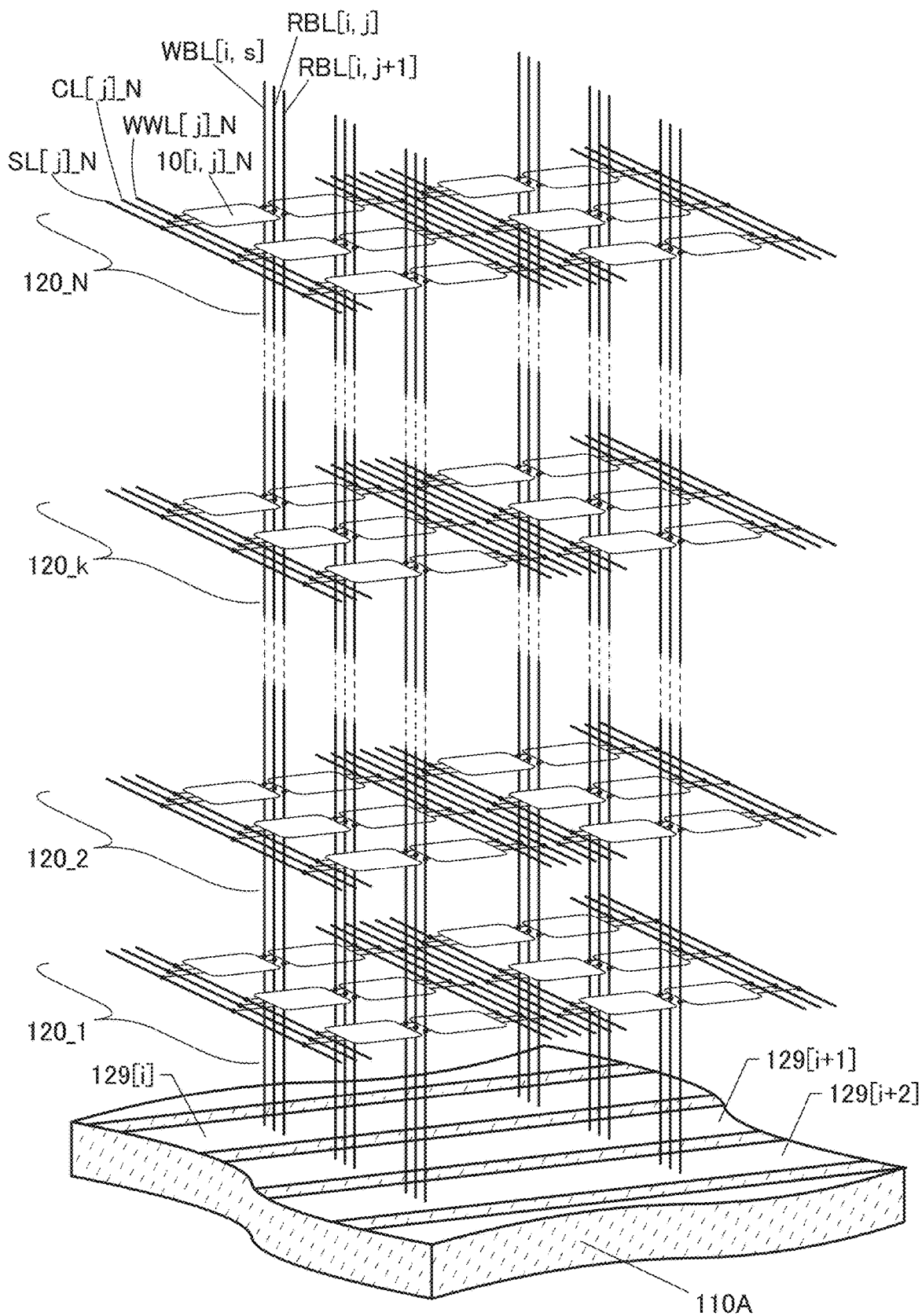
FIG. 16 is a diagram illustrating part of memory layers and part of a driver circuit layer.
Figure 17:
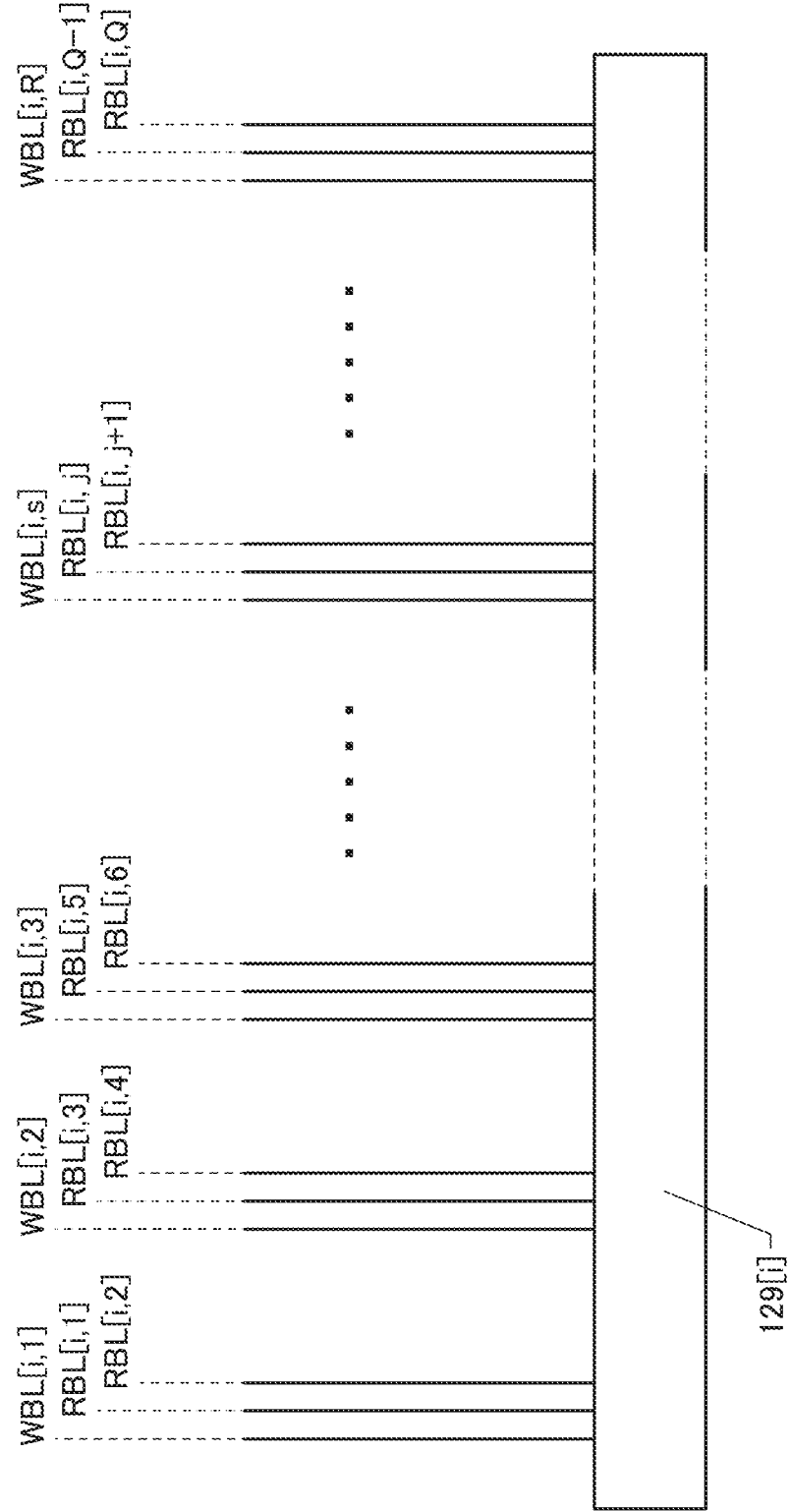
FIG. 17 is a diagram showing a connection example of bit lines and an RW circuit.

FIG. 16 is a perspective view illustrating part of some of the N memory layers 120 and part of the driver circuit layer 110A. FIG. 17 is a diagram showing a connection example of the RW circuit 129 in the i-th row (an RW circuit 129[i]), the bit lines WBL in the i-th row (a bit line WBL[i,1] to a bit line WBL[i,R]), and the bit lines RBL in the i-th row (a bit line RBL[i,1] to a bit line RBL[i,Q]).

The RW circuit 129[i] is electrically connected to the bit line WBL[i,1] to the bit line WBL[i,R] and the bit line RBL[i,1] to the bit line RBL[i,Q].

With the structure of the RW array 127A, the design flexibility of the RW circuit 129 can be increased compared to the case of providing the RW circuits 129 in a matrix of P rows and Q columns. Furthermore, the area occupied by the RW array 127A can be reduced, so that the design flexibility of all the circuits included in the driver circuit layer 110A can be increased.

<Memory Device 100C>

In the above-described memory device 100B, all the bit lines included in one row are connected to one RW circuit 129, so that a load such as wiring capacitance applied to the RW circuit 129 is likely to increase. In particular, in the case of a memory device with increased storage capacity including an increased number of bit lines in one row, the influence is increased, and thus the speed, accuracy, or the like of data reading and data writing is easily lowered.

In view of this, a selection circuit 153 is provided between the memory cell 10 and the RW circuit 129, whereby in reading and writing operations, the number of bit lines WBL and bit lines RBL electrically connected to the RW circuit 129 is reduced and a load applied to the RW circuit 129 is reduced.

Figure 18A:
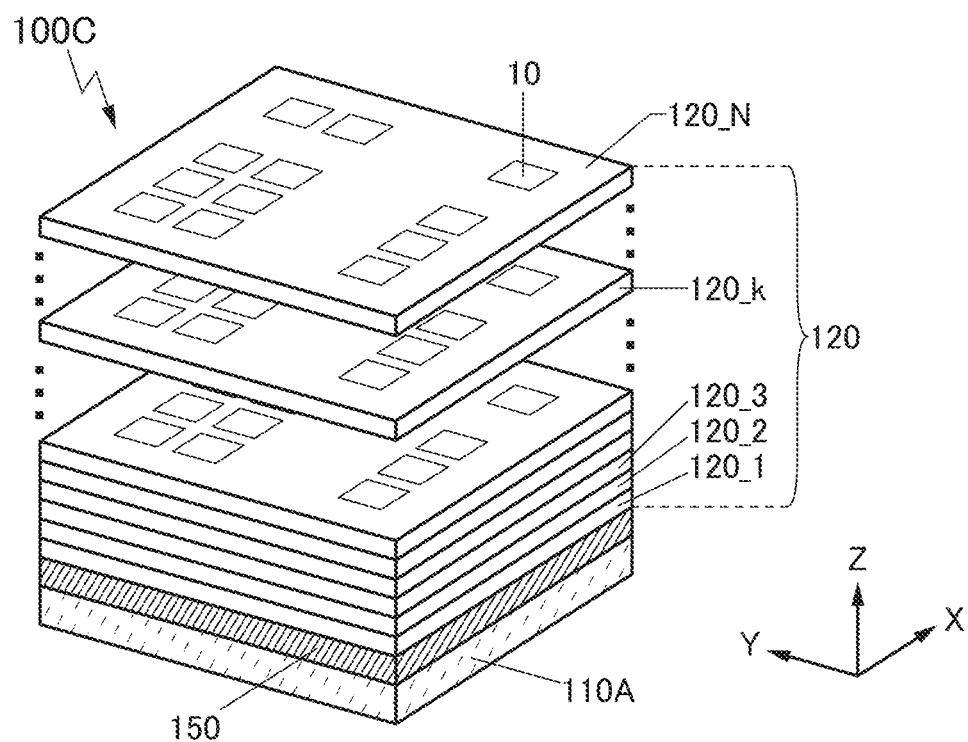
FIG. 18(A) and FIG. 18(B) are diagrams showing a structure example of a memory device.

FIG. 18(A) illustrates a memory device 100C. The memory device 100C is a modification example of the memory device 100B. Thus, in order to avoid repeated description, points of the memory device 100C that are different from those of the memory device 100B are described.

Figure 18B:
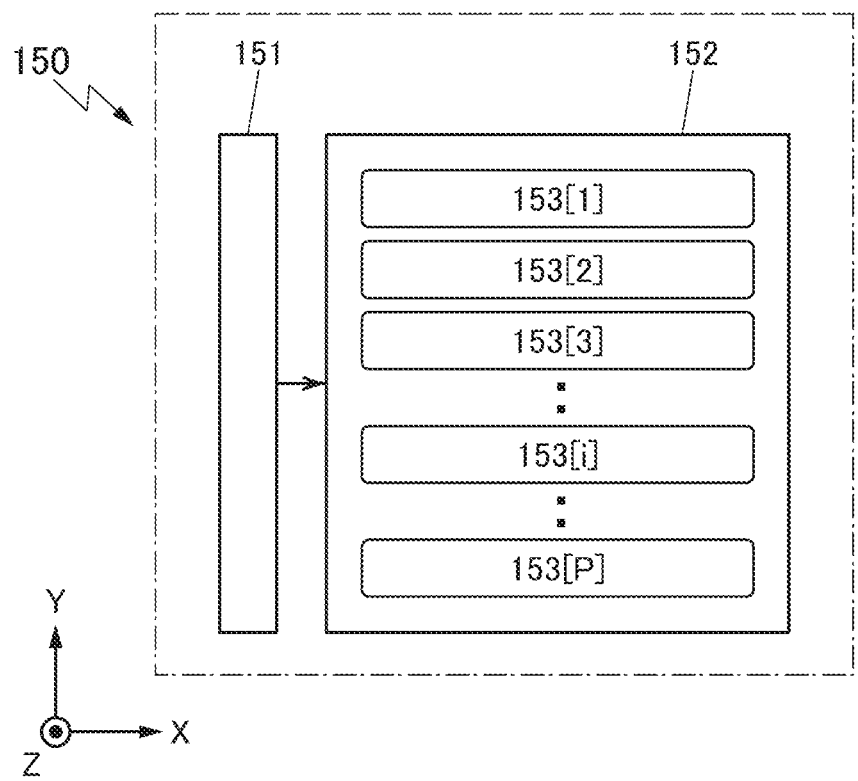

The memory device 100C includes a functional layer 150 between the memory layer 120 and the driver circuit layer 110A. FIG. 18(B) is a block diagram showing a structure example of the functional layer 150. The functional layer 150 includes a control circuit 151 and a selection circuit group 152.

The selection circuit group 152 includes one selection circuit 153 for the memory cells 10 in one row. In FIG. 18(B) and the like, the selection circuit 153 in the first row is denoted by a selection circuit 153[1] and the selection circuit 153 in the i-th row is denoted by a selection circuit 153[i]. Furthermore, the selection circuit 153 in the P-th row is denoted by a selection circuit 153[P].

Figure 19:
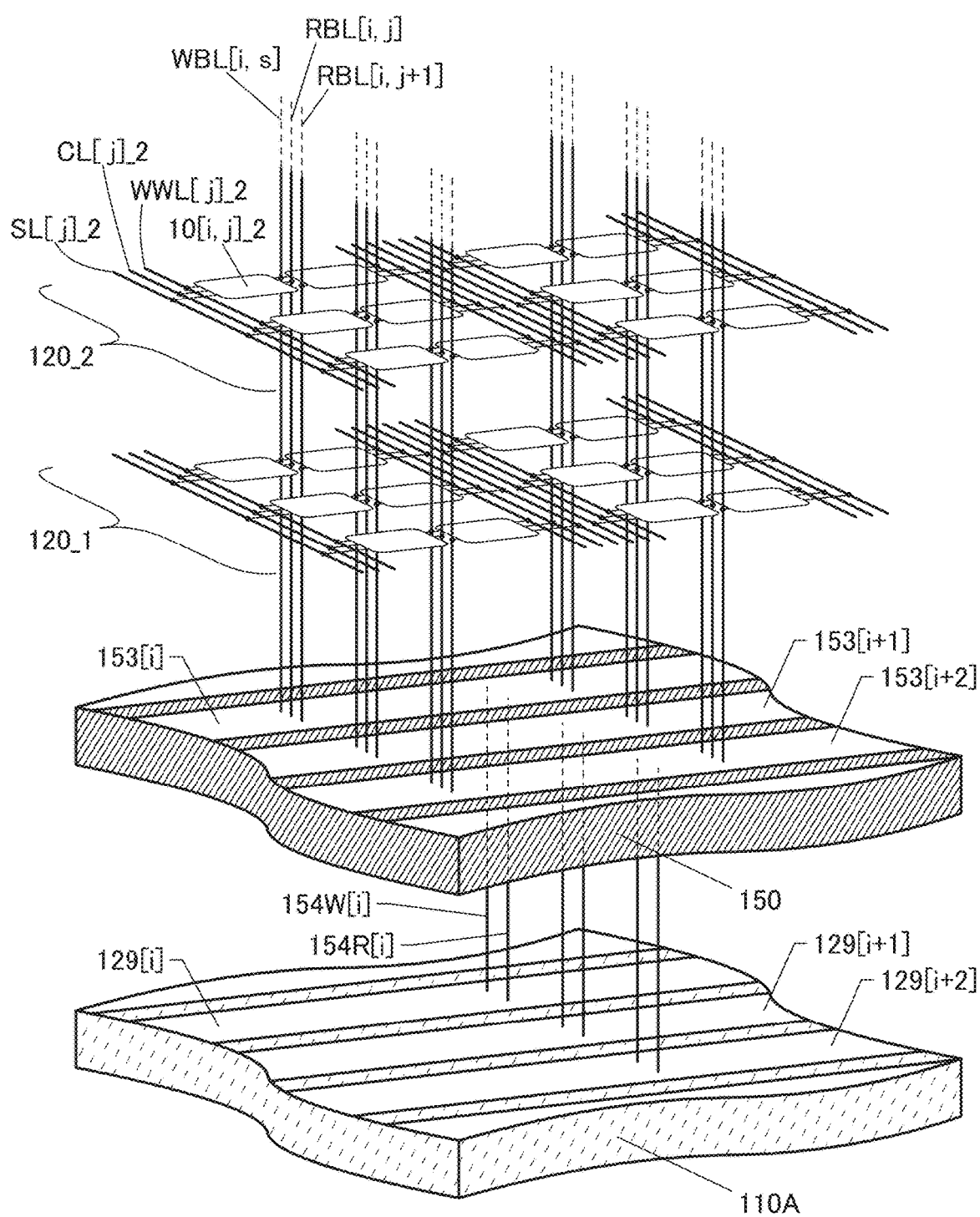
FIG. 19 is a diagram illustrating part of memory layers, part of a functional layer, and part of a driver circuit layer.
Figure 20:
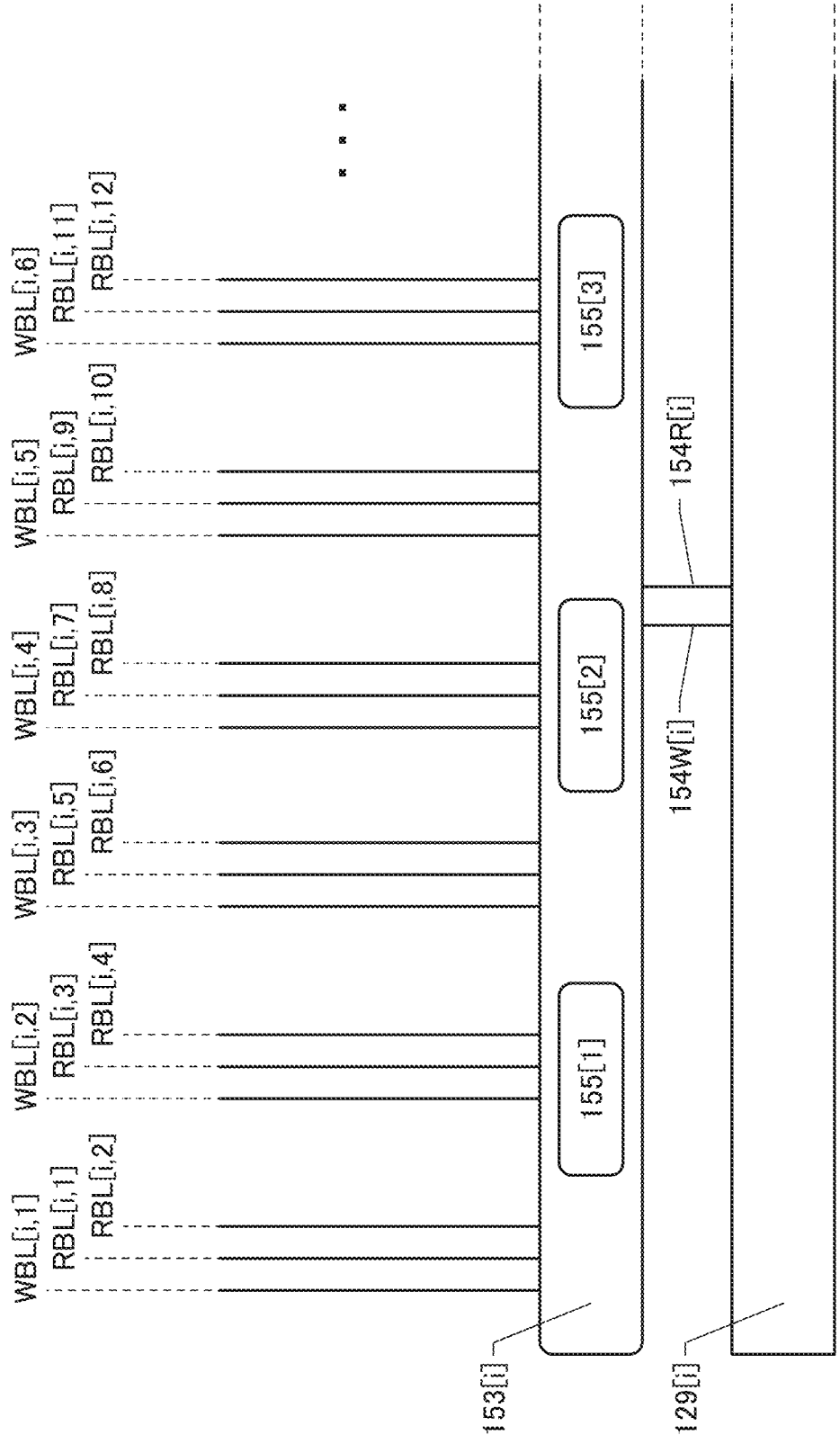
FIG. 20 is a diagram showing a connection example of bit lines, a selection circuit, and an RW circuit.

FIG. 19 is a perspective view illustrating part of the memory layers 120, part of the functional layer 150, and part of the driver circuit layer 110A. FIG. 20 is a diagram showing a connection example of the RW circuit 129 in the i-th row (the RW circuit 129[i]), the selection circuit 153 in the i-th row (the selection circuit 153[i]), the bit lines WBL in the i-th row (the bit line WBL[i,1] to a bit line WBL[i,6] in FIG. 20), and the bit lines RBL in the i-th row (the bit line RBL[i,1] to a bit line RBL[i,12] in FIG. 20).

The bit line WBL in the i-th row and the bit line RBL in the i-th row are electrically connected to the selection circuit 153[i]. The selection circuit 153[i] is electrically connected to the RW circuit 129[i] through a wiring 154W[i] and a wiring 154R[i]. The wiring 154W[i] is electrically connected to the node NW of the RW circuit 129[i]. The wiring 154R[i] is electrically connected to the node NR of the RW circuit 129[i] (see FIG. 19).

The selection circuit 153 includes G switch groups 155 (G is a natural number greater than or equal to 2). In this embodiment and the like, the first switch group 155 is denoted by a switch group 155[1]. FIG. 20 illustrates a switch group 155[2] which is the second switch group 155 and a switch group 155[3] which is the third switch group 155.

Figure 21:
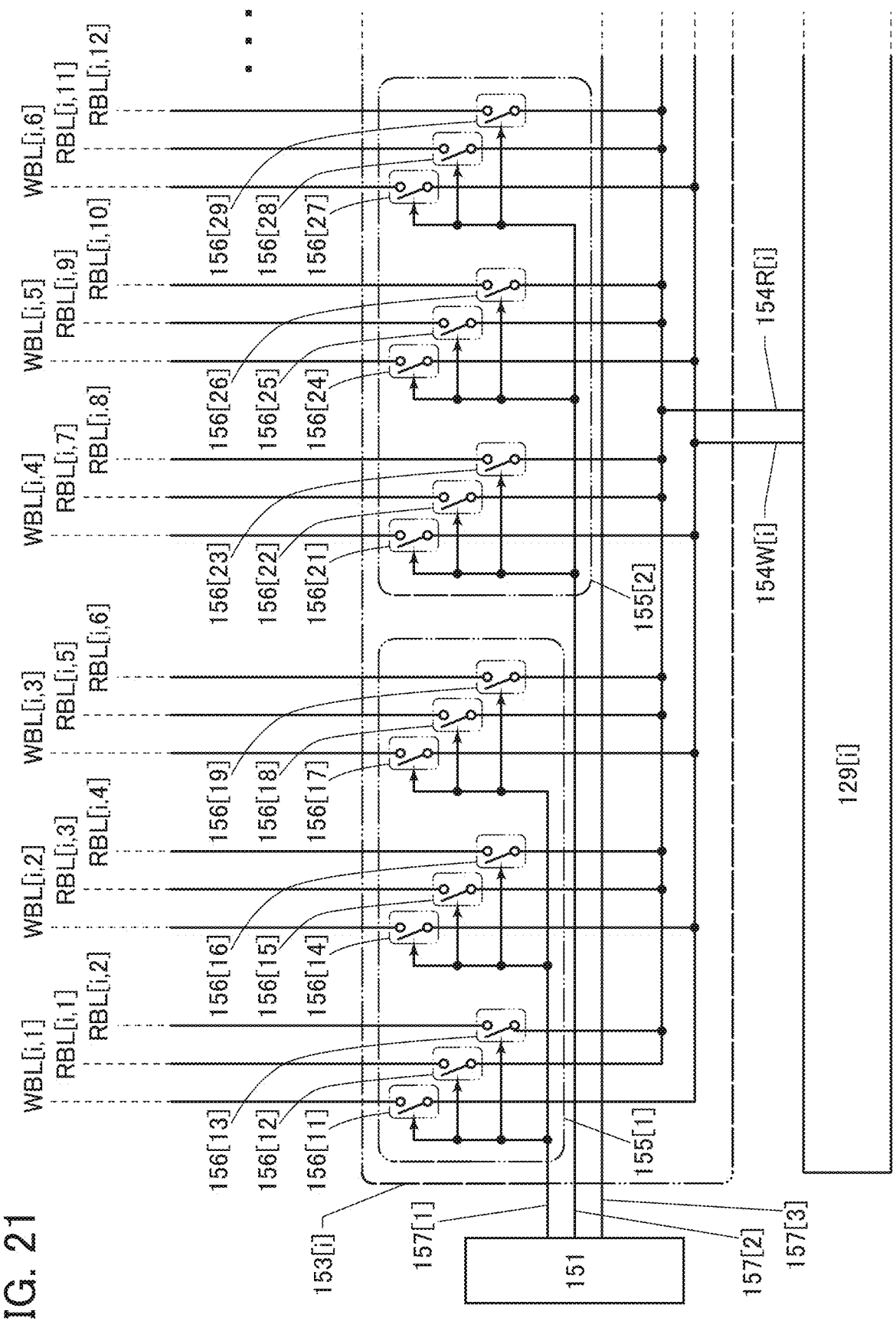
FIG. 21 is a diagram showing a structure example of a selection circuit.

A more specific structure example of the selection circuit 153[i] will be described with reference to FIG. 21. As described above, the selection circuit 153[i] includes the plurality of switch groups 155. FIG. 21 illustrates two switch groups 155 (the switch group 155[1] and the switch group 155[2]). One switch group 155 includes a plurality of switches 156. FIG. 21 shows an example in which the switch group 155[1] includes a switch 156[11] to a switch 156[19].

Similarly, an example in which the switch group 155[2] includes a switch 156[21] to a switch 156[29] is shown.

The switch 156[11] is provided between the bit line WBL[i,1] and the wiring 154W[i]. The switch 156[12] is provided between the bit line RBL[i,1] and the wiring 154R[i]. The switch 156[13] is provided between a bit line RBL[i,2] and the wiring 154R[i]. The switch 156[14] is provided between a bit line WBL[i,2] and the wiring 154W[i]. The switch 156[15] is provided between a bit line RBL[i,3] and the wiring 154R[i]. The switch 156[16] is provided between a bit line RBL[i,4] and the wiring 154R[i]. The switch 156[17] is provided between a bit line WBL[i,3] and the wiring 154W[i]. The switch 156[18] is provided between a bit line RBL[i,5] and the wiring 154R[i]. The switch 156[19] is provided between a bit line RBL[i,6] and the wiring 154R[i].

The control circuit 151 is electrically connected to the peripheral circuit 115. The control circuit 151 has a function of controlling the operation of the switch group 155[1] through a wiring 157[1]. In other words, the conduction state (on state) and the non-conduction state (off state) of the switch 156[11] to the switch 156[19] are controlled by a signal supplied from the control circuit 151 through the wiring 157[1].

When the signal for bringing the switch 156[11] to the switch 156[19] into a conduction state is supplied from the control circuit 151 through the wiring 157[1], electrical continuity is established between the bit line WBL[i,1] to the bit line WBL[i,3] and the wiring 154W[i]. Furthermore, electrical continuity is established between the bit line RBL[i,1] to the bit line RBL[i,6] and the wiring 154R[i].

The switch 156[21] is provided between a bit line WBL[i,4] and the wiring 154W[1]. The switch 156[22] is provided between a bit line RBL[i,7] and the wiring 154R[i]. The switch 156[23] is provided between a bit line RBL[i,8] and the wiring 154R[i]. The switch 156[24] is provided between a bit line WBL[i,5] and the wiring 154W[i]. The switch 156[25] is provided between a bit line RBL[i,9] and the wiring 154R[i]. The switch 156[26] is provided between a bit line RBL[i,10] and the wiring 154R[1]. The switch 156[27] is provided between the bit line WBL[i,6] and the wiring 154W[i]. The switch 156[28] is provided between a bit line RBL[i,11] and the wiring 154R[i]. The switch 156[29] is provided between the bit line RBL[i,12] and the wiring 154R[i].

The control circuit 151 has a function of controlling the operation of the switch group 155[2] through a wiring 157[2]. In other words, the conduction state and the non-conduction state of the switch 156[21] to the switch 156[29] are controlled by a signal supplied from the control circuit 151 through the wiring 157[2].

When the signal for bringing the switch 156[21] to the switch 156[29] into a conduction state is supplied from the control circuit 151 through the wiring 157[2], electrical continuity is established between the bit line WBL[i,4] to the bit line WBL[i,6] and the wiring 154W[i]. Furthermore, electrical continuity is established between the bit line RBL[i,7] to the bit line RBL[i,12] and the wiring 154R[i].

A wiring 157[3] has a function of transmitting control signals to a plurality of switches 156 included in the switch group 155[3] (not illustrated).

The control circuit 151 selects the switch group 155 to be brought into an on state depending on the bit line to be used. For example, in the case where a data reading operation and a data writing operation are performed on the memory cell 10 connected to the bit line RBL[i,7], the control circuit 151 brings the switch group 155[2] into an on state and brings the other switch groups 155 into an off state.

By selecting the switch group 155 to be brought into an on state, the number of bit lines WBL and bit lines RBL electrically connected to the RW circuit 129 can be reduced in the reading and writing operations. Thus, a load such as wiring capacitance applied to the RW circuit 129 can be reduced.

In this embodiment, the structure in which three bit lines WBL and six bit lines RBL are connected to one switch group 155 is described; however, the number of bit lines WBL and bit lines RBL connected to one switch group 155 is not limited thereto. One of the bit line WBL and the bit line RBL may be electrically connected to the switch group 155 and the other may be electrically connected to the RW circuit 129.

In addition, G representing the number of switch groups 155 is preferably the divisor of R representing the number of bit lines WBL included in one row. Alternatively, G representing the number of switch groups 155 is preferably the divisor of Q representing the number of bit lines RBL included in one row.

As the switch 156, a MEMS (Micro Electro Mechanical Systems) element or a switching element such as a transistor can be used. When a transistor is used as the switch 156, an OS transistor is preferably used.

This embodiment can be implemented in combination with any of the structures described in the other embodiments and the like, as appropriate.

Embodiment 4

Examples of the memory device of the above embodiment will be described below with reference to FIG. 22 to FIG. 27. First, a structure example of a memory cell included in the memory device is described.

<Structure Example of Memory Cell>

Figure 22A:
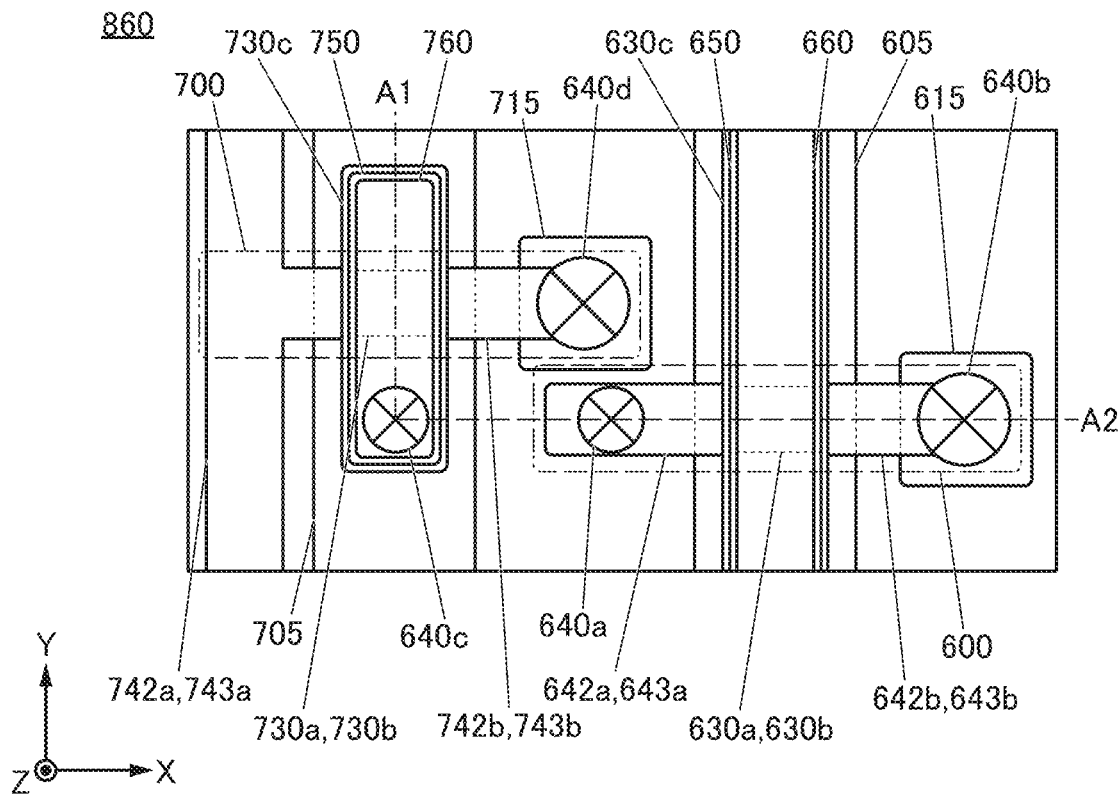
FIG. 22(A) and FIG. 22(B) are a top view and a cross-sectional view of a memory device of one embodiment of the present invention.
Figure 22B:
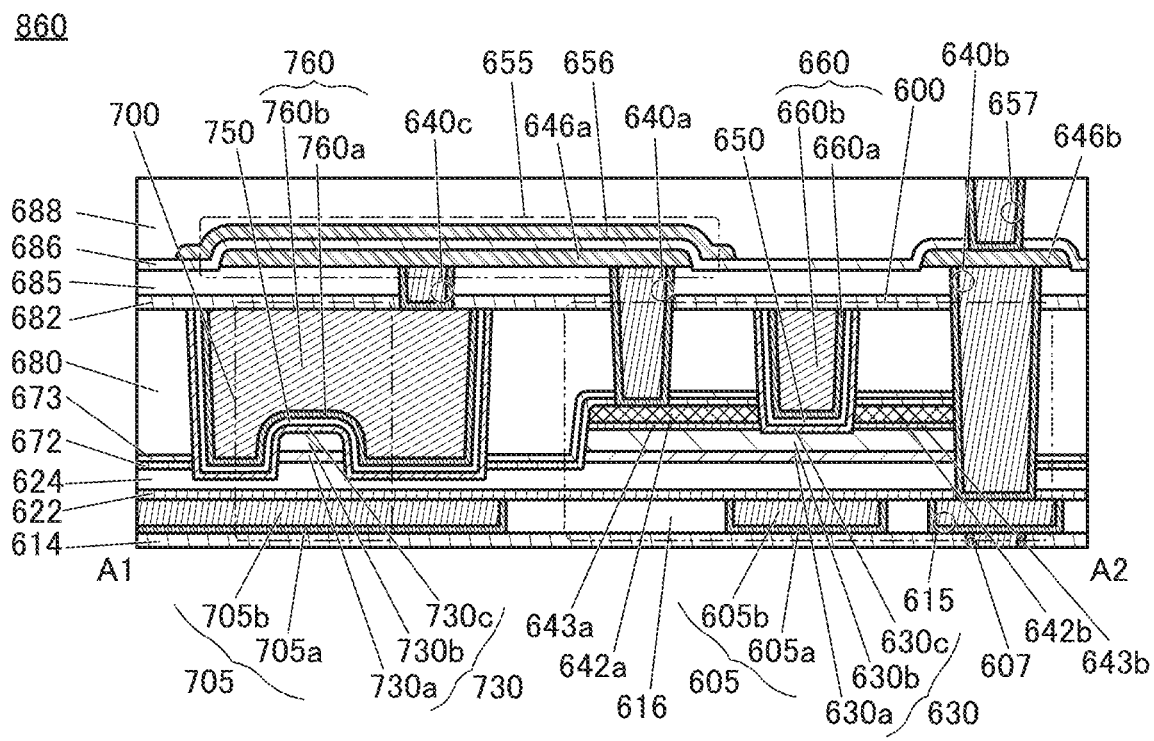

FIG. 22(A) and FIG. 22(B) illustrate the structure of a memory cell 860 included in the memory device of one embodiment of the present invention. FIG. 22(A) is a top view of the memory cell 860 and its periphery. FIG. 22(B) is a cross-sectional view of the memory cell 860, and FIG. 22(B) corresponds to a portion indicated by a dashed-dotted line A1-A2 in FIG. 22(A). FIG. 22(B) illustrates a cross section of a transistor 600 in the channel length direction and a cross section of a transistor 700 in the channel width direction. Note that for clarity of the drawing, some components are omitted in the top view in FIG. 22(A). Note that the X direction, the Y direction, and the Z direction illustrated in FIG. 22(A) are directions orthogonal to or intersecting with each other. Here, it is preferable that the X direction and the Y direction be parallel or substantially parallel to a substrate surface and the Z direction be perpendicular or substantially perpendicular to the substrate surface.

The memory cell 860 described in this embodiment includes the transistor 600, the transistor 700, and a capacitor 655. The memory cell 860 corresponds to the memory cell 10 described in the above embodiment, and the transistor 600, the transistor 700, and the capacitor 655 correspond to the transistor 11A, the transistor 11B, and the capacitor 12 described in the above embodiment, respectively. Thus, one of a source and a drain of the transistor 600, a gate of the transistor 700, and one electrode of the capacitor 655 are electrically connected to each other.

As illustrated in FIGS. 22(A) and 22(B), in the memory cell 860, the transistor 600 and the transistor 700 are placed over an insulator 614; an insulator 680 is placed over part of the transistor 600 and part of the transistor 700; an insulator 682 is placed over the transistor 600, the transistor 700, and the insulator 680; an insulator 685 is placed over the insulator 682; the capacitor 655 is placed over the insulator 685; and an insulator 688 is placed over the capacitor 655. The insulator 614, the insulator 680, the insulator 682, the insulator 685, and the insulator 688 function as interlayer films.

Here, the transistor 600 includes an insulator 616 over the insulator 614; conductors 605 (a conductor 605a and a conductor 605b) placed to be embedded in the insulator 616; an insulator 622 over the insulator 616 and the conductor 605; an insulator 624 over the insulator 622; an oxide 630a over the insulator 624; an oxide 630b over the oxide 630a; an oxide 643a and an oxide 643b over the oxide 630b; a conductor 642a over the oxide 643a; a conductor 642b over the oxide 643b; an insulator 672 in contact with part of the insulator 624, a side surface of the oxide 630a, a side surface of the oxide 630b, a side surface of the oxide 643a, a side surface of the conductor 642a, a top surface of the conductor 642a, a side surface of the oxide 643b, a side surface of the conductor 642b, and a top surface of the conductor 642b; an insulator 673 over the insulator 672; an oxide 630c over the oxide 630b; an insulator 650 over the oxide 630c; and conductors 660 (a conductor 660a and a conductor 660b) that are positioned over the insulator 650 and overlap with the oxide 630c. The oxide 630c is in contact with the side surface of the oxide 643a, the side surface of the oxide 643b, the side surface of the conductor 642a, and the side surface of the conductor 642b. Here, as illustrated in FIG. 22(B), a top surface of the conductor 660 is placed to be substantially aligned with a top surface of the insulator 650, a top surface of the oxide 630c, and a top surface of the insulator 680. The insulator 682 is in contact with the top surfaces of the conductor 660, the insulator 650, the oxide 630c, and the insulator 680.

Hereinafter, the oxide 630a, the oxide 630b, and the oxide 630c may be collectively referred to as an oxide 630. The oxide 643a and the oxide 643b may be collectively referred to as an oxide 643. The conductor 642a and the conductor 642b may be collectively referred to as a conductor 642.

In the transistor 600, the conductor 660 functions as a gate, and the conductor 642a and the conductor 642b function as a source and a drain. The conductor 605 functions as a back gate. In the transistor 600, the conductor 660 functioning as a gate is formed in a self-aligned manner to fill an opening formed in the insulator 680 and the like. As described above, in the memory device according to this embodiment, the conductor 660 can be surely placed in a region between the conductor 642a and the conductor 642b without position alignment.

The transistor 700 includes the insulator 616 over the insulator 614; conductors 705 (a conductor 705a and a conductor 705b) placed to be embedded in the insulator 616; the insulator 622 over the insulator 616 and the conductor 705; the insulator 624 over the insulator 622; an oxide 730a over the insulator 624; an oxide 730b over the oxide 730a; an oxide 743a and an oxide 743b over the oxide 730b; a conductor 742a over the oxide 743a; a conductor 742b over the oxide 743b; the insulator 672 in contact with part of the insulator 624, a side surface of the oxide 730a, a side surface of the oxide 730b, a side surface of the oxide 743a, a side surface of the conductor 742a, a top surface of the conductor 742a, a side surface of the oxide 743b, a side surface of the conductor 742b, and a top surface of the conductor 742b; an insulator 673 over the insulator 672; an oxide 730c over the oxide 730b; an insulator 750 over the oxide 730c; and conductors 760 (a conductor 760a and a conductor 760b) that are positioned over the insulator 750 and overlap with the oxide 730c. The oxide 730c is in contact with the side surface of the oxide 743a, the side surface of the oxide 743b, the side surface of the conductor 742a, and the side surface of the conductor 742b. Here, as illustrated in FIG. 22(B), a top surface of the conductor 760 is placed to be substantially aligned with a top surface of the insulator 750, a top surface of the oxide 730c, and the top surface of the insulator 680. The insulator 682 is in contact with the top surfaces of the conductor 760, the insulator 750, the oxide 730c, and the insulator 680.

Hereinafter, the oxide 730a, the oxide 730b, and the oxide 730c may be collectively referred to as an oxide 730. The oxide 743a and the oxide 743b may be collectively referred to as an oxide 743. The conductor 742a and the conductor 742b may be collectively referred to as a conductor 742.

In the transistor 700, the conductor 760 functions as a gate, and the conductor 742a and the conductor 742b function as a source and a drain. The conductor 705 functions as a back gate. In the transistor 700, the conductor 760 functioning as a gate is formed in a self-aligned manner to fill an opening formed in the insulator 680 and the like. As described above, in the memory device according to this embodiment, the conductor 760 can be surely placed in a region between the conductor 742a and the conductor 742b without position alignment.

Here, the transistor 700 and the transistor 600 are formed in the same layer and have similar structures. Thus, although a cross section of the transistor 700 in the channel length direction is not illustrated, the cross section has a structure similar to that of the cross section of the transistor 600 in the channel length direction illustrated in FIG. 22(B). That is, the oxide 743 and the conductor 742, which are not illustrated in the cross-sectional view, have structures similar to those of the oxide 643 and the conductor 642 illustrated in FIG. 22(B). Note that although a cross section of the transistor 600 in the channel width direction is not illustrated, the cross section has a structure similar to that of the cross section of the transistor 700 in the channel width direction illustrated in FIG. 22(B).

Thus, the oxide 730 has a structure similar to that of the oxide 630 and the description of the oxide 630 can be referred to. The conductor 705 has a structure similar to that of the conductor 605, and thus the description of the conductor 605 can be referred to. The oxide 743 has a structure similar to that of the oxide 643, and thus the description of the oxide 643 can be referred to. The conductor 742 has a structure similar to that of the conductor 642, and thus the description of the conductor 642 can be referred to. The insulator 750 has a structure similar to that of the insulator 650, and thus the description of the insulator 650 can be referred to. The conductor 760 has a structure similar to that of the conductor 660, and thus the description of the conductor 660 can be referred to. Unless otherwise specified, as described above, the description of the structure of the transistor 600 can be referred to for the structure of the transistor 700 in the following description.

Here, in the transistor 600 and the transistor 700, a metal oxide functioning as an oxide semiconductor (hereinafter also referred to as an oxide semiconductor) is preferably used as the oxide 630 and the oxide 730 each including a region where a channel is formed (hereinafter also referred to as a channel formation region).

For example, a metal oxide having an energy gap of 2 eV or more, preferably 2.5 eV or more is preferably used as the metal oxide functioning as an oxide semiconductor. With the use of a metal oxide having a wide energy gap, the leakage current in the non-conduction state (off-state current) of the transistor 600 can be extremely low.

As an oxide semiconductor, a metal oxide such as an In-M-Zn oxide (an element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, an In-M oxide, an In—Zn oxide, or an M-Zn oxide may be used as the oxide semiconductor.

The transistor 600 and the transistor 700 using an oxide semiconductor in their channel formation regions have an extremely low off-state current; thus, a semiconductor device with low power consumption can be provided. The off-state current of each of the transistor 600 and the transistor 700 hardly increases even in a high-temperature environment. Specifically, the off-state current hardly increases even at an environment temperature higher than or equal to room temperature and lower than or equal to 200° C. Thus, a memory device can achieve stable operation and high reliability even in a high temperature environment.

Since the off-state current of the transistor 600 is extremely low, the capacitance value of the capacitor 655 can be set small. Accordingly, the area occupied by the memory cell 860 can be small and integration of the memory device can be achieved.

As illustrated in FIG. 22(A), the conductor 742*a*, the conductor 660, the conductor 605, and the conductor 705 preferably extend in the Y direction. With such a structure, the conductor 742*a* functions as the selection line SL described in the above embodiment. The conductor 660 functions as the word line WWL described in the above embodiment. The conductor 605 functions as the wiring BGL1 described in the above embodiment. The conductor 705 functions as the wiring BGL2 described in the above embodiment.

The capacitor 655 includes a conductor 646*a* over the insulator 685, an insulator 686 covering the conductor 646*a*, and a conductor 656 placed over the insulator 686 to overlap with at least part of the conductor 656. Here, the conductor 646*a* functions as the one electrode of the capacitor 655 and a conductor 646*b* functions as the other electrode of the capacitor 655. The insulator 686 functions as a dielectric of the capacitor 655.

Furthermore, the conductor 656 preferably extends in the Y direction to function as the capacitor line CL described in the above embodiment.

In addition, openings are formed in the insulator 622, the insulator 624, the insulator 672, the insulator 673, the insulator 680, the insulator 682, and the insulator 685, and conductors 640 (a conductor 640*a*, a conductor 640*b*, a conductor 640*c*, and a conductor 640*d*) functioning as plugs are embedded in the openings. The insulator 685 and the conductor 640 are provided so that their top surfaces are aligned with each other.

A bottom surface of the conductor 640*a* is in contact with the conductor 642*a* and a top surface is in contact with the conductor 646*a*. A bottom surface of the conductor 640*c* is in contact with the conductor 760 and a top surface is in contact with the conductor 646*a*. In this manner, one of the source and the drain of the transistor 600, the gate of the transistor 700, and the one electrode of the capacitor 655 are electrically connected to each other.

The conductor 640*b* is provided in contact with a side surface of the conductor 642*b*. A conductor 615 and a conductor 607 are provided below the conductor 640*b*, and the conductor 646*b* and a conductor 657 are provided above the conductor 640*b*. The conductor 607 is provided in an opening formed in the insulator 614. Here, the conductor 615 and the conductor 605 are formed in the same layer and have similar structures. The conductor 646*b* and the conductor 646*a* are formed in the same layer and have similar structures. The conductor 657 is provided in an opening formed in the insulator 686 and the insulator 688.

The conductor 640*b* is electrically connected to the conductor 640*b* of the memory cell 860 in the lower layer through the conductor 607 and the conductor 615. The conductor 640*b* is electrically connected to the conductor 640*b* of the memory cell 860 in the upper layer through the conductor 646*b* and the conductor 657. As described above, the conductor 607, the conductor 615, the conductor 640*b*, the conductor 646*b*, and the conductor 657 extend in the Z direction and function as the bit line WBL described in the above embodiment.

Although not illustrated in the cross-sectional view, the conductor 640*d* is provided in contact with the side surface of the conductor 742*b*. The conductor 715 is provided below the conductor 640*d*. The conductor 640*d* is electrically connected to the conductors 640*d* in the upper layer and the lower layer. As described above, the conductor 715, the conductor 640*d*, and the like extend in the Z direction and function as the bit line RBL described in the above embodiment.

In the case where the transistor 600 and the transistor 700 are formed in the same layer as illustrated in FIG. 22(B), the transistor 600 and the transistor 700 can be formed in the same step. Therefore, the manufacturing process of the memory device can be shortened and productivity can be improved.

Note that although the transistor 600, the transistor 700, and the capacitor 655 in the memory cell 860 are provided such that the channel length direction of the transistor 600 and the channel length direction of the transistor 700 are parallel to each other, the memory device described in this embodiment is not limited thereto. The memory cell 860 illustrated in FIG. 22 and the like is a structure example of the memory device, and the transistors, capacitors, or the like having appropriate structures are placed as appropriate depending on a circuit structure or a driving method.

[Specific Structure of Memory Cell]

A specific structure of the memory cell 860 of one embodiment of the present invention will be described below. Hereinafter, the description of the components of the transistor 600 can be referred to for the components of the transistor 700.

As illustrated in FIG. 22, the oxide 630 preferably includes the oxide 630*a* over the insulator 624, the oxide 630*b* over the oxide 630*a*, and the oxide 630*c* that is placed over the oxide 630*b* and is at least partly in contact with a top surface of the oxide 630*b*. Here, a side surface of the oxide 630*c* is preferably provided in contact with the oxide 643*a*, the oxide 643*b*, the conductor 642*a*, the conductor 642*b*, the insulator 672, the insulator 673, and the insulator 680.

That is, the oxide 630 includes the oxide 630*a*, the oxide 630*b* over the oxide 630*a*, and the oxide 630*c* over the oxide 630*b*. Including the oxide 630*a* under the oxide 630*b* makes it possible to inhibit diffusion of impurities into the oxide 630*b* from the components formed below the oxide 630*a*. Moreover, including the oxide 630*c* over the oxide 630*b* makes it possible to inhibit diffusion of impurities into the oxide 630b from the components formed above the oxide 630c.

Note that the transistor 600 has a structure in which three layers of the oxide 630a, the oxide 630b, and the oxide 630c are stacked in a channel formation region and its vicinity; however, the present invention is not limited thereto. For example, a single layer of the oxide 630b, a two-layer structure of the oxide 630b and the oxide 630a, a two-layer structure of the oxide 630b and the oxide 630c, or a stacked-layer structure of four or more layers may be employed. For example, a stacked-layer structure of four layers including the oxide 630c with a two-layer structure may be provided.

In addition, the oxide 630 preferably has a stacked-layer structure of oxides which differ in the atomic ratio of metal elements. Specifically, the atomic proportion of the element M in the constituent elements in the metal oxide used as the oxide 630a is preferably higher than the atomic proportion of the element M in the constituent elements in the metal oxide used as the oxide 630b. In addition, the atomic ratio of the element M to In in the metal oxide used as the oxide 630a is preferably higher than the atomic ratio of the element M to In in the metal oxide used as the oxide 630b. Furthermore, the atomic ratio of In to the element M in the metal oxide used as the oxide 630b is preferably higher than the atomic ratio of In to the element M in the metal oxide used as the oxide 630a. A metal oxide that can be used as the oxide 630a or the oxide 630b can be used as the oxide 630c. Note that the atomic ratio of In to the element M in the metal oxide used as the oxide 630c may be greater than the atomic ratio of In to the element M in the metal oxide used as the oxide 630b.

Specifically, as the oxide 630a, a metal oxide having In:Ga:Zn=1:3:4 [atomic ratio] or a composition that is a neighborhood thereof or 1:1:0.5 [atomic ratio] or a composition that is a neighborhood thereof is used.

As the oxide 630b, a metal oxide having In:Ga:Zn=4:2:3 [atomic ratio] or a composition that is a neighborhood thereof or 1:1:1 [atomic ratio] or a composition that is a neighborhood thereof is used. As the oxide 630b, a metal oxide having In:Ga:Zn=5:1:3 [atomic ratio] or a composition that is a neighborhood thereof or In:Ga:Zn=10:1:3 [atomic ratio] or a composition that is a neighborhood thereof may be used. As the oxide 630b, an In—Zn oxide (e.g., In:Zn=2:1 [atomic ratio] or a composition that is a neighborhood thereof, In:Zn=5:1 [atomic ratio] or a composition that is a neighborhood thereof, or In:Zn=10:1 [atomic ratio] or a composition that is a neighborhood thereof) may be used. As the oxide 630b, an In oxide may be used.

As the oxide 630c, a metal oxide having In:Ga:Zn=1:3:4 [atomic ratio or a composition that is a neighborhood thereof], Ga:Zn=2:1 [atomic ratio] or a composition that is a neighborhood thereof, or Ga:Zn=2:5 [atomic ratio] or a composition that is a neighborhood thereof is used. A single layer or stacked layers of the material that can be used for the oxide 630b may be used for the oxide 630c. Specific examples of the oxide 630c having a stacked-layer structure include a stacked-layer structure of In:Ga:Zn=4:2:3 [atomic ratio] or a composition that is a neighborhood thereof and In:Ga:Zn=1:3:4 [atomic ratio] or a composition that is a neighborhood thereof, a stacked-layer structure of Ga:Zn=2:1 [atomic ratio] or a composition that is a neighborhood thereof and In:Ga:Zn=4:2:3 [atomic ratio] or a composition that is a neighborhood thereof, a stacked-layer structure of Ga:Zn=2:5 [atomic ratio] or a composition that is a neighborhood thereof and In:Ga:Zn=4:2:3 [atomic ratio] or a composition that is a neighborhood thereof, and a stacked-layer structure of gallium oxide and In:Ga:Zn=4:2:3 [atomic ratio] or a composition that is a neighborhood thereof.

Moreover, an increase in the proportion of indium in the oxides 630b and 630c can increase the on-state current, field-effect mobility, or the like of the transistor, which is preferable. The above-described composition that is a neighborhood includes ±30% of an intended atomic ratio.

Furthermore, the composition of elements contained in a metal oxide may be changed depending on operation frequency or the like required for a transistor. For example, a metal oxide of a transistor included in a memory cell may have In:Ga:Zn=4:2:3 [atomic ratio] or a composition that is a neighborhood thereof, and a metal oxide of a transistor included in the driver circuit layer 110 may have In:Ga:Zn=5:1:3 [atomic ratio] or a composition that is a neighborhood thereof. Note that a metal oxide of a transistor included in the driver circuit layer 110 may have In:Ga:Zn=10:1:3 [atomic ratio] or a composition that is a neighborhood thereof or In:Zn=2:1 [atomic ratio] or a composition that is a neighborhood thereof.

The oxide 630b may have crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit extraction of oxygen from the oxide 630b by the source electrode or the drain electrode. In addition, the amount of oxygen extracted from the oxide 630b can be reduced even when heat treatment is performed; thus, the transistor 600 is stable at high temperatures (what is called thermal budget) in a manufacturing process.

In addition, the oxide 630c is preferably provided in the opening provided in the interlayer films including the insulator 680. Thus, the insulator 650 and the conductor 660 include a region that overlaps with a stacked-layer structure of the oxide 630b and the oxide 630a with the oxide 630c therebetween. With this structure, the oxide 630c and the insulator 650 can be sequentially deposited and thus, the interface between the oxide 630 and the insulator 650 can be kept clean. Thus, the influence of interface scattering on carrier conduction is small, and the transistor 600 can have a high on-state current and excellent frequency characteristics.

An oxide semiconductor with a low carrier concentration is preferably used as the oxide 630 (e.g., the oxide 630b). In the case where the carrier concentration of the oxide semiconductor is lowered, the impurity concentration in the oxide semiconductor is lowered to decrease the density of defect states. In this specification and the like, a state with a low impurity concentration and a low density of defect states is referred to as a highly purified intrinsic or substantially highly purified intrinsic state. Examples of the impurities in the oxide semiconductor include hydrogen, nitrogen, alkali metal, alkaline earth metal, iron, nickel, and silicon.

In particular, hydrogen contained in an oxide semiconductor reacts with oxygen bonded to a metal atom to be water, and thus sometimes forms an oxygen vacancy (also referred to as Vo) in the oxide semiconductor. In some cases, a defect where hydrogen enters an oxygen vacancy (hereinafter, sometimes referred to as VoH) functions as a donor and generates an electron serving as a carrier. In other cases, bonding of part of hydrogen to oxygen bonded to a metal atom generates electrons serving as carriers. Thus, a transistor including an oxide semiconductor which contains a large amount of hydrogen is likely to be normally on. Moreover, hydrogen in an oxide semiconductor is easily transferred by a stress such as heat or an electric field; thus, a large amount of hydrogen in an oxide semiconductor might reduce the reliability of a transistor.

VoH can serve as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Accordingly, in the case where an oxide semiconductor is used as the oxide 630, the amount of VoH in the oxide 630 is preferably reduced as much as possible so that the oxide 630 becomes a highly purified intrinsic or substantially highly purified intrinsic oxide. In order to obtain such an oxide semiconductor with sufficiently reduced VoH, it is important to remove impurities such as moisture and hydrogen in the oxide semiconductor (this treatment is sometimes referred to as dehydration or dehydrogenation treatment) and supply oxygen to the oxide semiconductor to fill oxygen vacancies (this treatment is sometimes referred to as oxygen adding treatment). When an oxide semiconductor with sufficiently reduced impurities such as VoH is used for a channel formation region of a transistor, stable electrical characteristics can be given.

The hydrogen concentration of the oxide 630b, which is measured by secondary ion mass spectrometry (SIMS), can be lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$, for example. The oxide 630 with sufficiently reduced impurities such as hydrogen is used for the channel formation region of the transistor 600, whereby the transistor can have normally-off characteristics, stable electrical characteristics, and improved reliability.

When an oxide semiconductor is used for the oxide 630, the carrier concentration of the oxide semiconductor in a region functioning as a channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet still further preferably lower than $1 \times 10^{13}$ cm$^{-3}$, yet still further preferably lower than $1 \times 10^{12}$ cm$^{-3}$. Note that the lower limit of the carrier concentration of the oxide semiconductor in the region functioning as the channel formation region is not particularly limited and can be, for example, $1 \times 10^{-9}$ cm$^{-3}$.

Thus, it is preferable to use a material inhibiting diffusion of impurities (hereinafter, also referred to as a material having a barrier property against impurities) for each of the insulator 614, the insulator 622, the insulator 672, the insulator 673, and the insulator 682 to reduce diffusion of impurities such as hydrogen into the oxide 630. A barrier property in this specification and the like means a function of inhibiting diffusion of a particular substance (also referred to as a function of less easily transmitting the substance). Alternatively, a barrier property in this specification and the like means a function of trapping and fixing (also referred to as gettering) a particular substance. In this specification and the like, an insulating film having a barrier property is referred to as a barrier insulating film in some cases.

Examples of a material that has a function of inhibiting diffusion of hydrogen and oxygen include aluminum oxide, hafnium oxide, gallium oxide, indium gallium zinc oxide, silicon nitride, and silicon nitride oxide. It is particularly preferable to use silicon nitride or silicon nitride oxide as a sealing material because of their high barrier properties against hydrogen.

Examples of a material having a function of trapping and fixing hydrogen include metal oxides such as aluminum oxide, hafnium oxide, gallium oxide, and indium gallium zinc oxide.

For example, as the insulator 614, aluminum oxide or hafnium oxide is preferably used. Accordingly, impurities such as water or hydrogen can be inhibited from being diffused to the transistor 600 side from the substrate side. In addition, oxygen contained in the insulator 624 and the like can be inhibited from being diffused to the substrate side.

The conductor 605 is provided to overlap with the oxide 630 and the conductor 660. Furthermore, the conductor 605 is preferably embedded in the insulator 616.

When the conductor 605 functions as a back gate, by changing a potential applied to the conductor 605 not in conjunction with but independently of a potential applied to the conductor 660, the threshold voltage (Vth) of the transistor 600 can be adjusted. In particular, by applying a negative potential to the conductor 605, Vth of the transistor 600 can be further increased, and the off-state current can be reduced. Thus, a drain current at the time when a potential applied to the conductor 660 is 0 V can be lower in the case where a negative potential is applied to the conductor 605 than in the case where a negative potential is not applied to the conductor 605.

As illustrated in FIG. 22(A), the conductor 605 is preferably provided to be larger than a region of the oxide 630 that does not overlap with the conductor 642a or the conductor 642b. It is particularly preferable that the conductor 605 extend beyond an end portion of the oxide 630 that intersects with the channel width direction. That is, the conductor 605 and the conductor 660 preferably overlap with each other with the insulators therebetween on an outer side of the side surface of the oxide 630 in the channel width direction. A large conductor 605 can sometimes reduce local charging (referred to as charge up) in treatment using plasma of a fabrication step after the formation of the conductor 605. Note that one embodiment of the present invention is not limited thereto. The conductor 605 overlaps with at least the oxide 630 positioned between the conductor 642a and the conductor 642b.

When a bottom surface of the insulator 624 is used as a reference, the level of a bottom surface of the conductor 660 in a region where the oxide 630a and the oxide 630b do not overlap with the conductor 660 is preferably placed lower than the level of a bottom surface of the oxide 630b.

As illustrated in the drawing, when a structure in which the conductor 660, which functions as a gate, covers the side surface and the top surface of the oxide 630b in the channel formation region with the oxide 630c and the insulator 650 therebetween is employed, electric fields generated from the conductor 660 are likely to affect the entire channel formation region generated in the oxide 630b. Thus, the on-state current of the transistor 600 can be increased and the frequency characteristics can be improved. In this specification, a transistor structure in which a channel formation region is electrically surrounded by electric fields of the first gate and the second gate is referred to as a surrounded channel (S-channel) structure.

The conductor 605a is preferably a conductor that inhibits passage of oxygen and impurities such as water or hydrogen. For example, titanium, titanium nitride, tantalum, or tantalum nitride can be used. For the conductor 605b, it is preferable to use a conductive material containing tungsten, copper, or aluminum as its main component. Although the conductor 605 is illustrated as having two layers, a multilayer structure with three or more layers may be employed.

The insulator 616, the insulator 680, the insulator 685, and the insulator 688 preferably have a lower permittivity than the insulator 614. When a material with a low permittivity is used for the interlayer film, the parasitic capacitance generated between wirings can be reduced. For each of the insulator 616, the insulator 680, the insulator 685, and the insulator 688, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The insulator 616, the insulator 680, the insulator 685, and the insulator 688 may be deposited by a CVD method or an ALD method using a compound gas containing no hydrogen atom or having a low hydrogen atom content.

A gas containing a molecule including a silicon atom is mainly used as a deposition gas for depositing the above insulating films. In order to reduce hydrogen contained in the above insulating films, the molecule including a silicon atom preferably contains as few hydrogen atoms as possible; further preferably, the molecule including a silicon atom contains no hydrogen atom. A deposition gas other than a gas containing a molecule including a silicon atom preferably includes as few hydrogen atoms as possible, further preferably includes no hydrogen atom.

In the case where the molecule containing a silicon atom is expressed as $Si_x$—$R_y$, a functional group R can be at least one of an isocyanate group (—N=C=O), a cyanate group (—O—C≡N), a cyano group (—C≡N), a diazo group (=$N_2$), an azide group (—$N_3$), a nitroso group (—NO), and a nitro group (—$NO_2$). For example, $1 \leq x \leq 3$ and $1 \leq y \leq 8$ are employed. For example, tetraisocyanatesilane, tetracyanatesilane, tetracyanosilane, hexaisocyanatesilane, or octaisocyanatesilane can be used as the molecule including a silicon atom. The examples here each show the molecule in which functional groups of the same kind are bonded to the silicon atom; however, this embodiment is not limited to these examples. Different kinds of functional groups may be bonded to the silicon atom.

A halogen (Cl, Br, I, or F) can be used for the functional group R, for example. For example, $1 \leq x \leq 2$, and $1 \leq y \leq 6$ are employed. Examples of such a molecule including a silicon atom are tetrachlorosilane ($SiCl_4$), hexachlorodisilane ($Si_2Cl_6$), and the like. Although an example of using chlorine as the functional group is described here, halogens other than chlorine, such as bromine, iodine, or fluorine, may be used as the functional group. In addition, different kinds of halogens may be bonded to the silicon atom.

The insulator 622 and the insulator 624 have a function of a gate insulator.

Here, it is preferable that the insulator 624 in contact with the oxide 630 release oxygen by heating. In this specification, oxygen that is released by heating is referred to as excess oxygen in some cases. For example, silicon oxide, silicon oxynitride, or the like is used as appropriate for the insulator 624. When an insulator containing oxygen is provided in contact with the oxide 630, oxygen vacancies in the oxide 630 can be reduced and the reliability of the transistor 600 can be improved.

As the insulator 624, specifically, an oxide material from which part of oxygen is released by heating is preferably used. An oxide from which oxygen is released by heating is an oxide film in which the number of released oxygen molecules is greater than or equal to $1.0 \times 10^{18}$ molecules/$cm^3$, preferably greater than or equal to $1.0 \times 10^{19}$ molecules/$cm^3$, further preferably greater than or equal to $2.0 \times 10^{19}$ $cm^3$, or greater than or equal to $3.0 \times 10^{20}$ molecules/$cm^3$ in thermal desorption spectroscopy analysis (TDS analysis). Note that the temperature of the film surface in the TDS analysis is preferably within the range of 100° C. to 700° C., or 100° C. to 400° C.

The insulator 622 preferably functions as a barrier insulating film that inhibits impurities such as water or hydrogen from entering the transistor 600 from the substrate side. For example, the insulator 622 preferably has lower hydrogen permeability than the insulator 624. Surrounding the insulator 624, the oxide 630, and the like by the insulator 622 and the insulator 683 can inhibit entry of impurities such as water or hydrogen into the transistor 600 from the outside.

Furthermore, it is preferable that the insulator 622 have a function of inhibiting diffusion of oxygen (e.g., at least one of an oxygen atom, an oxygen molecule, and the like) (through which the above oxygen is less likely to pass). For example, the insulator 622 preferably has lower oxygen permeability than the insulator 624. The insulator 622 preferably has a function of inhibiting diffusion of oxygen or impurities, in which case diffusion of oxygen contained in the oxide 630 into a layer under the insulator 622 can be reduced. Moreover, the conductor 605 can be inhibited from reacting with oxygen contained in the insulator 624 and the oxide 630.

As the insulator 622, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 622 is formed using such a material, the insulator 622 functions as a layer that inhibits release of oxygen from the oxide 630 and entry of impurities such as hydrogen from the periphery of the transistor 600 into the oxide 630.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

Alternatively, for example, a single layer or stacked layers of an insulator containing what is called a high-k material, such as aluminum oxide, hafnium oxide, tantalum oxide, zirconium oxide, lead zirconate titanate (PZT), strontium titanate ($SrTiO_3$), or (Ba,Sr)$TiO_3$ (BST), may be used as the insulator 622. With miniaturization and high integration of transistors, a problem such as leakage current may arise because of a thinner gate insulator. When a high-k material is used for an insulator functioning as the gate insulator, a gate potential during operation of the transistor can be lowered while the physical thickness of the gate insulator is maintained.

Note that the insulator 622 and the insulator 624 may each have a stacked-layer structure of two or more layers. In such a case, without limitation to a stacked-layer structure formed of the same material, a stacked-layer structure formed of different materials may be employed.

The oxide 643 (the oxide 643a and the oxide 643b) may be placed between the oxide 630b and the conductor 642 (the conductor 642a and the conductor 642b) which functions as the source electrode or the drain electrode. This structure in which the conductor 642 and the oxide 630 are not in contact with each other can inhibit the conductor 642 from absorbing oxygen in the oxide 630. That is, preventing oxidation of the conductor 642 can inhibit the decrease in conductivity of the conductor 642. Thus, the oxide 643 preferably has a function of inhibiting oxidation of the conductor 642.

Accordingly, the oxide 643 preferably has a function of inhibiting passage of oxygen. It is preferable to place the oxide 643 having a function of inhibiting passage of oxygen between the oxide 630b and the conductor 642, which functions as the source electrode and the drain electrode, in which case the electrical resistance between the conductor 642 and the oxide 630b is reduced. Such a structure improves the electrical characteristics of the transistor 600 and the reliability of the transistor 600.

A metal oxide containing the element M may be used as the oxide 643. In particular, aluminum, gallium, yttrium, or tin is preferably used as the element M. The concentration of the element M in the oxide 643 is preferably higher than that in the oxide 630b. Alternatively, gallium oxide may be used as the oxide 643. A metal oxide such as an In-M-Zn oxide may be used as the oxide 643. Specifically, the atomic ratio of the element M to In in the metal oxide used as the oxide 643 is preferably greater than the atomic ratio of the element M to In in the metal oxide used as the oxide 630b. The thickness of the oxide 643 is preferably greater than or equal to 0.5 nm and less than or equal to 5 nm, further preferably greater than or equal to 1 nm and less than or equal to 3 nm. The oxide 643 preferably has crystallinity. In the case where the oxide 643 has crystallinity, release of oxygen from the oxide 630 can be favorably inhibited. When the oxide 643 has a hexagonal crystal structure, for example, release of oxygen from the oxide 630 can sometimes be inhibited.

Note that the oxide 643 is not necessarily provided. In that case, contact between the conductor 642 (the conductor 642a and the conductor 642b) and the oxide 630 may make oxygen in the oxide 630 diffuse into the conductor 642, resulting in oxidation of the conductor 642. It is highly possible that oxidation of the conductor 642 lowers the conductivity of the conductor 642. Note that diffusion of oxygen in the oxide 630 into the conductor 642 can be interpreted as absorption of oxygen in the oxide 630 by the conductor 642.

When oxygen in the oxide 630 is diffused into the conductor 642 (the conductor 642a and the conductor 642b), a layer is sometimes formed between the conductor 642a and the oxide 630b, and between the conductor 642b and the oxide 630b. The layer contains more oxygen than the conductor 642 does, and thus presumably has an insulating property. In this case, a three-layer structure of the conductor 642, the layer, and the oxide 630b can be regarded as a three-layer structure of a metal, an insulator, and a semiconductor and is sometimes referred to as a MIS (Metal-Insulator-Semiconductor) structure or a diode junction structure having an MIS structure as its main part.

The above layer is not necessarily formed between the conductor 642 and the oxide 630b, but the layer may be formed between the conductor 642 and the oxide 630c, or formed between the conductor 642 and the oxide 630b and between the conductor 642 and the oxide 630c, for example.

The conductor 642 (the conductor 642a and the conductor 642b) functioning as the source electrode and the drain electrode is provided over the oxide 643. The thickness of the conductor 642 is greater than or equal to 1 nm and less than or equal to 50 nm, preferably greater than or equal to 2 nm and less than or equal to 25 nm, for example.

For the conductor 642, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten nitride, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

The insulator 672 is provided in contact with a top surface of the conductor 642 and preferably functions as a barrier insulating film. The insulator 673 functioning as a barrier insulating film is preferably provided over the insulator 672. With such a structure, absorption of excess oxygen contained in the insulator 680 by the conductor 642 can be inhibited. Furthermore, by inhibiting oxidation of the conductor 642, an increase in the contact resistance between the transistor 600 and a wiring can be inhibited. Consequently, the transistor 600 can have favorable electrical characteristics and reliability.

Thus, the insulator 672 and the insulator 673 preferably have a function of inhibiting diffusion of oxygen. For example, the insulator 672 preferably has a function of further inhibiting diffusion of oxygen as compared to the insulator 680. An insulator containing an oxide of one or both of aluminum and hafnium is preferably deposited as the insulator 672, for example. As the insulator 673, for example, silicon nitride or silicon nitride oxide is used.

Impurities such as water or hydrogen can be inhibited from being diffused to the transistor 600 side from the insulator 680 and the like, which are provided with the insulator 672 and the insulator 673 therebetween. In this manner, the transistor 600 is preferably surrounded by the insulator 672 and the insulator 673 having a function of inhibiting diffusion of oxygen and impurities such as water or hydrogen.

The insulator 650 functions as a gate insulator. The insulator 650 is preferably placed in contact with the top surface of the oxide 630c. For the insulator 650, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

Like the insulator 624, the insulator 650 is preferably formed using an insulator from which oxygen is released by heating. When an insulator from which oxygen is released by heating is provided as the insulator 650 in contact with the top surface of the oxide 630c, oxygen can be efficiently supplied to the channel formation region of the oxide 630b. Furthermore, as in the insulator 624, the concentration of impurities such as water or hydrogen in the insulator 650 is preferably reduced. The thickness of the insulator 650 is preferably greater than or equal to 1 nm and less than or equal to 20 nm.

Furthermore, a metal oxide may be provided between the insulator 650 and the conductor 660. The metal oxide preferably inhibits diffusion of oxygen from the insulator 650 into the conductor 660. Providing the metal oxide that inhibits diffusion of oxygen inhibits diffusion of oxygen from the insulator 650 into the conductor 660. That is, a reduction in the amount of oxygen supplied to the oxide 630 can be inhibited. In addition, oxidation of the conductor 660 due to oxygen from the insulator 650 can be inhibited.

The metal oxide has a function of part of the gate insulator in some cases. Therefore, when silicon oxide, silicon oxynitride, or the like is used for the insulator 650, a metal oxide that is a high-k material with a high relative permittivity is preferably used as the metal oxide. When the gate insulator has a stacked-layer structure of the insulator 650 and the metal oxide, the stacked-layer structure can be thermally stable and have a high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, it is possible to use a metal oxide containing one kind or two or more kinds selected from hafnium, aluminum, gallium, yttrium, zirconium, tungsten, titanium, tantalum, nickel, germanium, magnesium, and the like. It is particularly preferable to use an insulator containing an oxide of one or both of aluminum and hafnium, such as aluminum oxide, hafnium oxide, or an oxide containing aluminum and hafnium (hafnium aluminate).

Alternatively, the metal oxide has a function of part of the gate in some cases. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate, a conductive material containing oxygen and a metal element contained in a metal oxide where the channel is formed. Alternatively, a conductive material containing the above metal element and nitrogen may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With use of such a material, hydrogen contained in the metal oxide where the channel is formed can be trapped in some cases. Alternatively, hydrogen entering from an external insulator or the like can be trapped in some cases.

The bottom surface and a side surface of the conductor 660 are in contact with the insulator 650. Although the conductor 660 has a two-layer structure in FIG. 22, the conductor 660 may have a single-layer structure or a stacked-layer structure of three or more layers.

For the conductor 660a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, and the like), and a copper atom. Alternatively, it is preferable to use a conductive material having a function of inhibiting diffusion of oxygen (e.g., at least one of an oxygen atom, an oxygen molecule, and the like).

In addition, when the conductor 660a has a function of inhibiting diffusion of oxygen, the conductivity of the conductor 660b can be inhibited from being lowered because of oxidation due to oxygen contained in the insulator 650. As a conductive material having a function of inhibiting diffusion of oxygen, for example, tantalum, tantalum nitride, ruthenium, ruthenium oxide, or the like is preferably used.

For the conductor 660b, a conductive material containing tungsten, copper, or aluminum as its main component is preferably used. The conductor 660 also functions as a wiring and thus is a conductor with high conductivity is preferably used. For example, a conductive material containing tungsten, copper, or aluminum as its main component can be used. Moreover, the conductor 660b may have a stacked-layer structure, for example, a stacked-layer structure of the above conductive material and titanium or titanium nitride.

For the insulator 680, for example, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably used. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable. The insulator 680 may have a stacked-layer structure of the above materials, for example, a structure in which silicon oxynitride deposited by a CVD method is stacked over silicon oxide deposited by a sputtering method. Furthermore, silicon nitride may be stacked thereover.

Here, the insulator 680 preferably contains excess oxygen. For example, silicon oxide, silicon oxynitride, or the like is used as appropriate for the insulator 680. When the insulator 680 containing excess oxygen is provided in contact with the oxide 630, oxygen vacancies in the oxide 630 can be reduced and the reliability of the transistor 600 can be improved. In order that the insulator 680 contains excess oxygen, deposition of the insulator 682 is performed by a sputtering method in an oxygen-containing atmosphere, for example. The insulator 682 is deposited by a sputtering method in an oxygen-containing atmosphere, whereby oxygen can be added to the insulator 680 during the deposition.

The concentration of impurities such as water or hydrogen in the insulator 680 is preferably reduced. In addition, the top surface of the insulator 680 may be planarized.

The insulator 682 preferably functions as a barrier insulating film that inhibits impurities such as water or hydrogen from entering the insulator 680 from the above. The insulator 682 preferably functions as a barrier insulating film that inhibits passage of oxygen. As the insulator 682, an insulator such as aluminum oxide, silicon nitride, or silicon nitride oxide is used, for example. For example, as the insulator 682, aluminum oxide having a high barrier property against oxygen is used.

As illustrated in FIG. 22(B), the insulator 682 is directly in contact with the oxide 630c. Owing to this structure, diffusion of oxygen contained in the insulator 680 into the conductor 660 can be inhibited. Therefore, oxygen contained in the insulator 680 can be supplied to the oxide 630a and the oxide 630b efficiently through the oxide 630c; hence, oxygen vacancies in the oxide 630a and the oxide 630b can be reduced and the electrical characteristics and the reliability of the transistor 600 can be improved.

The insulator 685 functioning as an interlayer film is preferably provided over the insulator 682. As in the insulator 624 and the like, the concentration of impurities such as water or hydrogen in the insulator 685 is preferably reduced.

For the conductor 640, a conductive material containing tungsten, copper, or aluminum as its main component is preferably used. In addition, the conductor 640 may have a stacked-layer structure. Note that the conductor 640 has a circular shape in the top view in FIG. 22(A); however, the shape of the conductor is not limited thereto. For example, in the top view, the conductor 640 may have an almost circular shape such as an elliptical shape, a polygonal shape such as a quadrangular shape, or a polygonal shape such as a quadrangular shape with rounded corners.

In the case where the conductor 640 has a stacked-layer structure, a conductive material having a function of inhibiting passage of oxygen and impurities such as water or hydrogen is preferably used. For example, tantalum, tantalum nitride, titanium, titanium nitride, ruthenium, ruthenium oxide, or the like is preferably used. A single layer or stacked layers of the conductive material having a function of inhibiting passage of oxygen and impurities such as water or hydrogen may be used. With the use of the conductive material, entry of impurities diffused from the insulator 680 and the like, such as water or hydrogen, into the oxide 630 through the conductor 640 can be further reduced. In addition, oxygen added to the insulator 680 can be prevented from being absorbed by the conductor 640.

In addition, the conductor 646a is placed to be in contact with a top surface of the conductor 640a and a top surface of the conductor 640c, and the conductor 646b is placed to be in contact with a top surface of the conductor 640b. For the conductor 646a and the conductor 646b, a conductive material containing tungsten, copper, or aluminum as its main component is preferably used. The conductor 646a and the conductor 646b may each have a stacked-layer structure, for example, may be stacked layers of titanium or titanium nitride and the above conductive material. Note that the conductor may be formed to be embedded in an opening provided in an insulator.

The insulator 686 is provided to cover the insulator 685, the conductor 646a, and the conductor 646b. The insulator 686 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide.

For example, for the insulator 686, a stacked-layer structure using a material with high dielectric strength such as silicon oxynitride and a high permittivity (high-k) material may be employed. In the capacitor 655 having such a structure, a sufficient capacitance can be ensured owing to the high permittivity (high-k) insulator, and the dielectric strength can be increased owing to the insulator with high dielectric strength, so that the electrostatic breakdown of the capacitor 655 can be inhibited.

As the insulator of a high permittivity (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

Alternatively, for example, a single layer or stacked layers of an insulator containing a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST), may be used as the insulator 686. In the case where the insulator 686 has a stacked-layer structure, a three-layer structure in which zirconium oxide, aluminum oxide, and zirconium oxide are formed in this order, or a four-layer structure in which zirconium oxide, aluminum oxide, zirconium oxide, and aluminum oxide are formed in this order is employed, for example. For the insulator 686, a compound containing hafnium and zirconium may be used. When the semiconductor device is minimized and highly integrated, a gate insulator and a dielectric used for a capacitor become thin, which causes a problem of, for example, leakage current from a transistor and a capacitor in some cases. When a high-k material is used as an insulator functioning as the gate insulator and the dielectric used for the capacitor, a gate potential during operation of the transistor can be lowered and the capacitance of the capacitor can be ensured while the physical thicknesses of the gate insulator and the dielectric are maintained.

As the material having a high dielectric strength (a material having a low relative permittivity), silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

The conductor 656 is placed to overlap with at least part of the conductor 646a with the insulator 686 therebetween. For the conductor 656, a conductor that can be used as the conductor 646 is used.

The insulator 688 functioning as an interlayer film is preferably provided over the insulator 686 and the conductor 646b. As in the insulator 624 and the like, the concentration of impurities such as water or hydrogen in the insulator 688 is preferably reduced.

<<Modification Example of Memory Cell>>

Figure 23A:
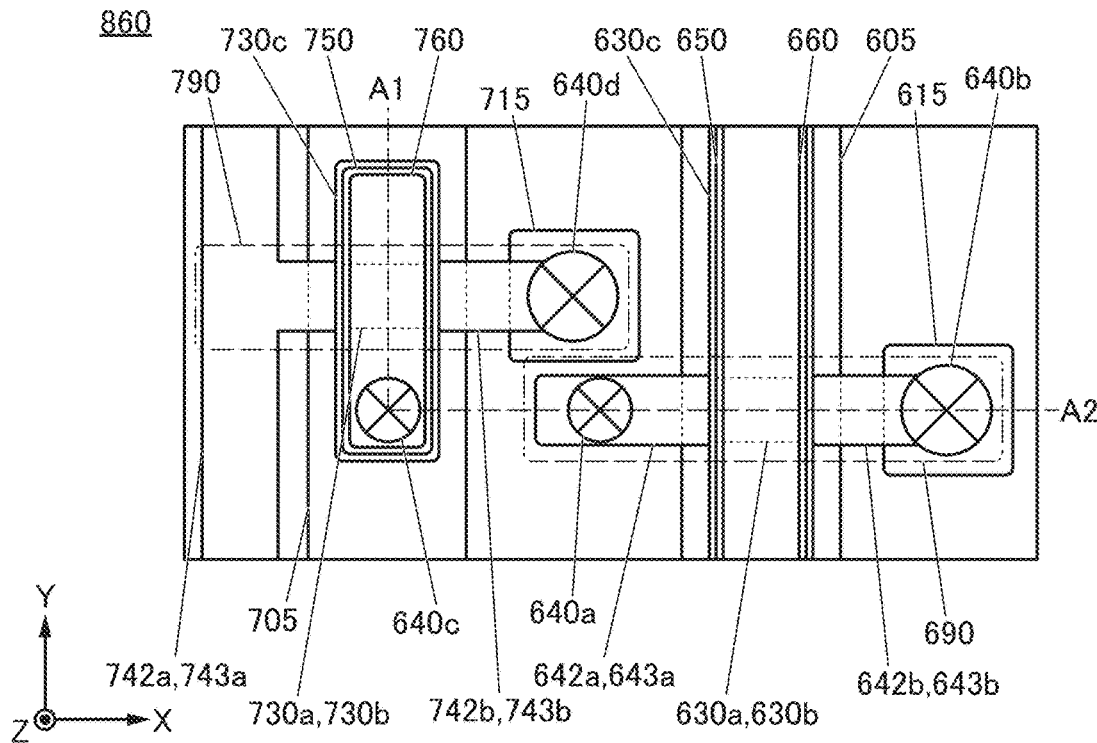
FIG. 23(A) and FIG. 23(B) are a top view and a cross-sectional view of a memory device of one embodiment of the present invention.
Figure 23B:
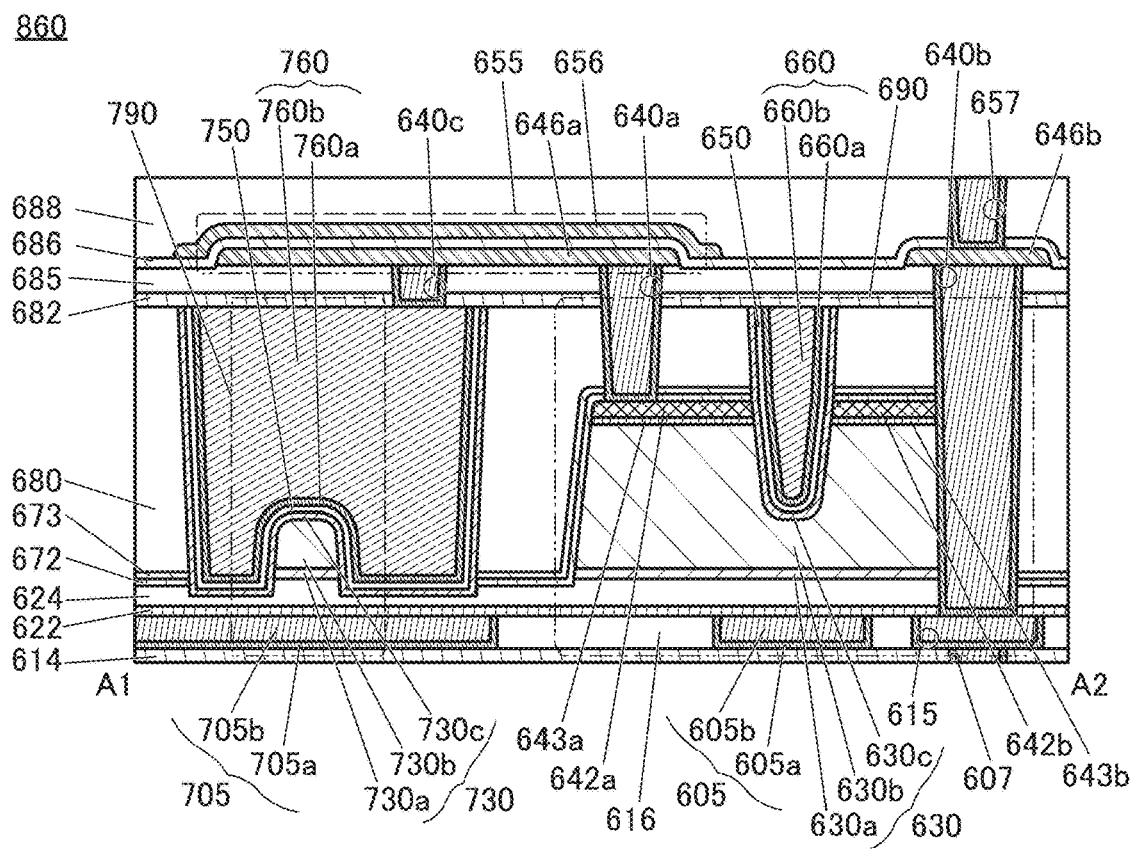

A modification example of the memory cell will be described below with reference to FIG. 23. FIG. 23(A) is a top view of the memory cell 860 and its periphery. FIG. 23(B) is a cross-sectional view of the memory cell 860, and FIG. 23(B) corresponds to a portion indicated by a dashed-dotted line A1-A2 in FIG. 23(A). FIG. 23(B) illustrates a cross section of a transistor 600 in the channel length direction and a cross section of a transistor 700 in the channel width direction. Note that for clarity of the drawing, some components are omitted in the top view in FIG. 23(A). Note that the X direction, the Y direction, and the Z direction illustrated in FIG. 23(A) are directions orthogonal to or intersecting with each other. Here, it is preferable that the X direction and the Y direction be parallel or substantially parallel to a substrate surface and the Z direction be perpendicular or substantially perpendicular to the substrate surface.

The memory cell 860 illustrated in FIGS. 23(A) and 23(B) is different from the memory cell 860 illustrated in FIGS. 22(A) and 22(B) in that a transistor 690 and a transistor 790 are used instead of the transistor 600 and the transistor 700. Here, the transistor 790 and the transistor 690 are formed in the same layer and have similar structures. Hereinafter, the description of the components of the transistor 690 can be referred to for the components of the transistor 790.

The transistor 690 is different from the transistor 600 in that the oxide 630c is formed in a U-shape along an opening portion formed in the insulator 680, the insulator 672, the insulator 673, the conductors 642 (the conductor 642a and the conductor 642b), and the oxide 630b.

For example, in the case where the channel length of the transistor is reduced (typically greater than or equal to 5 nm and less than 60 nm, preferably greater than or equal to 10 nm and less than or equal to 30 nm), the above-described structure of the transistor 600 can make the effective L length longer. For example, in the case where the distance between the conductor 642a and the conductor 642b is 20 nm, the effective L length can be greater than or equal to 40 nm and less than or equal to 60 nm, i.e., approximately two to three times the distance between the conductor 642a and the conductor 642b or the minimum feature size. Thus, the memory cell 860 illustrated in FIGS. 23(A) and 23(B) has a structure including the transistor 690, the transistor 790, and the capacitor 655, which are excellent in miniaturization.

<<Metal Oxide>>

As the oxide 630, a metal oxide functioning as an oxide semiconductor is preferably used. A metal oxide that can be used as the oxide 630 of the present invention is described below.

The metal oxide preferably contains at least indium or zinc. In particular, indium and zinc are preferably contained. Moreover, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, the element M, and zinc is considered. Note that the element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also referred to as a metal oxide in some cases. A metal oxide containing nitrogen may be referred to as a metal oxynitride.

[Composition of Metal Oxide]

Here, a CAC-OS (Cloud-Aligned Composite Oxide Semiconductor) or a CAC-metal oxide is described as a composition example of a metal oxide.

The CAC-OS or the CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used for a channel formation region of a transistor, the transistor in the on state can achieve high current driving capability, that is, a high on-state current and high field-effect mobility.

In other words, the CAC-OS or the CAC-metal oxide can also be referred to as a matrix composite or a metal matrix composite.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

Oxide semiconductors might be classified in a manner different from the above-described one when classified in terms of the crystal structure. Here, the classification of the crystal structures of an oxide semiconductor will be explained with FIG. 28(A). FIG. 28(A) is a diagram showing the classification of the crystal structures of an oxide semiconductor, typically IGZO (a metal oxide containing In, Ga, and Zn).

As shown in FIG. 28(A), IGZO is roughly classified into Amorphous, Crystalline, and Crystal. Amorphous includes completely amorphous structure. In addition, Crystalline includes CAAC, nc, and CAC. Crystal includes single crystal and poly crystal.

Note that the structure shown in the thick frame in FIG. 28(A) is a structure that belongs to new crystalline phase. This structure is positioned in a boundary region between Amorphous and Crystal. In other words, Amorphous, which is energetically unstable, and Crystalline are completely different structures.

A crystal structure of a film or a substrate can be analyzed with X-ray diffraction (XRD) images. Here, XRD spectra of quartz glass and IGZO, which has a crystal structure classified into crystalline (also referred to as crystalline IGZO), are shown in FIGS. 28(B) and 28(C). In FIG. 28(B) and FIG. 28(C), the horizontal axis represents 2θ [deg.], and the vertical axis represents intensity [a.u.]. FIG. 28(B) shows an XRD spectrum of quartz glass and FIG. 28(C) shows an XRD spectrum of crystalline IGZO. Note that the crystalline IGZO shown in FIG. 28(C) has a composition of In:Ga:Zn=4:2:3 [atomic ratio]. Furthermore, the crystalline IGZO shown in FIG. 28(C) has a thickness of 500 nm.

As indicated by arrows in FIG. 28(B), the XRD spectrum of the quartz glass shows a substantially symmetrical peak. In contrast, as indicated by arrows in FIG. 28(C), the XRD spectrum of the crystalline IGZO shows an asymmetrical peak. The asymmetrical peak of the XRD spectrum clearly shows the existence of a crystal. In other words, the structure cannot be regarded as Amorphous unless it has a bilaterally symmetrical peak in the XRD spectrum.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

A crystal structure in which a clear crystal grain boundary (grain boundary) is observed is what is called a polycrystal. It is highly probable that the crystal grain boundary becomes a recombination center and traps carriers and thus decreases the on-state current or field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary is difficult to observe in the CAAC-OS; thus, it can be said that a reduction in electron mobility due to the crystal grain boundary is less likely to occur. Entry of impurities, formation of defects, or the like might decrease the crystallinity of a metal oxide, which means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that an In—Ga—Zn oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure may be obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) has various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurities]

Here, the influence of each impurity in the metal oxide will be described.

Entry of the impurities into the oxide semiconductor forms defect states or oxygen vacancies in some cases. Thus, when impurities enter a channel formation region of the oxide semiconductor, the electrical characteristics of a transistor using the oxide semiconductor are likely to vary and its reliability is degraded in some cases. Moreover, when the channel formation region includes oxygen vacancies, the transistor tends to have normally-on characteristics.

The above-described defect states may include a trap state. Charges trapped by the trap states in the metal oxide take a long time to disappear and may behave like fixed charges. Thus, a transistor whose channel formation region includes a metal oxide having a high density of trap states has unstable electrical characteristics in some cases.

If the impurities exist in the channel formation region of the oxide semiconductor, the crystallinity of the channel formation region may decrease, and the crystallinity of an oxide provided in contact with the channel formation region may decrease. Low crystallinity of the channel formation region tends to result in deterioration in stability or reliability of the transistor. Moreover, if the crystallinity of the oxide provided in contact with the channel formation region is low, an interface state may be formed and the stability or reliability of the transistor may deteriorate.

Therefore, the reduction in concentration of impurities in and around the channel formation region of the oxide semiconductor is effective in improving the stability or reliability of the transistor. Examples of impurities include hydrogen, nitrogen, an alkali metal, an alkaline earth metal, iron, nickel, and silicon.

Specifically, the concentration of the above impurities obtained by SIMS is lower than or equal to $1 \times 10^{18}$ atoms/cm$^3$, preferably lower than or equal to $2 \times 10^{16}$ atoms/cm$^3$ in and around the channel formation region of the oxide semiconductor. Alternatively, the concentration of the above impurities obtained by element analysis using EDX is lower than or equal to 1.0 atomic % in and around the channel formation region of the oxide semiconductor. When an oxide containing the element M is used as the oxide semiconductor, the concentration ratio of the impurities to the element M is lower than 0.10, preferably lower than 0.05 in and around the channel formation region of the oxide semiconductor. Here, the concentration of the element M used in the calculation of the concentration ratio may be a concentration in a region whose concertation of the impurities is calculated or may be a concentration in the oxide semiconductor.

A metal oxide with a low impurity concentration has a low density of defect states and thus has a low density of trap states in some cases.

In the case where hydrogen enters an oxygen vacancy in the metal oxide, the oxygen vacancy and the hydrogen are bonded to each other to form VoH in some cases. The VoH serves as a donor and an electron serving as a carrier is generated in some cases. In other cases, bonding of part of hydrogen to oxygen bonded to a metal atom generates electrons serving as carriers.

Thus, a transistor including an oxide semiconductor which contains a large amount of hydrogen is likely to be normally on. Moreover, hydrogen in an oxide semiconductor is easily transferred by a stress such as heat or an electric field; thus, a large amount of hydrogen in an oxide semiconductor might reduce the reliability of a transistor.

Accordingly, the amount of VoH in the metal oxide is preferably reduced as much as possible so that the metal oxide becomes a highly purified intrinsic or substantially highly purified intrinsic metal oxide. In order to obtain such an oxide semiconductor with sufficiently reduced VoH, it is important to remove impurities such as moisture and hydrogen in the oxide semiconductor (this treatment is sometimes referred to as dehydration or dehydrogenation treatment) and supply oxygen to the oxide semiconductor to fill oxygen vacancies (this treatment is sometimes referred to as oxygen adding treatment). When an oxide semiconductor with sufficiently reduced impurities such as VoH is used for a channel formation region of a transistor, stable electrical characteristics can be given.

An oxide semiconductor with a low carrier concentration is preferably used for a transistor. In the case where the carrier concentration of the oxide semiconductor is lowered, the impurity concentration in the oxide semiconductor is lowered to decrease the density of defect states. In this specification and the like, a state with a low impurity concentration and a low density of defect states is referred to as a highly purified intrinsic or substantially highly purified intrinsic state. Examples of the impurities in the oxide semiconductor include hydrogen, nitrogen, alkali metal, alkaline earth metal, iron, nickel, and silicon.

In particular, hydrogen contained in an oxide semiconductor reacts with oxygen bonded to a metal atom to be water, and thus sometimes forms an oxygen vacancy in the oxide semiconductor. If the channel formation region in the oxide semiconductor includes an oxygen vacancy, the transistor sometimes has normally-on characteristics. In some cases, a defect where hydrogen enters an oxygen vacancy functions as a donor and generates an electron serving as a carrier. In other cases, bonding of part of hydrogen to oxygen bonded to a metal atom generates electrons serving as carriers. Thus, a transistor including an oxide semiconductor which contains a large amount of hydrogen is likely to be normally on.

A defect where hydrogen enters an oxygen vacancy (VoH) can serve as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration in the oxide semiconductor that is obtained by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When an oxide semiconductor with sufficiently reduced impurities such as hydrogen is used for a channel formation region of a transistor, stable electrical characteristics can be given.

The carrier concentration of the oxide semiconductor in the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet still further preferably lower than $1 \times 10^{13}$ cm$^{-3}$, yet still further preferably lower than $1 \times 10^{12}$ cm$^{-3}$. Note that the lower limit of the carrier concentration of the oxide semiconductor in the channel formation region is not particularly limited and can be, for example, $1 \times 10^{-9}$ cm$^{-3}$.

According to one embodiment of the present invention, a semiconductor device with high reliability can be provided. According to another embodiment of the present invention, a semiconductor device having favorable electrical characteristics can be provided. According to another embodiment of the present invention, a semiconductor device with a high on-state current can be provided. According to another embodiment of the present invention, a semiconductor device that can be miniaturized or highly integrated can be provided. Another object of one embodiment of the present invention is to provide a semiconductor device with low power consumption.

<<Other Semiconductor Materials>>

Note that a semiconductor material that can be used for the oxide 630 is not limited to the above metal oxides. A semiconductor material which has a band gap (a semiconductor material that is not a zero-gap semiconductor) may be used for the oxide 630. For example, a single element semiconductor such as silicon, a compound semiconductor such as gallium arsenide, or a layered material functioning as a semiconductor (also referred to as an atomic layered material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 630, a transition metal chalcogenide functioning as a semiconductor is preferably used, for example. Specific examples of the transition metal chalcogenide which can be used for the oxide 630 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), zirconium selenide (typically $ZrSe_2$).

<Structure Example of Memory Cell Arrangement>

Figure 24:
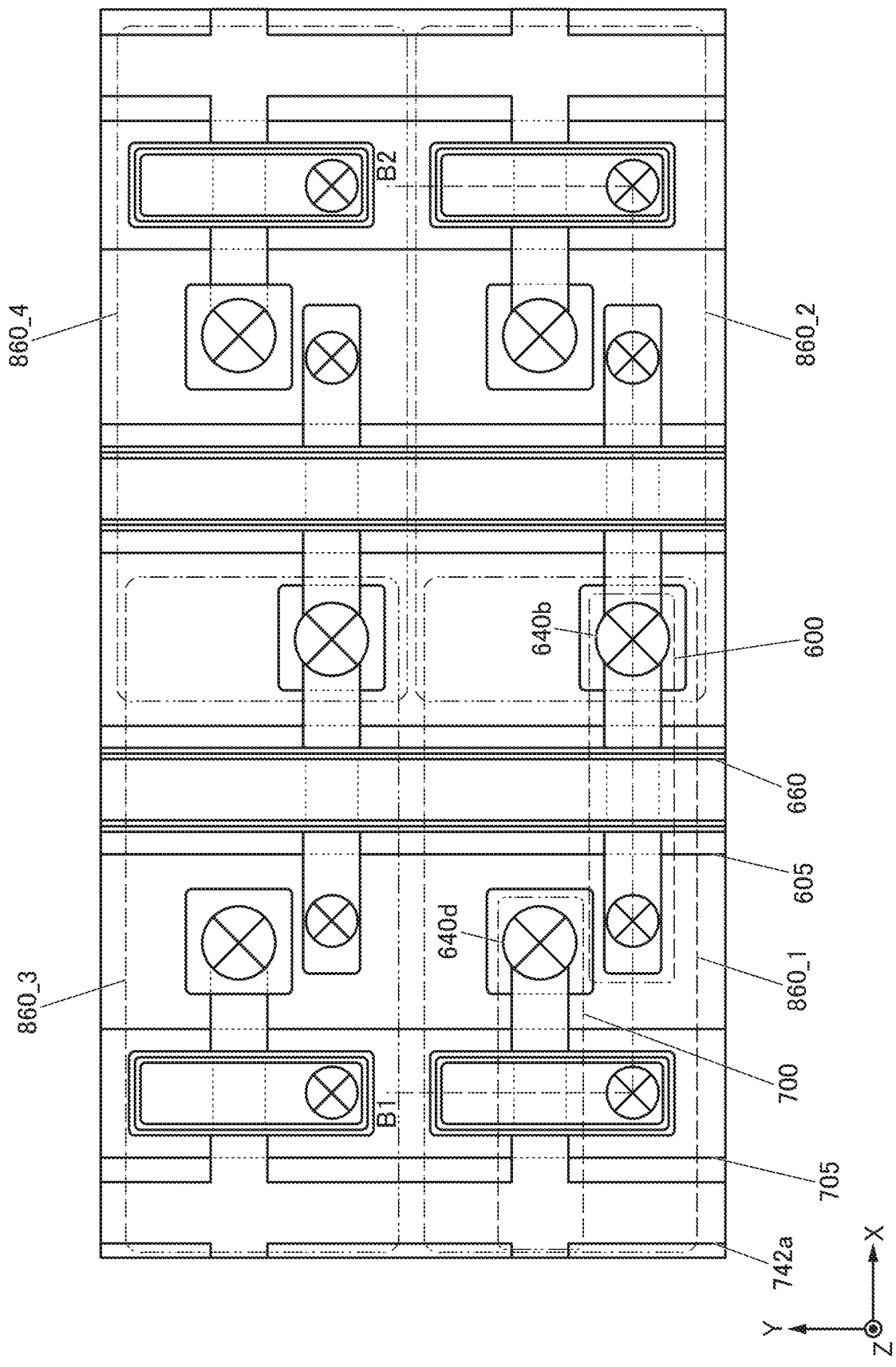
FIG. 24 is a top view a memory device of one embodiment of the present invention.
Figure 25:
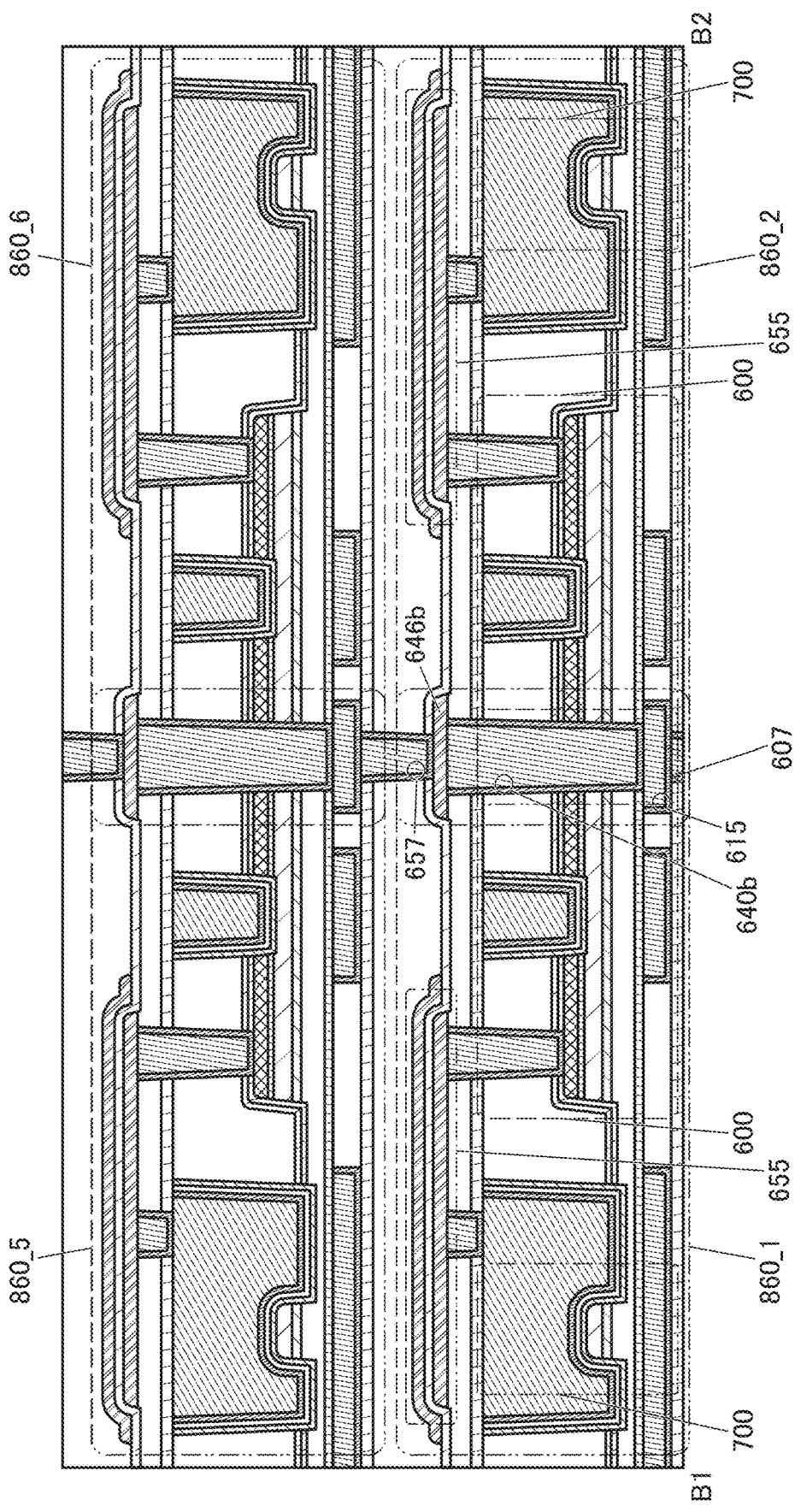
FIG. 25 is a cross-sectional view of a memory device of one embodiment of the present invention.

Next, an arrangement example of the memory cells 860 will be described with reference to FIG. 24 and FIG. 25. FIG. 24 and FIG. 25 illustrate a memory cell block in which 2×2×2 memory cells 860 described above are arranged. FIG. 24 is a top view of the memory cell block. FIG. 25 is a cross-sectional view of the memory cell block, and FIG. 25 corresponds to a portion indicated by a dashed-dotted line B1-B2 in FIG. 24. FIG. 25 illustrates a cross section of a transistor 600 in the channel length direction and a cross section of a transistor 700 in the channel width direction. Note that for clarity of the drawing, some components are omitted in the top view in FIG. 24. Note that the X direction, the Y direction, and the Z direction illustrated in FIG. 24 are directions orthogonal to or intersecting with each other. Here, it is preferable that the X direction and the Y direction be parallel or substantially parallel to a substrate surface and the Z direction be perpendicular or substantially perpendicular to the substrate surface.

In the memory cell block illustrated in FIG. 24 and FIG. 25, a memory cell 860_2 is placed adjacent to a memory cell 860_1 in the X direction. A memory cell 860_3 and a memory cell 860_4 are placed adjacent to the memory cell 860_1 and the memory cell 860_2, respectively, in the Y direction. A memory cell 860_5 and a memory cell 860_6 are placed adjacent to the memory cell 860_1 and the memory cell 860_2, respectively, in the Z direction.

As illustrated in FIG. 24 and FIG. 25, the components of the memory cell 860_1 and the components of the memory cell 860_2 can be placed axisymmetrically. Here, side surfaces of the conductor 640b are preferably in contact with the conductor 642b of the memory cell 860_1 and the conductor 642b of the memory cell 860_2. That is, it is preferable that the conductor 607, the conductor 615, the conductor 640b, the conductor 646b, and the conductor 657 that function as the bit line WBL be electrically connected to one of the source and the drain of the transistor 600 of the memory cell 860_1 and one of the source and the drain of the transistor 600 of the memory cell 860_2. When the memory cell 860_1 and the memory cell 860_2 are connected to the same wiring in such a manner, the area occupied by the memory cell can be further reduced.

As illustrated in FIG. 25, the conductor 607, the conductor 615, the conductor 640b, the conductor 646b, and the conductor 657 that function as the bit line WBL are electrically connected also to the transistors 600 of the memory cell 860_5 and the memory cell 860_6 placed in the upper layer. Note that as illustrated in FIG. 25, the conductors 657 of the memory cell 860_1 and the memory cell 860_2 correspond to the conductors 607 of the memory cell 860_5 and the memory cell 860_6. In this manner, the bit line WBL can extend in the Z direction. Although not illustrated in the cross-sectional view, the bit line RBL including the conductor 640d and the like can also extend in the Z direction.

As illustrated in FIG. 24, the conductor 660 of the memory cell 860_1 is provided to extend to the memory cell 860_3. In this manner, the word line WWL can extend in the Y direction. As illustrated in FIG. 24, the conductor 742a of the memory cell 860_1 is provided to extend to the memory cell 860_3. In this manner, the selection line SL can extend in the Y direction. Note that the selection line SL may be shared by the memory cell 860_1 and the memory cell 860 adjacent in the X direction. As illustrated in FIG. 24, the conductor 605 of the memory cell 860_1 is provided to extend to the memory cell 860_3. In this manner, the wiring BGL1 can extend in the Y direction. As illustrated in FIG. 24, the conductor 705 of the memory cell 860_1 is provided to extend to the memory cell 860_3. In this manner, the wiring BGL1 can extend in the Y direction.

Although FIG. 24 illustrates the structure in which the oxide 630c extends overlapping with the conductor 660, the memory device described in this embodiment is not limited thereto. For example, a structure may be employed in which the oxide 630c is patterned for each memory cell 860 and the oxide 630c is separately provided for each transistor 600. In the case where the oxide 630c has a stacked-layer structure of two layers, for example, a structure may be employed in which one of the upper layer and the lower layer of the oxide 630c may be separately provided for each transistor 600.

<Structure Example of Memory Device>

Figure 26:
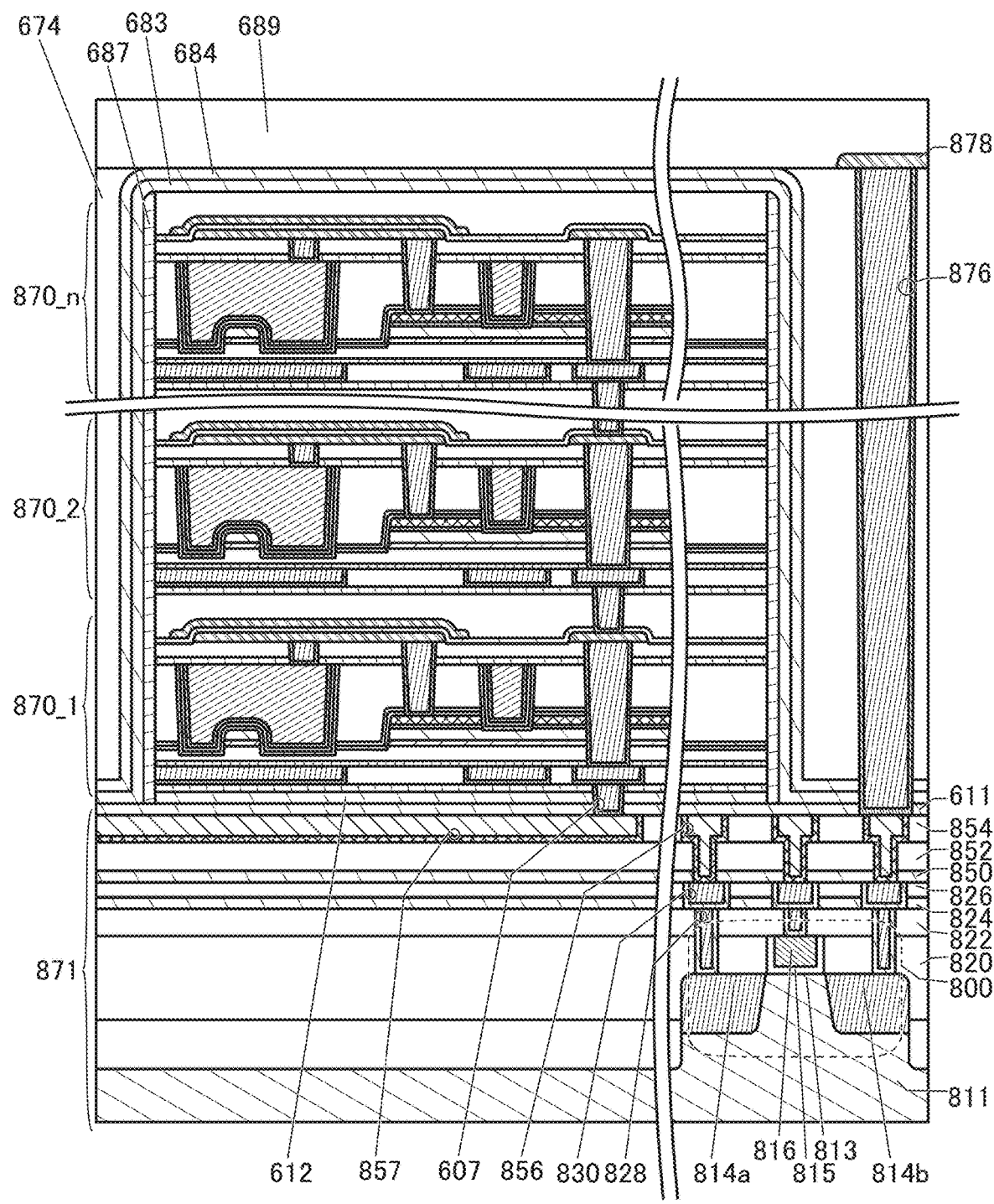
FIG. 26 is a cross-sectional view of a memory device of one embodiment of the present invention.

Next, an example of a memory device in which the above-described memory cells 860 are stacked is described with reference to FIG. 26. FIG. 26 is a cross-sectional view of a memory device in which a plurality of memory cell layers 870 including the memory cells 860 are stacked over a silicon layer 871. The memory device illustrated in FIG. 26 corresponds to the memory device 100 illustrated in FIG. 1 and the like, the silicon layer 871 corresponds to the driver circuit layer 110, and the memory cell layer 870 corresponds to the memory layer 120.

First, the silicon layer 871 is described. A plurality of transistors 800 are provided in the silicon layer 871, and form the peripheral circuit 115, the RW circuit 129, and the like illustrated in FIG. 2.

The transistor 800 is provided over a substrate 811 and includes a conductor 816 functioning as a gate, an insulator 815 functioning as a gate insulator, a semiconductor region 813 formed of part of the substrate 811, and a low-resistance region 814a and a low-resistance region 814b functioning as a source region and a drain region. The transistor 800 may be a p-channel transistor or an n-channel transistor.

Here, in the transistor 800 illustrated in FIG. 26, the semiconductor region 813 (part of the substrate 811) where a channel is formed has a convex shape. Furthermore, the conductor 816 is provided to cover a side surface and a top surface of the semiconductor region 813 with the insulator 815 therebetween. Note that a material adjusting the work function may be used for the conductor 816. Such a transistor 800 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Note that the transistor 800 illustrated in FIG. 26 is an example and the structure is not limited thereto; an appropriate transistor is used in accordance with a circuit structure or a driving method.

Wiring layers provided with an interlayer film, a wiring, a plug, and the like may be provided between the structure bodies. A plurality of wiring layers can be provided in accordance with the design. Here, a plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

For example, an insulator 820, an insulator 822, an insulator 824, and the insulator 826 are stacked over the transistor 800 in this order as interlayer films. A conductor 828, a conductor 830, and the like, which function as a plug or a wiring, are embedded in the insulator 820, the insulator 822, the insulator 824, and the insulator 826.

The insulator functioning as an interlayer film may function as a planarization film that covers an uneven shape thereunder. For example, a top surface of the insulator 822 may be planarized by planarization treatment using a chemical mechanical polishing (CMP) method or the like to improve planarity.

A wiring layer may be provided over the insulator 826 and the conductor 830. For example, in FIG. 26, an insulator 850, an insulator 852, and an insulator 854 are stacked in this order. Furthermore, a conductor 856 is formed in the insulator 850, the insulator 852, and the insulator 854. The conductor 856 functions as a plug or a wiring.

As an insulator that can be used as an interlayer film, an insulating oxide, an insulating nitride, an insulating oxynitride, an insulating nitride oxide, an insulating metal oxide, an insulating metal oxynitride, an insulating metal nitride oxide, or the like is given.

For example, when a material having a low relative permittivity is used for the insulator functioning as an interlayer film, the parasitic capacitance generated between wirings can be reduced. Accordingly, a material is preferably selected depending on the function of an insulator.

For example, for the insulator 820, the insulator 822, the insulator 826, the insulator 852, the insulator 854, and the like, an insulator having a low relative permittivity is preferably used. For example, the insulator preferably includes silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

When a transistor using an oxide semiconductor is surrounded by insulators having a function of inhibiting passage of oxygen and impurities such as hydrogen, the electrical characteristics of the transistor can be stable. Thus, an insulator having a function of inhibiting passage of oxygen and impurities such as hydrogen is used for the insulator 824, the insulator 850, or the like.

As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride can be used.

As the conductors that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor with high electrical conductivity, typified by polycrystalline silicon containing an impurity element such as phosphorus, or silicide such as nickel silicide may be used.

For example, for the conductor 828, the conductor 830, the conductor 856, and the like, a single layer or stacked layers of a conductive material such as a metal material, an alloy material, a metal nitride material, or a metal oxide material that is formed using the above material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

An insulator 611 and an insulator 612 are placed over the silicon layer 871, and a memory cell layer 870_1 to a memory cell layer 870_n (n is a natural number greater than or equal to 2) are stacked over the insulator 611 and the insulator 612. Although not particularly limited, n described above is greater than or equal to 2 and less than or equal to 200, preferably greater than or equal to 2 and less than or equal to 100, further preferably greater than or equal to 2 and less than or equal to 10. For example, $1 \leq n \leq 10$, preferably $1 \leq n \leq 50$, further preferably $1 \leq n \leq 100$.

In each of the memory cell layers 870, the memory cells 860 and a variety of wirings are arranged in a matrix as in FIG. 24. The memory cell layers 870 adjacent in the stacking direction are electrically connected to each other through the wirings such as the bit lines WBL or the bit lines RBL as illustrated in FIG. 25.

As illustrated in FIG. 26, the conductor 607 is placed to be embedded in the insulator 611 and the insulator 612 in the undermost memory cell layer 870_1. The conductor 607 is in contact with a conductor 857 provided in the same layer as the conductor 856. In this manner, the bit line WBL connected to the memory cell 860 is connected to the RW circuit 129 through the conductor 857.

A structure is preferable in which the memory cell layer 870_1 to the memory cell layer 870_n are sealed with the insulator 611, the insulator 612, an insulator 687, the insulator 683, and an insulator 684. Here, the insulator 611 is placed over the silicon layer 871, and the insulator 612 is placed over the insulator 611. The memory cell layer 870_1 to the memory cell layer 870_n are placed over the insulator 612, and the insulator 612 is formed in the same pattern as those of the memory cell layer 870_1 to the memory cell layer 870_n in a top view. The insulator 687 is placed in contact with a top surface of the insulator 611, a side surface of the insulator 612, and side surfaces of the memory cell layer 870_1 to the memory cell layer 870_n. That is, the insulator 687 is formed in a sidewall shape along the memory cell layer 870_1 to the memory cell layer 870_n. The insulator 683 is placed to cover the insulator 611, the insulator 687, and the memory cell layer 870_1 to the memory cell layer 870_n. In addition, the insulator 684 is placed to cover the insulator 683.

For the insulator 611, the insulator 612, the insulator 687, the insulator 683, and the insulator 684, a barrier material is preferably used in a similar manner to that of the insulator 682 and the like.

Here, each of the memory cell layers 870 is sealed with the insulator 614, the insulator 687, and the insulator 682. The same material is preferably used for the insulator 614, the insulator 687, and the insulator 682. The insulator 614, the insulator 687, and the insulator 682 are preferably deposited by a deposition method using the same conditions. When the insulator 614, the insulator 687, and the insulator 682 having the same film property are in contact with each other, a sealing structure with high hermeticity can be formed.

In addition, a material having a function of trapping and fixing hydrogen is preferably used for the insulator 614, the insulator 687, and the insulator 682. Specifically, it is possible to use a metal oxide such as aluminum oxide, hafnium oxide, gallium oxide, or indium gallium zinc oxide.

The insulator 614, the insulator 687, and the insulator 682 that form the sealing structure are provided in contact with the insulator 680. Thus, the hydrogen concentration in the oxide semiconductor included in the memory cell 860 can be lowered by trapping and fixing hydrogen entering the insulator 680.

The insulator 614, the insulator 687, and the insulator 682 that form the structure in which the memory cell layer 870 is sealed are further covered with the insulator 611, the insulator 612, and the insulator 683. For example, as illustrated in FIG. 26, the insulator 611 and the insulator 683 are in contact with each other outside the memory cell layer 870_1 to the memory cell layer 870_n, whereby the second sealing structure is formed.

Here, a material having a function of inhibiting diffusion of hydrogen and oxygen is preferably used for the insulator 611, the insulator 612, and the insulator 683. It is particularly preferable to use silicon nitride or silicon nitride oxide as a sealing material because of their high barrier properties against hydrogen.

It is preferable that the insulator 684 with high coverage be provided above the insulator 683 that covers the transistor 600. Note that for the insulator 684, the same material as those for the insulator 612 and the insulator 683 is preferably used.

When the insulator 612 and the insulator 683 are deposited by a sputtering method, for example, the sealing structure can be formed of the films having relatively low hydrogen concentrations.

On the other hand, films that are deposited by a sputtering method have relatively low coverage. In view of this, the insulator 611 and the insulator 684 are deposited by a CVD method or the like which enables high coverage, whereby higher hermeticity can be achieved.

Accordingly, the insulator 612 and the insulator 683 preferably have lower hydrogen concentration than the insulator 611 and the insulator 684.

When the memory cell layer 870_1 to the memory cell layer 870_n are sealed with the barrier insulating film in the above-described manner, diffusion of hydrogen into the oxide semiconductor included in each memory cell 860 can be reduced, so that a memory device with high reliability can be provided.

Note that a material with a barrier property against oxygen may be used for the insulator 611, the insulator 612, the insulator 614, the insulator 682, the insulator 687, the insulator 683, and the insulator 684. When the above sealing structure has a barrier property against oxygen, excess oxygen contained in the insulator 680 can be inhibited from diffusing outward and can be efficiently supplied to the transistor 600.

An insulator 674 is preferably provided so that the memory cell layer 870_1 to the memory cell layer 870_n, the insulator 684, and the like are embedded therein. An insulator that can be used as the insulator 680 is used as the insulator 674. As illustrated in FIG. 26, top surfaces of the insulator 674 and the insulator 684 are preferably substantially level with each other.

As illustrated in FIG. 26, an opening may be provided in the insulator 674, the insulator 684, the insulator 683, and the insulator 611 and a conductor 876 may be placed in the opening. A bottom surface of the conductor 876 is in contact with the conductor 856. A conductor 878 functioning as a wiring may be provided in contact with a top surface of the conductor 876. Furthermore, an insulator 689 functioning as an interlayer film is preferably provided to cover the memory cell layer 870_n, the insulator 674, and the conductor 878. With such a structure, the wiring (the conductor 878) in the upper layer and the circuit of the silicon layer 871 can be electrically connected to each other without the memory cell layer 870 therebetween.

Figure 27:
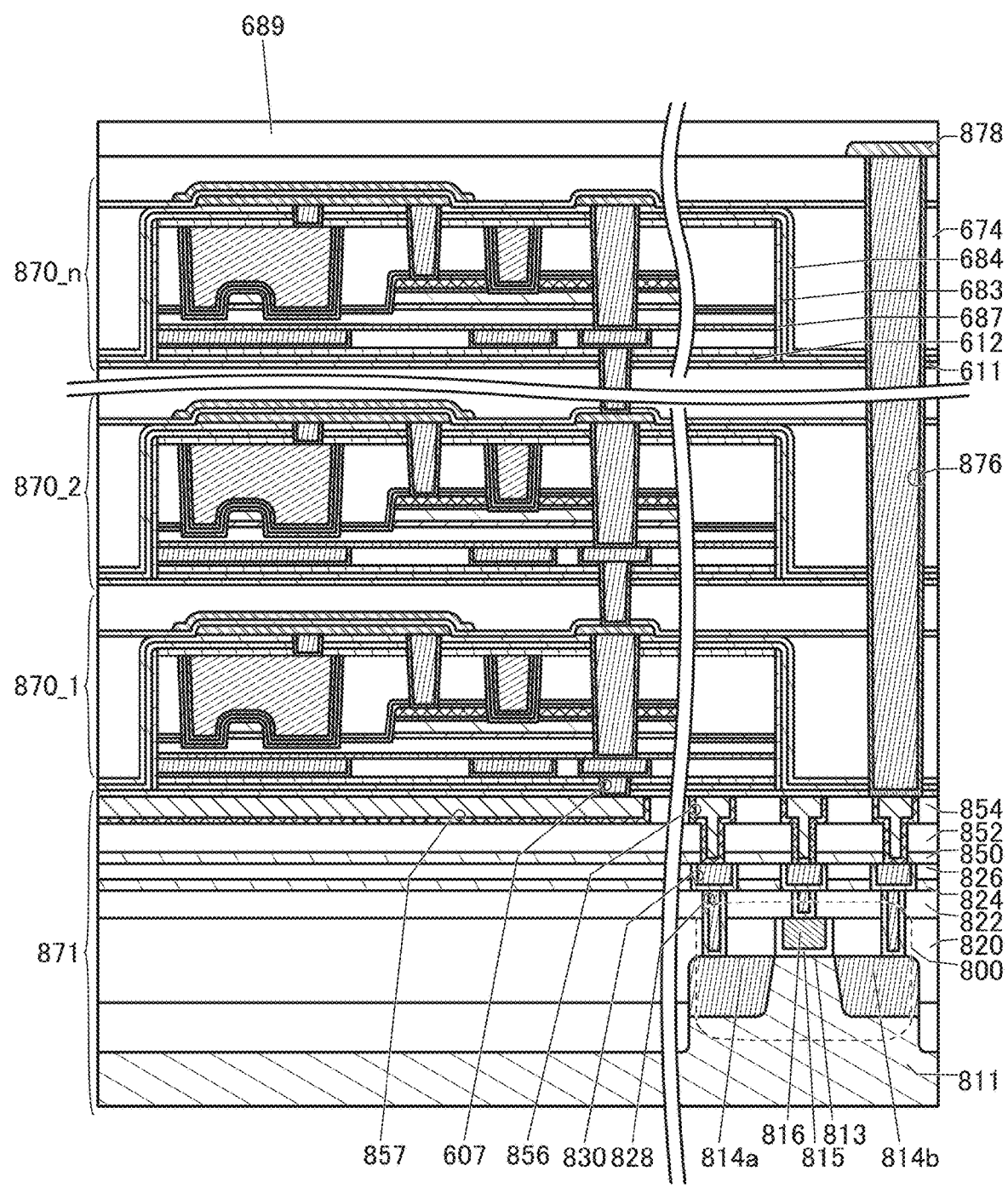
FIG. 27 is a cross-sectional view of a memory device of one embodiment of the present invention.

Although FIG. 26 illustrates the structure in which the memory cell layer 870_1 to the memory cell layer 870_n are collectively sealed with the insulator 611, the insulator 612, the insulator 687, the insulator 683, and the insulator 684, the memory device of this embodiment is not limited thereto. For example, as illustrated in FIG. 27, each of the memory cell layers 870 may be sealed with the insulator 611, the insulator 612, the insulator 687, the insulator 683, and the insulator 684. Here, the insulator 612 and the insulator 611 are placed under the insulator 614.

The insulator 687 is placed in contact with side surfaces of the insulator 680, the insulator 673, the insulator 672, the insulator 624, the insulator 622, the insulator 616, and the insulator 614. The insulator 683 is provided to cover the insulator 680 and the insulator 687, and the insulator 684 is placed over the insulator 683. In this case, the capacitor 655 and the insulator 688 provided above the insulator 682 are placed over the insulator 684.

This embodiment can be implemented in combination with any of the structures described in the other embodiments and the like, as appropriate.

Embodiment 5

In this embodiment, examples of electronic components and electronic devices in which the memory device or the like described in the above embodiment is incorporated will be described.

<Electronic Components>

First, examples of electronic components in which the memory device 100 is incorporated will be described with reference to FIGS. 29(A) and 29(B).

Figure 29A:
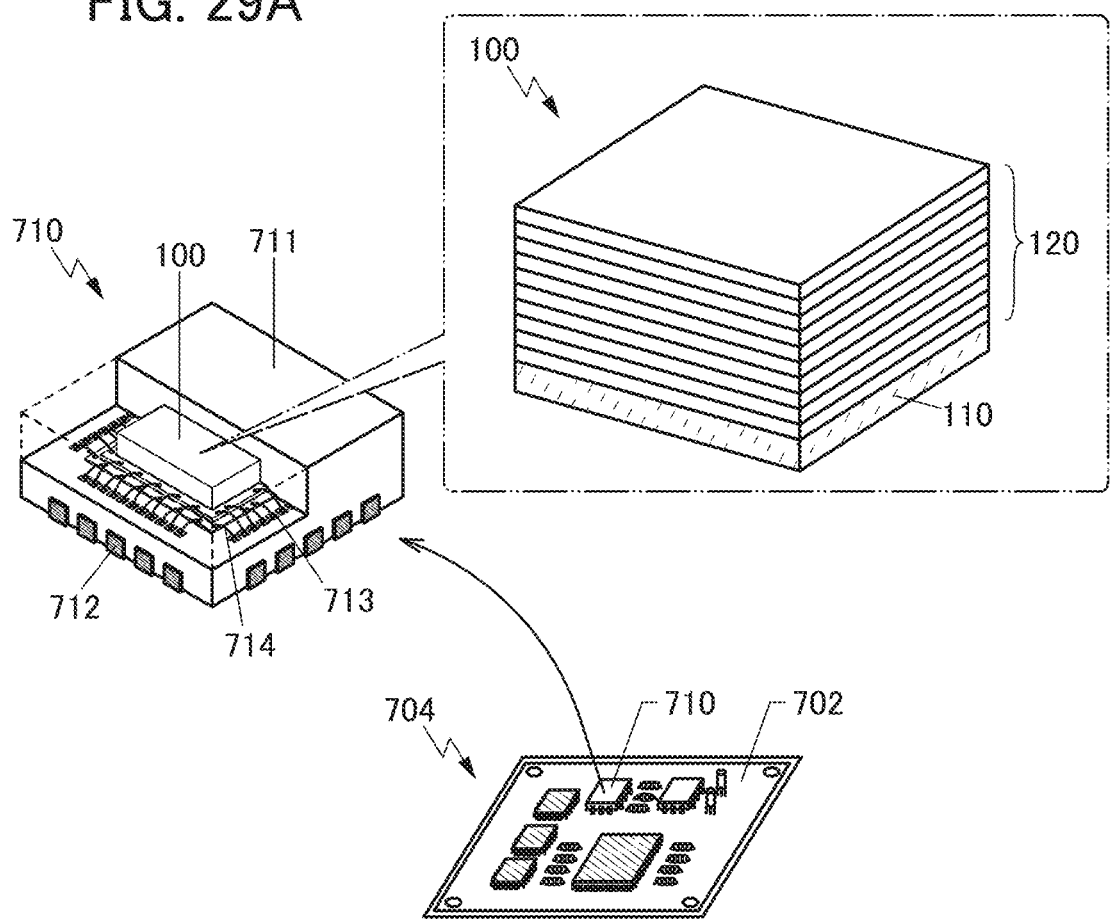
FIG. 29(A) and FIG. 29(B) are diagrams showing an example of an electronic component.

FIG. 29(A) shows a perspective view of an electronic component 710 and a substrate on which the electronic component 710 is mounted (a mounting board 704). The electronic component 710 illustrated in FIG. 29(A) includes the memory device 100 in a mold 711. FIG. 29(A) omits part of the electronic component 710 to show the inside thereof. The electronic component 710 includes a land 712 outside the mold 711. The land 712 is electrically connected to an electrode pad 713, and the electrode pad 713 is electrically connected to the memory device 100 via a wire 714. The electronic component 710 is mounted on a printed circuit board 702, for example. A plurality of such electronic components are combined and electrically connected to each other on the printed circuit board 702, whereby the mounting board 704 is completed.

Figure 29B:
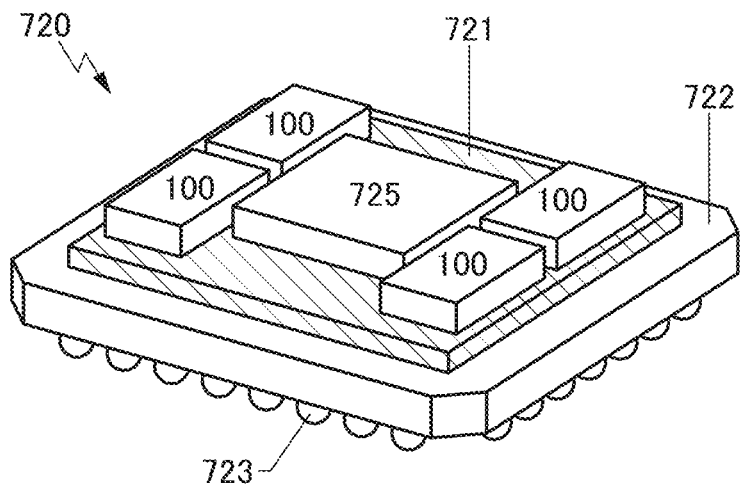

FIG. 29(B) shows a perspective view of an electronic component 720. The electronic component 720 is an example of a SiP (System in package) or an MCM (Multi Chip Module). In the electronic component 720, an interposer 721 is provided on a package substrate 722 (a printed circuit board), and a semiconductor device 725 and a plurality of memory devices 100 are provided on the interposer 721.

The electronic component 720 using the memory devices 100 as high bandwidth memory (HBM) is shown as an example. An integrated circuit (a semiconductor device) such as a CPU, a GPU, or an FPGA can be used as the semiconductor device 725.

As the package substrate 722, a ceramic substrate, a plastic substrate, a glass epoxy substrate, or the like can be used. As the interposer 721, a silicon interposer, a resin interposer, or the like can be used.

The interposer 721 includes a plurality of wirings and has a function of electrically connecting a plurality of integrated circuits with different terminal pitches. The plurality of wirings are provided in a single layer or multiple layers. Moreover, the interposer 721 has a function of electrically connecting an integrated circuit provided on the interposer 721 to an electrode provided on the package substrate 722. Accordingly, the interposer is referred to as a "redistribution substrate" or an "intermediate substrate" in some cases. A through electrode may be provided in the interposer 721 and used for electrically connecting an integrated circuit and the package substrate 722. For a silicon interposer, a TSV (Through Silicon Via) can also be used as the through electrode.

A silicon interposer is preferably used as the interposer 721. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer does not easily occur. Furthermore, the surface of a silicon interposer has high planarity, so that a poor connection between the silicon interposer and an integrated circuit provided on the silicon interposer does not easily occur. It is particularly preferable to use a silicon interposer for a 2.5D package (2.5D mounting) in which a plurality of integrated circuits are arranged side by side on an interposer.

A heat sink (a radiator plate) may be provided to overlap with the electronic component 720. In the case of providing a heat sink, the heights of integrated circuits provided on the interposer 721 are preferably equal to each other. For example, in the electronic component 720 described in this embodiment, the heights of the memory devices 100 and the semiconductor device 725 are preferably equal to each other.

To mount the electronic component 720 on another substrate, an electrode 723 may be provided on the bottom portion of the package substrate 722. FIG. 29(B) shows an example in which the electrode 723 is formed of a solder ball. Solder balls are provided in a matrix on the bottom portion of the package substrate 722, whereby BGA (Ball Grid Array) mounting can be achieved. Alternatively, the electrode 723 may be formed of a conductive pin. When conductive pins are provided in a matrix on the bottom portion of the package substrate 722, PGA (Pin Grid Array) mounting can be achieved.

The electronic component 720 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

<Electronic Devices>

Figure 30:
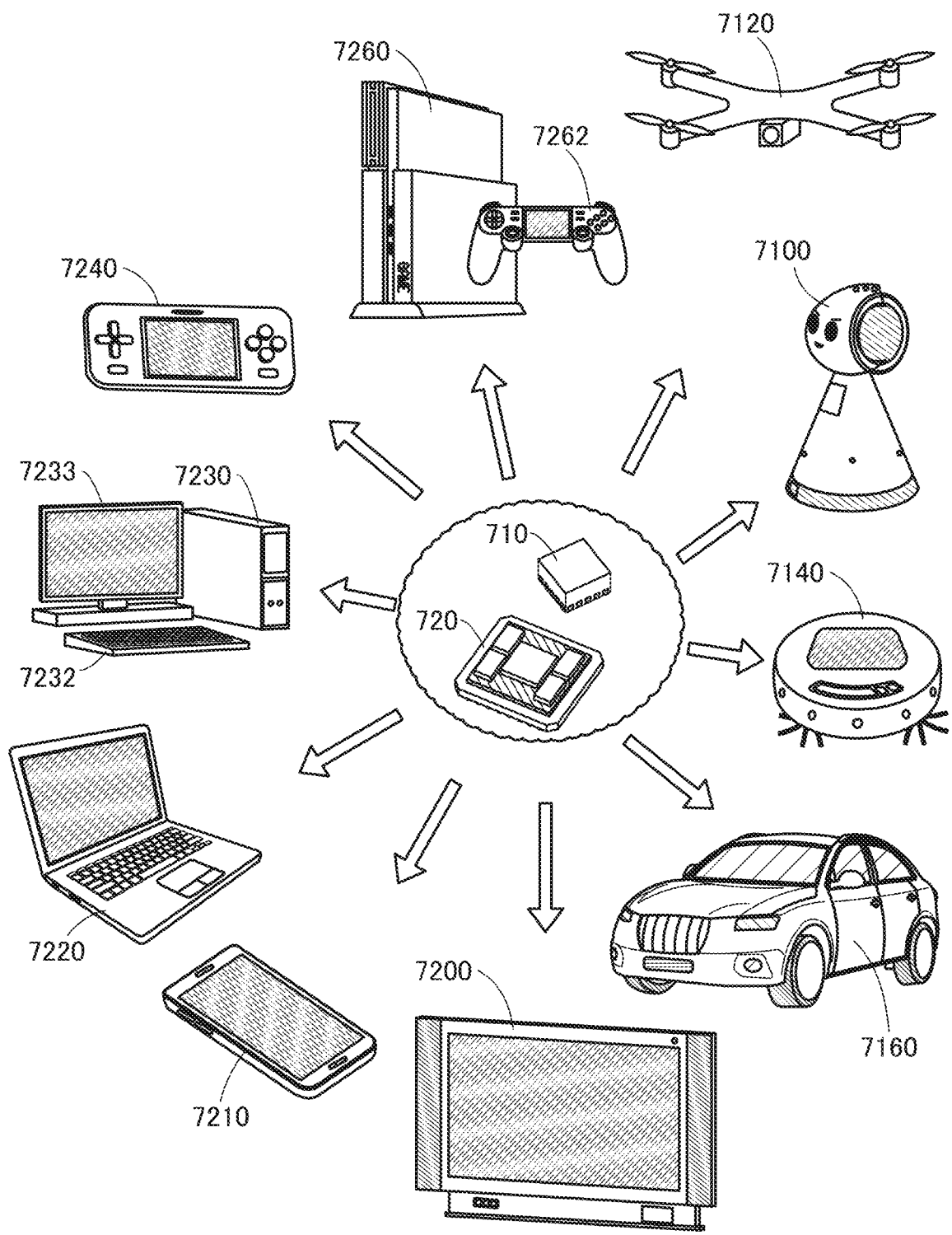
FIG. 30 is a diagram showing examples of electronic devices.

Next, examples of electronic devices including the above electronic component will be described with reference to FIG. 30.

A robot 7100 includes an illuminance sensor, a microphone, a camera, a speaker, a display, a variety of sensors (e.g., an infrared ray sensor, an ultrasonic wave sensor, an acceleration sensor, a piezoelectric sensor, an optical sensor, and a gyro sensor), a moving mechanism, and the like. The electronic component 720 includes a processor or the like and has a function of controlling these peripheral devices. For example, the electronic component 710 has a function of storing data obtained by the sensors.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user with the use of the microphone and the speaker.

The camera has a function of taking images of the surroundings of the robot 7100. Furthermore, the robot 7100 has a function of moving with the use of the moving mechanism. The robot 7100 can take images of the surroundings with the use of the camera, and can analyze the images to sense whether there is an obstacle in the way of the movement.

A flying object 7120 includes propellers, a camera, a battery, and the like and has a function of flying autonomously. The electronic component 720 has a function of controlling these peripheral devices.

For example, image data taken by the camera is stored in the electronic component 710. The electronic component 720 can analyze the image data to sense whether there is an obstacle in the way of the movement. Moreover, the electronic component 720 can estimate the remaining battery level from a change in the power storage capacity of the battery.

A cleaning robot 7140 includes a display provided on a top surface, a plurality of cameras provided on a side surface, a brush, an operation button, a variety of sensors, and the like. Although not illustrated, the cleaning robot 7140 is provided with a tire, an inlet, and the like. The cleaning robot 7140 can run autonomously, detect dust, and vacuum the dust through the inlet provided on a bottom surface.

For example, the electronic component 720 can judge whether there is an obstacle such as a wall, furniture, or a step by analyzing an image taken by the cameras. In the case where an object that is likely to be caught in the brush, such as a wire, is detected by image analysis, the rotation of the brush can be stopped.

An automobile 7160 includes an engine, tires, a brake, a steering gear, a camera, and the like. For example, the electronic component 720 performs control for optimizing the running state of the automobile 7160 on the basis of navigation information, the speed, the state of the engine, the gearshift state, the use frequency of the brake, and other data. For example, image data taken by the camera is stored in the electronic component 710.

The electronic component 710 and/or the electronic component 720 can be incorporated in a TV device 7200 (a television receiver), a smartphone 7210, a PC 7220 (a personal computer), a PC 7230, a game console 7240, a game console 7260, and the like.

For example, the electronic component 720 incorporated in the TV device 7200 can function as an image processing engine. The electronic component 720 performs, for example, image processing such as noise removal and resolution up-conversion.

The smartphone 7210 is an example of a portable information terminal. The smartphone 7210 includes a microphone, a camera, a speaker, a variety of sensors, and a display portion. These peripheral devices are controlled by the electronic component 720.

The PC 7220 and the PC 7230 are examples of a notebook PC and a desktop PC. To the PC 7230, a keyboard 7232 and a monitor device 7233 can be connected with or without a wire. The game console 7240 is an example of a portable game console. The game console 7260 is an example of a stationary game console. To the game console 7260, a controller 7262 is connected with or without a wire. The electronic component 710 and/or the electronic component 720 can be incorporated in the controller 7262.

This embodiment can be implemented in combination with any of the structures described in the other embodiments and the like, as appropriate.

Embodiment 6

In this embodiment, application examples of the memory device using the memory device described in the above embodiment will be described.

Figure 31:
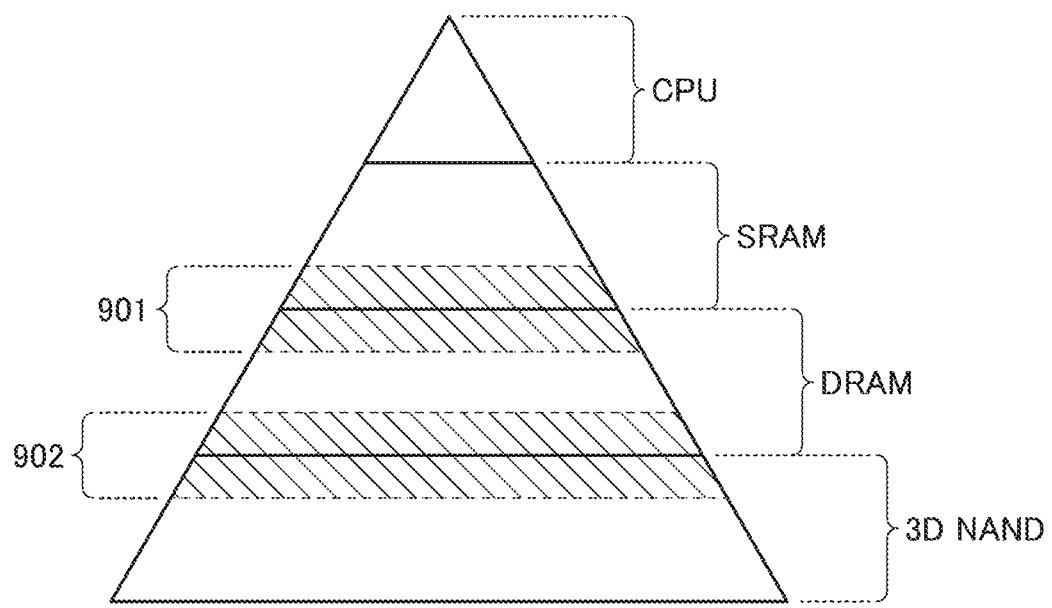
FIG. 31 is a diagram illustrating a hierarchy of a variety of memory devices.

In general, a variety of memory devices are used in semiconductor devices such as computers in accordance with the intended use. FIG. 31 shows a hierarchy diagram showing various memory devices with different levels. The memory devices at the upper levels require high access speeds, and the memory devices at the lower levels require large memory capacity and high record density. In FIG. 31, sequentially from the top level, a memory combined as a register in an arithmetic processing device such as a CPU, a SRAM (Static Random Access Memory), a DRAM (Dynamic Random Access Memory), and a 3D NAND memory are shown.

A memory combined as a register in an arithmetic processing device such as a CPU is used for temporary storage of arithmetic operation results, for example, and thus is frequently accessed by the arithmetic processing device. Accordingly, high operation speed is required rather than memory capacity. The register also has a function of retaining settings of the arithmetic processing device, for example.

An SRAM is used for a cache, for example. The cache has a function of retaining a copy of part of data retained in a main memory. Copying data which is frequently used and retaining the copy of the data in the cache facilitates rapid data access.

A DRAM is used for the main memory, for example. The main memory has a function of retaining a program or data which are read from the storage. The record density of a DRAM is approximately 0.1 to 0.3 Gbit/mm$^2$.

A 3D NAND memory is used for the storage, for example. The storage has a function of retaining data that needs to be stored for a long time and a variety of programs used in an arithmetic processing device, for example. Therefore, the storage needs to have a high memory capacity and a high memory density rather than operating speed. The record density of a memory device used for the storage is approximately 0.6 to 6.0 Gbit/mm$^2$.

The memory device of one embodiment of the present invention operates fast and can retain data for a long time. The memory device of one embodiment of the present invention can be favorably used as a memory device positioned in a boundary region 901 including both the level in which cache is positioned and the level in which main memory is positioned. The memory device of one embodiment of the present invention can be favorably used as a memory device positioned in a boundary region 902 including both the level in which main memory is positioned and the level in which the storage is positioned.

The memory device described in the above embodiment can be applied to, for example, memory devices of a variety of electronic devices (e.g., information terminals, computers, smartphones, e-book readers, digital still cameras, video cameras, video recording/reproducing devices, navigation systems, and game machines). The memory device can also be used for image sensors, IoT (Internet of Things), healthcare, and the like. Here, the computers refer not only to tablet computers, notebook computers, and desktop computers, but also to large computers such as server systems.

Alternatively, the memory device described in the above embodiment is applied to a variety of removable memory devices such as memory cards (e.g., SD cards), USB memories, and SSDs (solid state drives). FIGS. 32(A) to 32(E) schematically show some structure examples of removable memory devices. The memory device described in the above embodiment is processed into a packaged memory chip and used in a variety of storage devices and removable memories, for example.

FIG. 32(A) is a schematic diagram of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like on the substrate 1104.

FIG. 32(B) is a schematic external diagram of an SD card, and FIG. 32(C) is a schematic diagram of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. In this case, data can be read from and written in the memory chip 1114 by radio communication between a host device and the SD card 1110. The semiconductor device described in the above embodiment can be incorporated in the memory chip 1114 or the like on the substrate 1113.

FIG. 32(D) is a schematic external diagram of an SSD, and FIG. 32(E) is a schematic diagram of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like on the substrate 1153.

This embodiment can be implemented in combination with any of the structures described in the other embodiments and the like, as appropriate.

Example

A normally-off CPU (also referred to as "Noff-CPU") can be achieved by using any of the memory cell, the memory device, and the like described in this specification and the like. Note that the Noff-CPU is an integrated circuit including a normally-off transistor, which is in a non-conduction state (also referred to as an off state) even when a gate voltage is 0 V. The normally-off transistor can be achieved by using an OS transistor.

In the Noff-CPU, power supply to a circuit that does not need to operate can be stopped so that the circuit can be brought into a standby state. The circuit brought into the standby state because of the stop of power supply does not consume power. Thus, the power usage of the Noff-CPU can be minimized. Moreover, the Noff-CPU can retain data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the power consumption of the Noff-CPU can be reduced without a significant decrease in operation speed.

Figure 33:
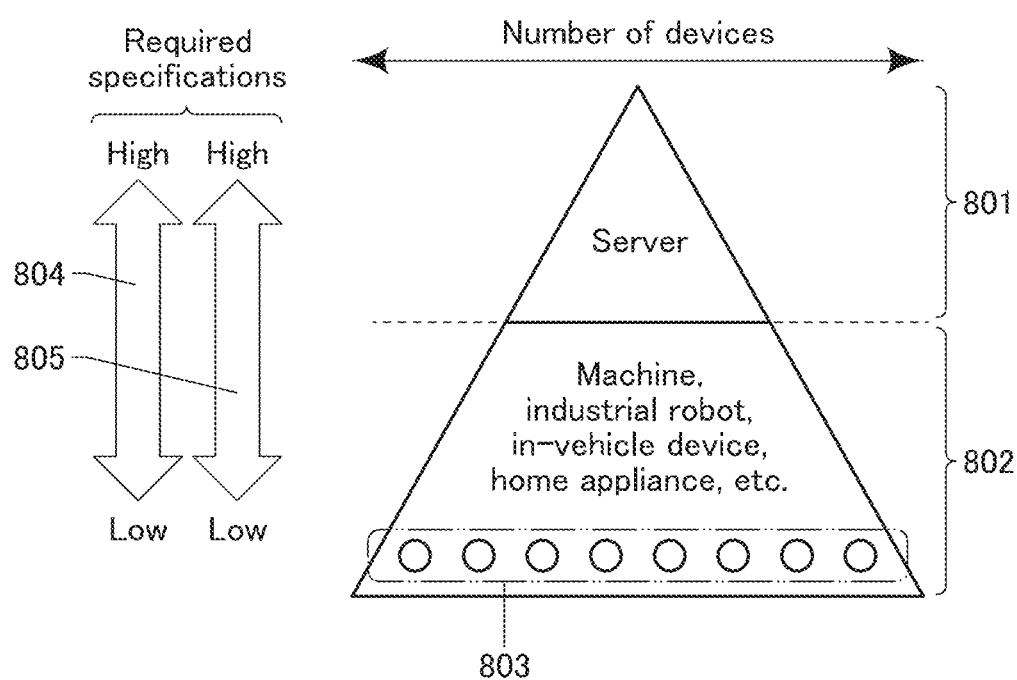
FIG. 33 is a diagram illustrating a hierarchical structure of an IoT network and tendencies of required specifications.

The Noff-CPU can be suitably used for a small-scale system such as an IoT end device (also referred to as an "endpoint microcomputer") 803 in the IoT field, for example. FIG. 33 illustrates a hierarchical structure of an IoT network and tendencies of required specifications. FIG. 33 shows power consumption 804 and processing performance 805 as the required specifications. The hierarchical structure of the IoT network is roughly divided into a cloud field 801 at the upper level and an embedded field 802 at the lower level. The cloud field 801 includes a server, for example. The embedded field 802 includes a machine, an industrial robot, an in-vehicle device, and a home appliance, for example.

Higher processing performance is required rather than lower power consumption towards the top of the hierarchical structure. Thus, a high-performance CPU, a high-performance GPU, a large-scale SoC (System on a Chip), and the like are used in the cloud field 801. Furthermore, lower power consumption is required rather than higher processing performance towards the bottom of the hierarchical structure, and the number of devices is explosively increased.

Note that an "endpoint" refers to an end region of the embedded field 802. Examples of devices used in the endpoint include microcomputers used in a factory, a home appliance, infrastructure, agriculture, and the like.

Figure 34:
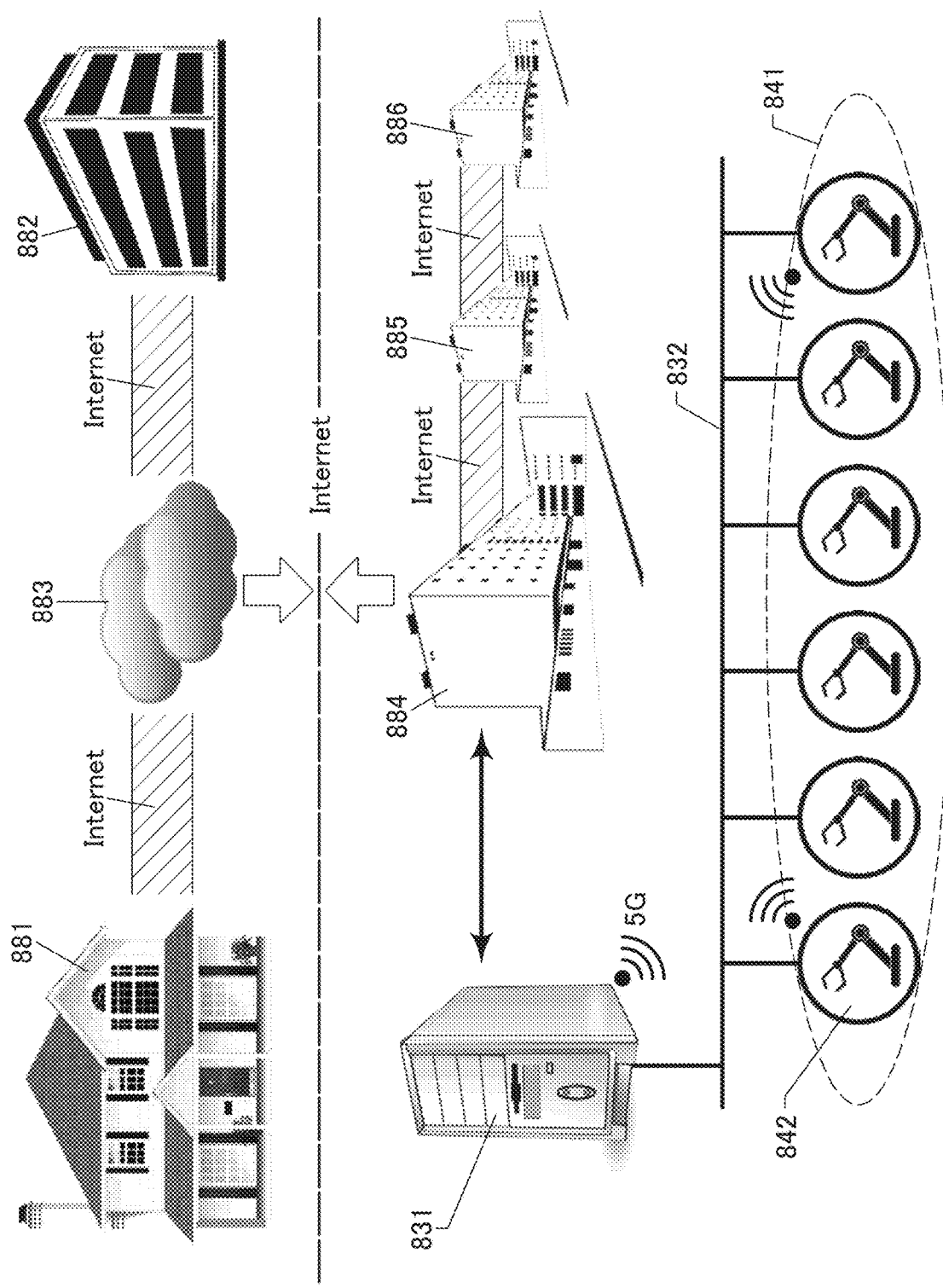
FIG. 34 is a conceptual diagram of factory automation.

FIG. 34 shows a conceptual diagram showing factory automation as an application example of the endpoint microcomputer. A factory 884 is connected to a cloud 883 through Internet connection (Internet). The cloud 883 is connected to a home 881 and an office 882 through the Internet connection. The Internet connection may be wired communication or wireless communication. For example, in the case of wireless communication, the fourth-generation mobile communication system (4G) or the fifth-generation mobile communication system (5G) may be used. The factory 884 may be connected to a factory 885 and a factory 886 through the Internet connection.

The factory 884 includes a master device (control device) 831. The master device 831 is connected to the cloud 883 and has a function of transmitting and receiving data. The master device 831 is connected to a plurality of industrial robots 842 included in an IoT end device 841 through an M2M (Machine to Machine) interface 832. As the M2M interface 832, for example, industrial Ethernet, which is a kind of wired communication, or local 5G, which is a kind of wireless communication, may be used.

A factory manager can check the operational status or the like from the home 881 or the office 882 connected to the factory 884 through the cloud 883. In addition, the manager can check wrong items and part shortage, instruct a storage space, and measure takt time, for example.

In recent years, IoT has been globally introduced into factories; this situation is called "Smart Factory". Smart Factory has been reported to enable not only simple examination and inspection by an endpoint microcomputer but also detection of failures and prediction of abnormality, for example.

The total power consumption of a small-scale system such as an endpoint microcomputer during operation is often small, which enhances the power reduction effect in a standby state by the Noff-CPU. Meanwhile, the embedded field of IoT sometimes requires quick response; the use of the Noff-CPU achieves high-speed return from a standby state.

REFERENCE NUMERALS

10: memory cell, 11A: transistor, 11B: transistor, 12: capacitor, 21: transistor, 22: transistor, 31: sense amplifier circuit, 32: AND circuit, 33: analog switch, 34: analog switch, 100: memory device, 110: driver circuit layer, 111: peripheral circuit, 112: control circuit, 115: peripheral circuit, 120: memory layer, 121: row decoder, 122: column decoder, 123: row driver, 124: column driver, 125: input circuit, 126: output circuit, 127: RW array, 128: voltage generation circuit, 129: RW circuit, 141: PSW, 142: PSW

The invention claimed is:

1. A memory device comprising:
   N memory layers;
   a driver circuit layer;
   a plurality of first wirings; and
   a plurality of second wirings,
   wherein N is a natural number greater than or equal to 2,
   wherein the N memory layers are stacked over the driver circuit layer,
   wherein the driver circuit layer comprises a plurality of first circuits,
   wherein the plurality of first wirings extend in a stacking direction of the N memory layers and are arranged in a matrix of P rows and R columns and P and R are each a natural number greater than or equal to 1,
   wherein the plurality of second wirings extend in the stacking direction and are arranged in a matrix of P rows and Q columns and Q is a natural number greater than or equal to 2,
   wherein the N memory layers each comprise:
      a plurality of memory cells arranged in a matrix of P rows and Q columns;
      third wirings in Q columns;
      fourth wirings in Q columns; and
      fifth wirings in Q columns,
   wherein in the memory layer in a k-th layer:
      a memory cell in an i-th row and a 2×s−1-th column and a memory cell in the i-th row and a 2×s-th column are electrically connected to a first wiring in the i-th row and an s-th column, and
      the memory cell in the i-th row and the 2×s−1-th column is electrically connected to a second wiring in the i-th row and the 2×s−1-th column, a third wiring in the 2×s−1-th column, a fourth wiring in the 2×s−1-th column, and a fifth wiring in the 2×s−1-th column,
   wherein the memory cell in the i-th row and the 2×s−1-th column comprises a first transistor, a second transistor, and a capacitor,
   wherein one of a source and a drain of the first transistor is electrically connected to a gate of the second transistor and one electrode of the capacitor,
   wherein the other of the source and the drain of the first transistor is electrically connected to the first wiring,
   wherein a gate of the first transistor is electrically connected to the third wiring,
   wherein the one of the source and the drain of the second transistor is electrically connected to the fourth wiring,
   wherein the other of the source and the drain of the second transistor is electrically connected to the second wiring,
   wherein the other electrode of the capacitor is electrically connected to the fifth wiring, and
   wherein the first wiring and the second wiring are electrically connected to any one of the plurality of first circuits.

2. The memory device according to claim 1 further comprising a functional layer between the driver circuit layer and the plurality of memory cells.

3. The memory device according to claim 2,
   wherein the functional layer comprises a plurality of second circuits, and
   wherein the first wiring and the second wiring are electrically connected to the first circuit through any one of the plurality of second circuits.

4. The memory device according to claim 1, wherein at least one of the first transistor and the second transistor comprises an oxide as a semiconductor.

5. The memory device according to claim 4, wherein the oxide comprises one or both of In and Zn.

6. The memory device according to claim 4, wherein the oxide comprises In, Ga, and Zn.

7. The memory device according to claim 1, wherein one of the plurality of first circuits comprises a plurality of transistors, and the transistors each comprise silicon as a semiconductor.

8. The memory device according to claim 2, wherein one of the plurality of first circuits comprises a plurality of transistors, and the transistors each comprise silicon as a semiconductor.

9. The memory device according to claim 3, wherein one of the plurality of first circuits comprises a plurality of transistors, and the transistors each comprise silicon as a semiconductor.

10. The memory device according to claim 4, wherein one of the plurality of first circuits comprises a plurality of transistors, and the transistors each comprise silicon as a semiconductor.

11. The memory device according to claim 5, wherein one of the plurality of first circuits comprises a plurality of transistors, and the transistors each comprise silicon as a semiconductor.

12. The memory device according to claim 6, wherein one of the plurality of first circuits comprises a plurality of transistors, and the transistors each comprise silicon as a semiconductor.

* * * * *